(12) United States Patent
Jung et al.

(10) Patent No.: US 7,911,568 B2
(45) Date of Patent: Mar. 22, 2011

(54) MULTI-LAYERED THIN FILMS, THIN FILM TRANSISTOR ARRAY PANEL INCLUDING THE SAME, AND METHOD OF MANUFACTURING THE PANEL

(75) Inventors: Jin-Goo Jung, Seoul (KR); Chun-Gi You, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 491 days.

(21) Appl. No.: 11/256,358

(22) Filed: Oct. 21, 2005

(65) Prior Publication Data
US 2006/0258061 A1    Nov. 16, 2006

(30) Foreign Application Priority Data

May 13, 2005    (KR) .................. 10-2005-0040059
May 13, 2005    (KR) .................. 10-2005-0040117
May 24, 2005    (KR) .................. 10-2005-0043485

(51) Int. Cl.
*H01L 21/40*    (2006.01)
*G02F 1/1335*   (2006.01)
*G02F 1/1343*   (2006.01)
*H01L 29/49*    (2006.01)
(52) U.S. Cl. ............. 349/114; 349/113; 257/59; 257/72
(58) Field of Classification Search ........... 257/E27.111, 257/59, 72; 349/113, 114; 438/149–166
See application file for complete search history.

(56) References Cited

U.S. PATENT DOCUMENTS

| | | | |
|---|---|---|---|
| 5,709,958 A * | 1/1998 | Toyoda et al. | 428/620 |
| 6,339,013 B1 * | 1/2002 | Naseem et al. | 438/491 |
| 6,475,872 B1 | 11/2002 | Jung | |
| 6,602,786 B2 | 8/2003 | Lu | |
| 6,627,471 B2 | 9/2003 | Yang | |
| 6,879,361 B2 * | 4/2005 | Moon et al. | 349/114 |
| 6,980,269 B2 * | 12/2005 | Liu | 349/114 |
| 7,179,693 B2 * | 2/2007 | Asano et al. | 438/149 |
| 7,652,735 B2 * | 1/2010 | You | 349/114 |
| 2002/0033918 A1 * | 3/2002 | Shigeno et al. | 349/114 |
| 2003/0068522 A1 * | 4/2003 | Wang | 428/654 |
| 2003/0168746 A1 * | 9/2003 | You | 257/759 |
| 2003/0223019 A1 * | 12/2003 | Kim et al. | 349/43 |

(Continued)

FOREIGN PATENT DOCUMENTS

JP    11-163289    6/1999

(Continued)

OTHER PUBLICATIONS

English Abstract, Publication No. JP 2003-264291, Sep. 19, 2003.
English Abstract, Publication No. JP 2002-268085, Sep. 18, 2002.
English Abstract, Publication No. JP2003-140191, May 14, 2003.

(Continued)

*Primary Examiner* — Kiesha R Bryant
*Assistant Examiner* — Eric Ward
(74) *Attorney, Agent, or Firm* — Innovation Counsel LLP

(57) ABSTRACT

A thin film transistor array panel is provided, which includes: a semiconductor layer; a first insulating layer on the semiconductor layer; a gate line including a first amorphous silicon layer and a metal; a second insulating layer covering the gate line; and a data line formed on the second insulating layer. A variously tapered structure of the signal line may be formed by providing an amorphous silicon layer having good adhesion characteristics. The adhesion between the metal layer and the amorphous silicon layer may be improved by performing a thermal treatment process such that the contact resistance may be reduced therebetween. Accordingly, the characteristics and reliability of the TFT may be improved.

16 Claims, 59 Drawing Sheets

U.S. PATENT DOCUMENTS

| | | | |
|---|---|---|---|
| 2004/0238886 A1* | 12/2004 | Lee et al. | 257/347 |
| 2005/0098785 A1* | 5/2005 | You | 257/72 |
| 2006/0033855 A1* | 2/2006 | Kaigawa | 349/43 |
| 2006/0215089 A1* | 9/2006 | Roh et al. | 349/114 |
| 2006/0261335 A1* | 11/2006 | Nakahori et al. | 257/59 |
| 2007/0126958 A1* | 6/2007 | Kim et al. | 349/114 |
| 2007/0188683 A1* | 8/2007 | Naka | 349/114 |
| 2008/0197357 A1* | 8/2008 | Park et al. | 257/72 |

FOREIGN PATENT DOCUMENTS

| | | |
|---|---|---|
| JP | 2002-268085 | 9/2002 |
| JP | 2003-140191 | 5/2003 |
| JP | 2003-264291 | 9/2003 |
| JP | 2004-064048 | 2/2004 |
| KR | 1020040013273 | 2/2004 |
| KR | 1020040060239 | 7/2004 |
| KR | 1020040096301 | 11/2004 |
| KR | 1020040110019 | 12/2004 |
| KR | 1020050003274 | 1/2005 |

OTHER PUBLICATIONS

English Abstract, Publication No. JP 2004-064048, Feb. 26, 2004.

English Abstract, Publication No. KR 1020040013273, Feb. 14, 2004.

English Abstract, Publication No. KR 1020050003274, Jan. 10, 2005.

English Abstract, Publication No. KR 1020040096301, Nov. 16, 2004.

English Abstract, Publication No. KR 1020040110019, Dec. 29, 2004.

English Abstract, Publication No. KR 1020040060239, Jul. 6, 2004.

* cited by examiner

MULTI-LAYERED THIN FILMS, THIN FILM TRANSISTOR ARRAY PANEL INCLUDING THE SAME, AND METHOD OF MANUFACTURING THE PANEL

BACKGROUND (a) Field of the Invention

The present invention relates to multi-layered thin films, a thin film transistor array panel including the same, and a method of manufacturing the panel.

(b) Description of Related Art

A thin film transistor (TFT) is generally used as a switching element to individually drive each pixel in a flat panel display such as a liquid crystal display or an organic light emitting display. A thin film transistor array panel including a plurality of TFTs has a plurality of pixel electrodes respectively connected to the TFTs, a plurality of gate lines for transmitting gate signals (scanning signals) to the TFTs, and a plurality of data lines for transmitting data signals to the TFTs.

The TFT includes a gate electrode connected to the gate line, a source electrode connected to the data line, a drain electrode connected to the pixel electrode, and a semiconductor layer overlapping the gate electrode via an insulating layer. The TFT controls the data signals applied to the pixel electrode according to the scanning signal of the gate line. The semiconductor layer of the TFT comprises amorphous silicon or crystalline silicon.

Because a polysilicon TFT has a relatively higher electron mobility than an amorphous silicon TFT, the polysilicon TFT made be applied to a high quality driving circuit. Also, the polysilicon TFT enables implementation of a chip-in-glass technique in which a display panel embeds its driving circuits therein.

The electrical characteristics of the TFT using polycrystalline silicon are influenced by the size and the uniformity of the silicon grain. The electric field effect mobility of the TFT increases according to increases in the size and the uniformity of grain.

Excimer laser annealing (ELA) and chamber annealing are typical methods for producing polycrystalline silicon. Recently, a sequential lateral solidification (SLS) process for deriving lateral growth of a silicon crystalline structure has been proposed.

The SLS technique for developing a large grain size provides good electric field effect mobility of the TFT compared with ELA. However, after the sequential lateral solidification, protrusions may form on the surface of the polysilicon layer along the grain boundaries, which increase the contact resistance between the polysilicon layer and the metal wire formed thereon.

To address this problem, many attempts have been made to provide methods of restraining the formation of protrusions. However, the resulting contact resistance between the polysilicon layer and the metal wire is still more than $10\Omega$ and the distribution of threshold voltage of a TFT through the SLS technique is not improved compared with the TFT formed by the ELA technique. Finally, these protrusions decrease the electrical characteristics of the TFT such that the reliability of products incorporating the TFT may be deteriorated.

Gate lines and gate electrodes are typically made of a low resistivity metal such as aluminum. However, the tapered structure of the gate line does not vary and the contact resistance between the gate line and another metal layer may be large, such that electrical characteristics of the TFT are reduced.

SUMMARY

It is therefore desirable to improve multi-layered thin films, provide a thin film transistor array panel including the same, and provide a method of manufacturing the panel with good electrical characteristics.

A method for manufacturing a thin film transistor array panel is provided, which includes: forming a semiconductor on a substrate; depositing a gate insulating layer on the semiconductor, said gate insulating layer having a first contact hole exposing the portion of the semiconductor; forming a gate electrode on the gate insulating layer; forming an interlayer insulating layer on the gate electrode, said interlayer insulating layer having a second contact hole connected to the first contact hole; forming a contact assistant connected to the semiconductor through the first and the second contact holes; forming a metal layer on the contact assistant; and etching the metal layer and the contact assistant to form a data line and a drain electrode.

The semiconductor may comprise polysilicon, and the contact assistant may comprise amorphous silicon.

The amorphous silicon may comprise an impurity, and the metal layer may comprise aluminum.

The metal layer may have a single-layered structure.

The method may further include performing a thermal treatment process on the substrate after forming the metal layer.

The thermal treatment process may be performed in the range of 200 to 300° C., and the interlayer insulating layer includes an organic material having a deformation temperature in the range of 200 to 300° C.

The thickness of the contact assistant is in the range of 500-1,000 Å(angstrom).

The method may further include forming a passivation layer on the interlayer insulating layer, the data line, and the drain electrode; and forming a pixel electrode connected to the passivation layer.

A multi-layered thin film is provided, which includes: a polysilicon layer formed on a substrate; an amorphous silicon layer in contact with the polysilicon layer; and a metal layer comprising aluminum and formed on the amorphous silicon layer.

The metal layer may comprise pure aluminum, and the metal layer may have a single-layered structure.

The amorphous silicon layer may comprise a conductive impurity, and the amorphous silicon layer has the same planar shape as the metal layer.

A multi-layered thin film is provided, which includes: a semiconductor layer formed on a substrate; an interlayer insulating layer formed on the semiconductor layer; a contact assistant formed on the interlayer insulating layer and comprising an amorphous silicon layer; and a conductor layer formed on the contact assistant.

The semiconductor layer may comprise polysilicon, and the conductor layer may comprise aluminum.

The conductor layer has a single-layered structure, and the amorphous silicon layer comprises a conductive impurity.

The contact assistant has the same planar shape as the conductor layer.

A thin film transistor array panel is provided, which includes: a semiconductor layer formed on a substrate; a gate insulating layer formed on the semiconductor layer; a gate electrode formed on the gate insulating layer; an interlayer insulating layer formed on the semiconductor layer having a contact hole exposing a portion of the semiconductor layer; a contact assistant formed on the interlayer insulating layer and connected to the semiconductor layer through the contact hole; and a source and a drain electrode formed on the contact assistant.

The semiconductor layer may comprise polysilicon, and the source and the drain electrodes may comprise aluminum.

The source and the drain electrodes may have a single-layered structure, and the semiconductor layer has a plurality of protrusions formed on the surface of the semiconductor layer.

The contact assistant may comprise amorphous silicon, and the amorphous silicon may comprise a conductive impurity.

The contact assistant may have the same planar shape as the source and the drain electrodes.

The thin film transistor array panel may further include a passivation layer formed on the source and the drain electrodes; and a pixel electrode connected to the drain electrode.

A thin film transistor array panel is provided, which includes: a substrate; a semiconductor layer formed on the substrate, said semiconductor layer comprising a channel region, a source region, and a drain region; a gate line formed above and below the semiconductor layer; a first insulating layer formed between the semiconductor layer and the gate line; and a storage electrode line separated from the gate line and formed on the same layer as the gate line, wherein the gate line and the storage electrode line comprise an amorphous silicon layer and a metal layer.

The amorphous silicon layer may comprise a conductive impurity, and the metal layer may comprise aluminum or molybdenum.

The metal layer may have a single-layered structure, and the semiconductor layer may comprise polysilicon.

A thin film transistor array panel is provided, which includes: a semiconductor layer formed on a substrate; a first insulating layer formed on the semiconductor layer; a gate line formed on the semiconductor layer and including a first amorphous silicon layer and a metal layer; a second insulating layer formed on the gate line; and a data line formed on the second insulating layer.

The first amorphous silicon layer may comprise a conductive impurity, and the metal layer may comprise aluminum or molybdenum.

The metal layer may have a single-layered structure, and the metal layer is disposed on the first amorphous silicon layer.

The thin film transistor array panel may further comprise a second amorphous silicon layer formed on the metal layer.

The metal layer may be disposed under the first amorphous silicon layer.

The thin film transistor array panel may further comprise a storage electrode line formed on the first insulating layer, and an amorphous silicon layer and a metal layer.

The semiconductor layer may comprise polysilicon.

The thin film transistor array panel may further comprise a passivation layer formed on the data line; and a pixel electrode formed on the passivation layer.

A method of manufacturing a thin film transistor array panel is provided, which includes: forming a semiconductor on a substrate; depositing a first insulating layer; forming a gate electrode comprising a first amorphous silicon layer and a metal layer on the gate insulating layer; forming a second insulating layer covering the gate electrode; and forming source and drain electrodes on the second insulating layer.

The first amorphous silicon layer may comprise a conductive impurity, and the metal layer may comprise aluminum or molybdenum.

The metal layer may have a single-layered structure, and the formation of the gate electrode may include depositing the first amorphous silicon layer; forming the metal layer on the first amorphous silicon layer; and patterning the metal layer and the first amorphous silicon layer.

The patterning of the metal layer and the first amorphous silicon layer may include sequentially etching the metal layer and the first amorphous silicon layer to form an upper film and a preliminary lower film; ion-implanting the semiconductor layer to form a heavy doped region, a channel region, and a lightly doped region; and etching the preliminary lower film using the upper film as an etch mask to form a lower film of the gate electrode.

The width of the preliminary lower film may be wider than the width of the lower gate electrode, and the formation of the gate electrode further includes performing a thermal treatment process on the metal layer and the first amorphous layer.

The thermal treatment process may be performed in the range of 200 to 300° C., and the semiconductor layer may comprise polysilicon.

The method may further include forming a passivation layer on the source and the drain electrodes; and forming a pixel electrode on the passivation layer.

A thin film transistor array panel for a liquid crystal display of a trans-reflective type is provided, which includes a substrate; a transparent electrode formed on the substrate; and a reflective electrode formed on the transparent electrode, wherein the reflective electrode comprises a lower film comprising amorphous silicon, and an upper film comprising a metal material.

The metal upper film may comprise aluminum, silver, chromium, an alloy of aluminum, an alloy of silver, or an alloy of chromium.

The metal upper film may have a single-layered structure, and the amorphous silicon lower film may comprise a conductive impurity.

The panel may further include a thin film transistor formed on the substrate; and a passivation layer formed under the transparent electrode.

The passivation layer may comprise an organic material and have an uneven surface, and the reflective electrode has an uneven surface caused by the uneven surface of the passivation layer.

A method of manufacturing a thin film transistor array panel for a liquid crystal display of trans-reflective type is provided, which includes forming a transparent electrode on a substrate; depositing an amorphous semiconductor layer on the transparent electrode; depositing a metal layer on the amorphous semiconductor layer; etching the metal layer to form an upper reflective electrode; and removing the amorphous semiconductor layer exposed by the etching of the metal layer to form a lower reflective electrode.

The upper reflective electrode may comprise aluminum, silver, chromium, an alloy of aluminum, an alloy of silver, or an alloy of chromium, and the amorphous semiconductor layer may comprise amorphous silicon.

The amorphous silicon may comprise a conductive impurity, and the metal layer may have a single-layered structure.

The method may further include performing a thermal treatment process after the deposition of the metal layer.

The thermal treatment may be performed in the range of 200 to 300° C.

The method may further include forming a thin film transistor under the transparent electrode; and forming a passivation layer between the transparent electrode and the thin film transistor.

The method may further include forming an uneven surface on the passivation layer to make the surface of the reflective electrode uneven, wherein the passivation layer comprises an organic material.

BRIEF DESCRIPTION OF THE DRAWINGS

The present invention will become more apparent by describing embodiments thereof in detail with reference to the accompanying drawings, in which.

DETAILED DESCRIPTION OF EMBODIMENTS

Figure 1:
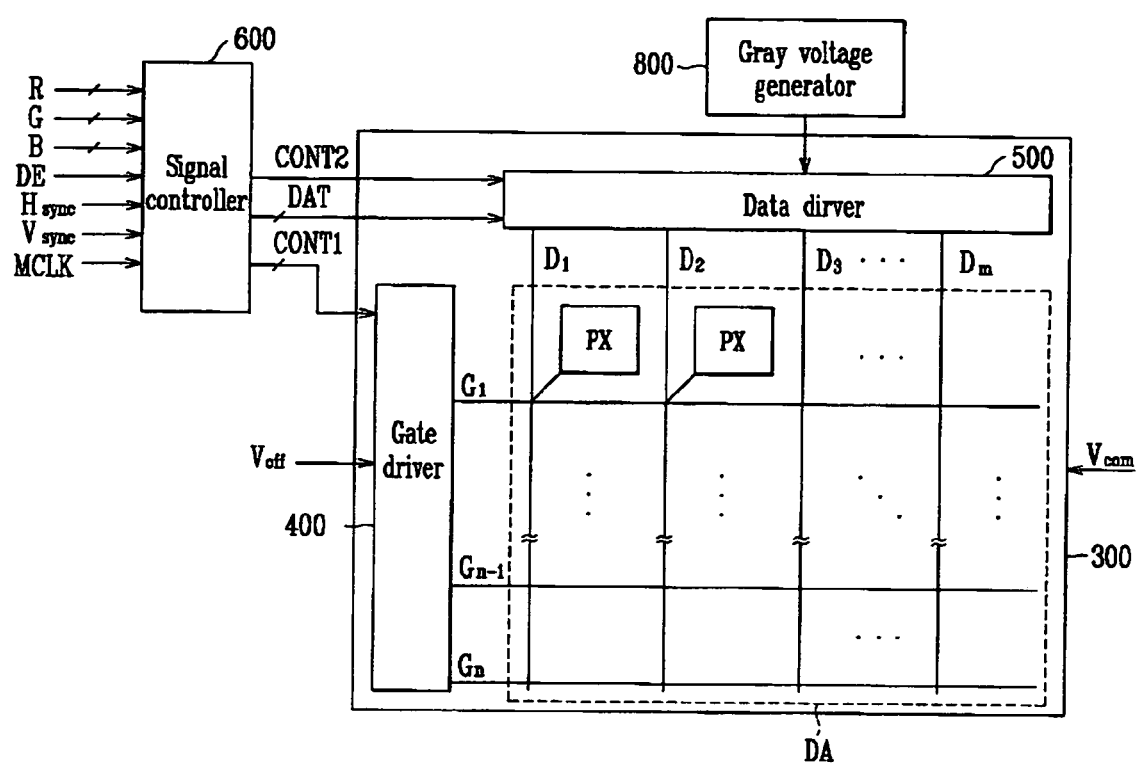
FIG. 1 is a block diagram of a display device according to an embodiment of the present invention.

The present invention now will be described more fully below with reference to the accompanying drawings, in which preferred embodiments of the invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, region, or substrate is referred to as being "on" another element, it can be directly on the other element or intervening elements may also be present. In contrast, when an element is referred to as being "directly on" another element, there are no intervening elements present.

A thin film transistor and a thin film transistor array panel according to embodiments of the present invention will now be described with reference to the accompanying drawings.

Figure 2:
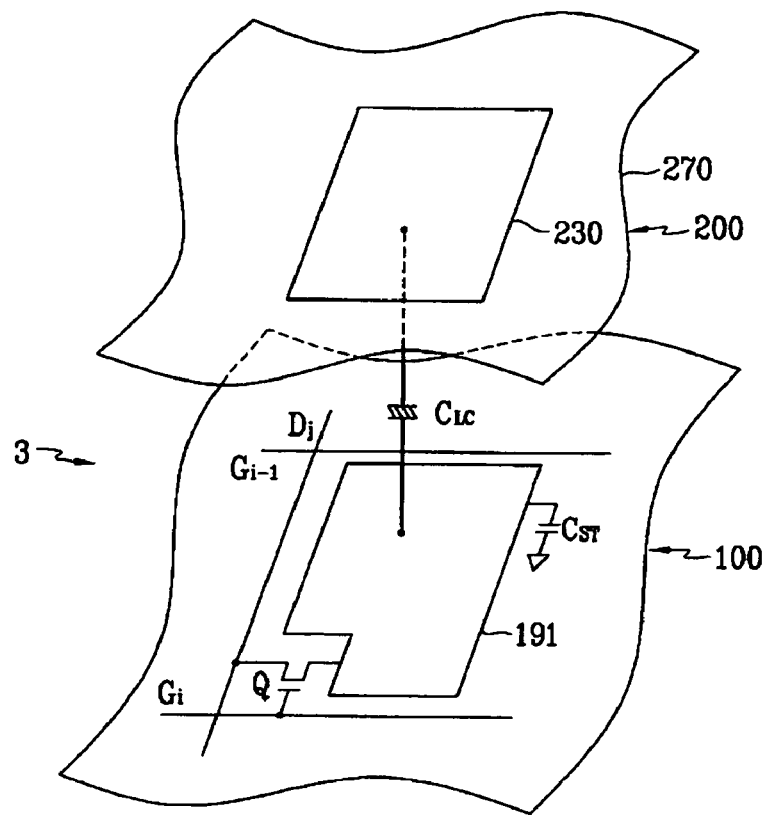
FIG. 2 is an equivalent circuit diagram of a pixel of an LCD as an example of the display device according to an embodiment of the present invention.

Referring to FIGS. 1 and 2, a display device according to an embodiment of the present invention will be described in detail.

FIG. 1 is a block diagram of a display device according to an embodiment of the present invention, and FIG. 2 is an equivalent circuit diagram of a pixel of an LCD as an example of the display device according to an embodiment of the present invention.

Referring to FIG. 1, an display device according to the embodiment includes a display panel unit 300, a gate driver 400 and a data driver 500 that are connected to the display panel unit 300, a gray voltage generator 800 connected to the data driver 500, and a signal controller 600 controlling the above elements.

Referring to FIG. 1, the display panel unit 300 includes a plurality of display signal lines $G_1$-$G_n$ and $D_1$-$D_m$, and a plurality of pixels PX connected thereto. The pixels PX are arranged substantially in a matrix in a display area DA.

In the structural view shown in FIG. 2, the display panel unit 300 includes a lower panel 100, an upper panel 200, and an LC layer 3 interposed therebetween.

The display signal lines $G_1$-$G_n$ and $D_1$-$D_m$ include a plurality of gate lines $G_1$-$G_n$ transmitting gate signals (also referred to as "scanning signals") and a plurality of data lines $D_1$-$D_m$ transmitting data signals. The gate lines $G_1$-$G_n$ extend substantially in a row direction and are substantially parallel to each other, while the data lines $D_1$-$D_m$ extend substantially in a column direction and are substantially parallel to each other.

Each pixel PX includes at least one switching element Q (shown in FIG. 2) such as a thin film transistor, and at least one LC capacitor $C_{LC}$ (shown in FIG. 2).

Referring to FIG. 2, each pixel PX defined by the 'i'$^{th}$ gate line and the 'j'$^{th}$ data line of a liquid crystal display includes a switching element Q connected to the signal lines $G_i$ and $D_j$, and an LC ("liquid crystal") capacitor $C_{LC}$ and a storage capacitor $C_{ST}$ that are connected to the switching element Q. The display signal lines $G_i$ and $D_j$ are provided on a lower panel 100. In some embodiments, the storage capacitor $C_{ST}$ may be omitted.

The switching element Q including a polysilicon TFT is provided on a lower panel 100, and has three terminals: a control terminal connected to one of the gate lines $G_1$-$G_n$; an input terminal connected to one of the data lines $D_1$-$D_m$; and an output terminal connected to both the LC capacitor $C_{LC}$ and the storage capacitor $C_{ST}$.

The LC capacitor $C_{LC}$ includes a pixel electrode 191 provided on the lower panel 100 and a common electrode 270 provided on an upper panel 200, as the two capacitor terminals. An LC layer 3 disposed between the two electrodes 191 and 270 functions as a dielectric for the LC capacitor $C_{LC}$. The pixel electrode 191 is connected to the switching element Q. The common electrode 270 is supplied with a common voltage Vcom and covers the entire surface of the upper panel 200. In other embodiments, the common electrode 270 may be provided on the lower panel 100, and both electrodes 191 and 270 may be provided in the shape of a bar or stripe.

The storage capacitor $C_{ST}$ is an auxiliary capacitor for the LC capacitor $C_{LC}$. The storage capacitor $C_{ST}$ includes the pixel electrode 191, and a separate signal line which is provided on the lower panel 100. The separate signal line overlaps the pixel electrode 191 via an insulator and is supplied with a predetermined voltage, such as the common voltage Vcom. Alternatively, the storage capacitor $C_{ST}$ includes the pixel electrode 191 and an adjacent gate line referred to as the previous gate line, which overlaps the pixel electrode 191 via an insulator.

For color displays, each pixel PX uniquely represents one of three primary colors (i.e., spatial division), or each pixel PX sequentially represents all three primary colors in turn (i.e., time division), such that a spatial or temporal sum of the three primary colors is recognized as a desired color. FIG. 2 shows an example of the spatial division type of color display in which each pixel is provided with a color filter 230 representing one of the primary colors, e.g., red, green, or blue, in an area of the upper panel 200 facing the pixel electrode 191. Alternatively, the color filter 230 may be provided on or under the pixel electrode 191 on the lower panel 100.

One or more polarizers (not shown) are attached to the panels 100 and 200.

Each pixel PX of an organic light emitting display includes a switching element (not shown) connected to the signal lines $G_1$-$G_n$ and $D_1$-$D_m$, a driving element (not shown), storage capacitors that are connected to the switching and the driving elements, and an organic light emitting diode (OLED, not shown). The OLED may comprise an anode (hole injection electrode), a cathode (electron injection electrode), and an organic light emission member interposed therebetween.

Referring back to FIG. 1, the gray voltage generator 800 generates two sets of a plurality of gray voltages related to the transmittance of the pixels PX. The gray voltages in one set for the LCD have a positive polarity with respect to the common voltage Vcom, while those in the other set have a negative polarity with respect to the common voltage Vcom.

The gate driver 400 is connected to the gate lines $G_1$-$G_n$ of the display panel unit 300 and synthesizes the gate-on voltage Von and the gate-off voltage Voff from an external device to generate gate signals for application to the gate lines $G_1$-$G_n$. The gate driver 400 is mounted on the display panel unit 300, and may comprise a plurality of IC (integrated circuit) chips. Each IC chip of the gate driver 400 is respectively connected to the gate lines $G_1$-$G_n$ and includes a plurality of polysilicon thin film transistors with N- and P-types, or a complementary type.

The data driver 500 is connected to the data lines $D_1$-$D_m$ of the display panel unit 300 and applies data voltages, which are selected from the gray voltages supplied from the gray voltage generator 800, to the data lines $D_1$-$D_m$. The data driver 500 is also mounted on the panel assembly 300 and may also comprise a plurality of IC chips.

The IC chips of the drivers 400 and 500 may be mounted on flexible printed circuit (FPC) films as a TCP (tape carrier package), and are attached to the display panel unit 300. Alternatively, the drivers 400 and 500 may be integrated into the display panel unit 300 along with the display signal lines $G_1$-$G_n$ and $D_1$-$D_m$, and the TFT switching elements Q.

The IC chips of the drivers 400 and 500, or the flexible printed circuit (FPC) films are located at a peripheral area outside of the display area DA of the display panel unit 300.

The signal controller 600 controls the gate driver 400 and the data driver 500, and may be mounted on a printed circuit board (PCB).

Figure 3:
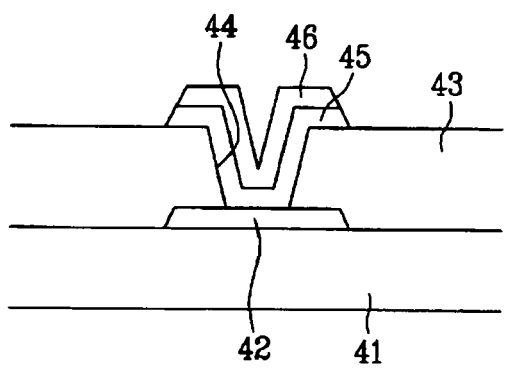
FIG. 3 is a cross sectional view of multi-layered thin films according to an embodiment of the present invention.

As described above, the polysilicon TFT is used in this display device. FIG. 3 shows an example of the contact structure between the polysilicon and the signal lines according to an embodiment of the present invention.

FIG. 3 is a cross sectional view of multi-layered thin films according to an embodiment of the present invention, showing a contact structure between a signal line and polysilicon semiconductor layer. The multi-layered thin films comprise a plurality of thin films, which are formed with different layers and may comprise a conductive material, a semiconductor material, or an insulating material.

A polysilicon layer 42 is formed on an insulating substrate 41 such as transparent glass or plastic. The polysilicon layer 42 may have protrusions which are formed on the surface of the polysilicon layer 42 during the process of crystallizing amorphous silicon into polysilicon. The polysilicon layer 42 may be ion-implanted with an impurity.

An insulating layer 43 having a contact hole 44 exposing the surface of the polysilicon layer 42 is formed on the polysilicon layer 42.

A signal line having a double-layered structure comprising an amorphous silicon layer 45 and a conductive layer 46 is formed on the insulating layer 43.

The amorphous silicon layer 45 is connected to the exposed polysilicon layer 42 through the contact hole 44. The amorphous silicon layer 45 provides good adhesion characteristics with the polysilicon layer 42 such that the contact resistance between the amorphous silicon layer 45 and the polysilicon layer 42 may be reduced despite the presence of protrusions on the polysilicon layer 42. In addition, the upper surface of the amorphous silicon layer 45 is smoother than that of the polysilicon layer 42.

A conductive layer 46 is provided on the amorphous silicon layer 45 and may have a single-layered structure comprising a metal containing aluminum. The conductive layer 46 has substantially the same shape as the amorphous silicon layer 45.

As described above, because the upper surface of the amorphous silicon layer 45 is smoother than that of the polysilicon layer 42, it is preferable that the conductive layer 46 contacts the amorphous silicon layer 45 rather than the polysilicon layer 42 in order to minimize the contact resistance therebetween.

Furthermore, the metal atoms of the conductive layer 46 may diffuse into the upper portion of the amorphous silicon layer 45 through thermal treatment, such that the contact resistance between the amorphous silicon layer 45 and the conductive layer 46 may be further reduced.

As a result, because the contact resistances between the amorphous silicon layer 45 and the polysilicon layer 42 and between the amorphous silicon layer 45 and the conductive layer 46 are small, the total contact resistance between the polysilicon layer 42 and the conductive layer 46 may be small. Therefore, the contact resistance between the polysilicon layer 42 and the signal line formed by the amorphous silicon layer 45 and the conductive layer 46 is very small.

Accordingly, the contact resistance between the polysilicon layer and the signal line may be reduced by adding the amorphous silicon layer between the polysilicon layer forming the channel of the TFT and a signal line (the conductive layer) coupled to the TFT. Also, the amorphous silicon layer itself plays a role to deliver the signals with the conductive layer of metal. A TFT array panel for an LCD according to an embodiment of the present invention will be described in detail below with reference to FIGS. 4 to 7 as well as FIGS. 1 and 2.

Figure 4:
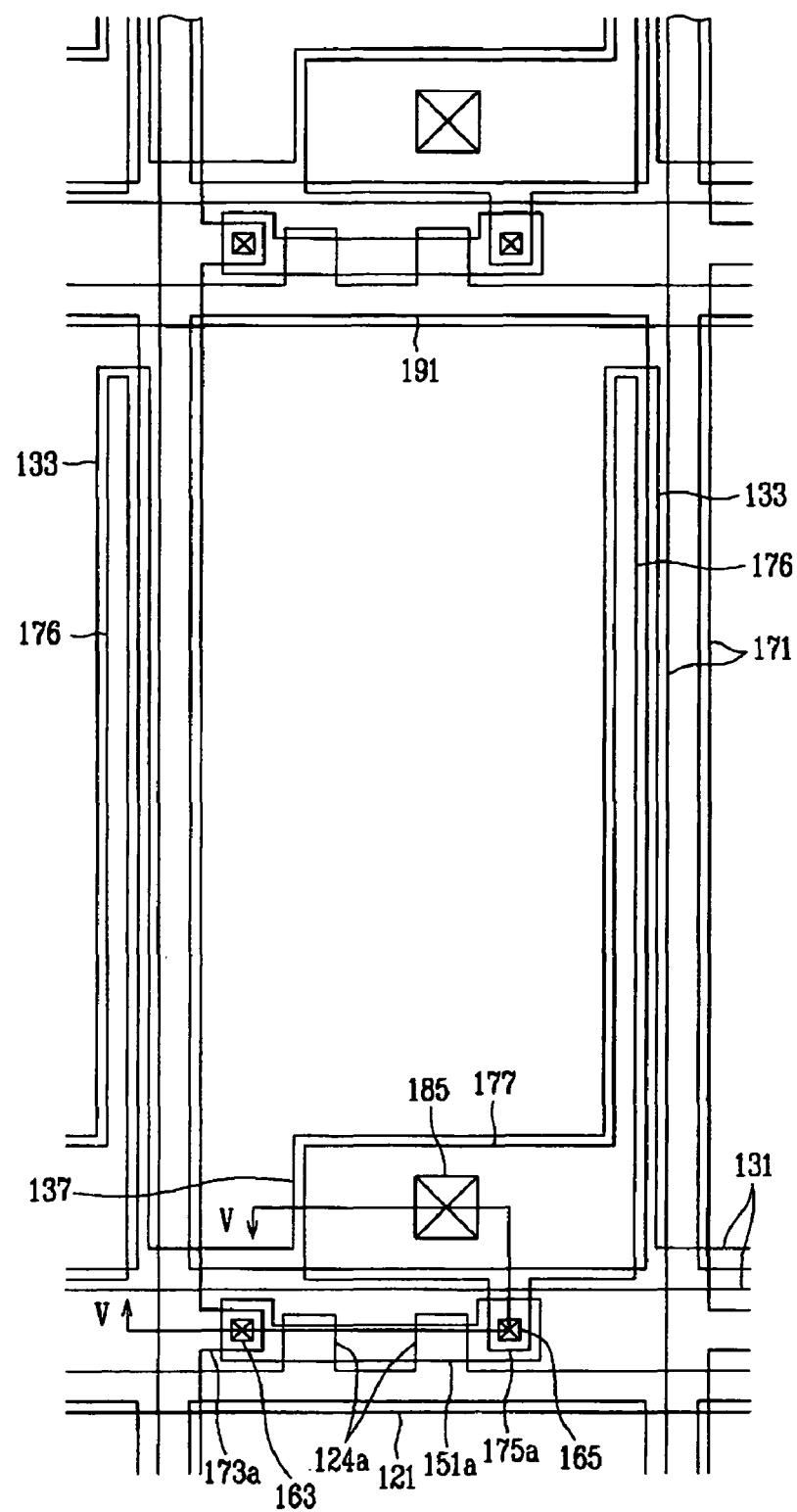
FIGS. 4 and 6 are layout views of the TFT array panel shown in FIGS. 1 and 2 according to an embodiment of the present invention.
Figure 5:
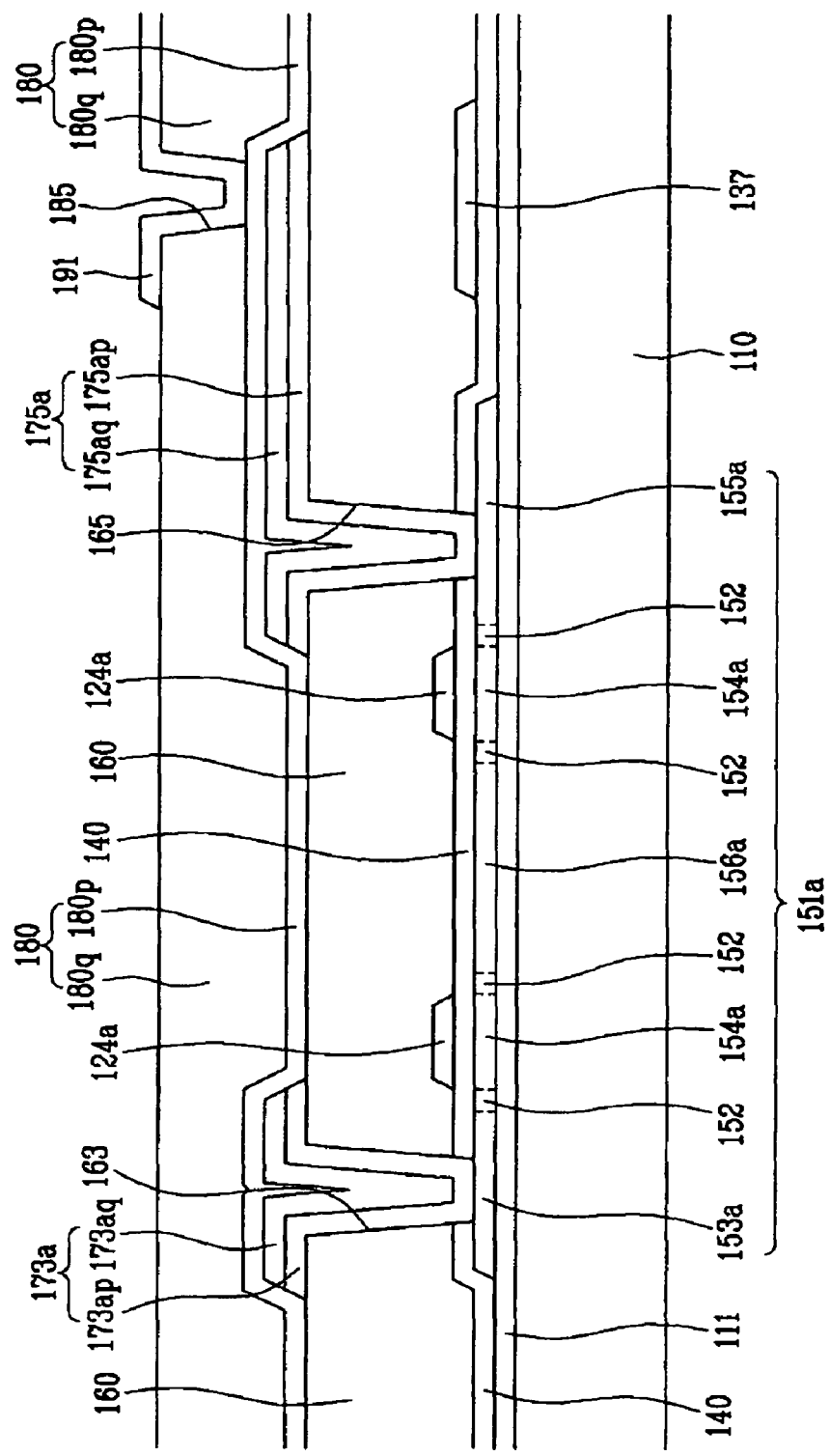
FIGS. 5 and 7 are sectional views of the TFT array panel shown in FIGS. 4 and 6 taken along the lines V-V and VII-VII.
Figure 6:
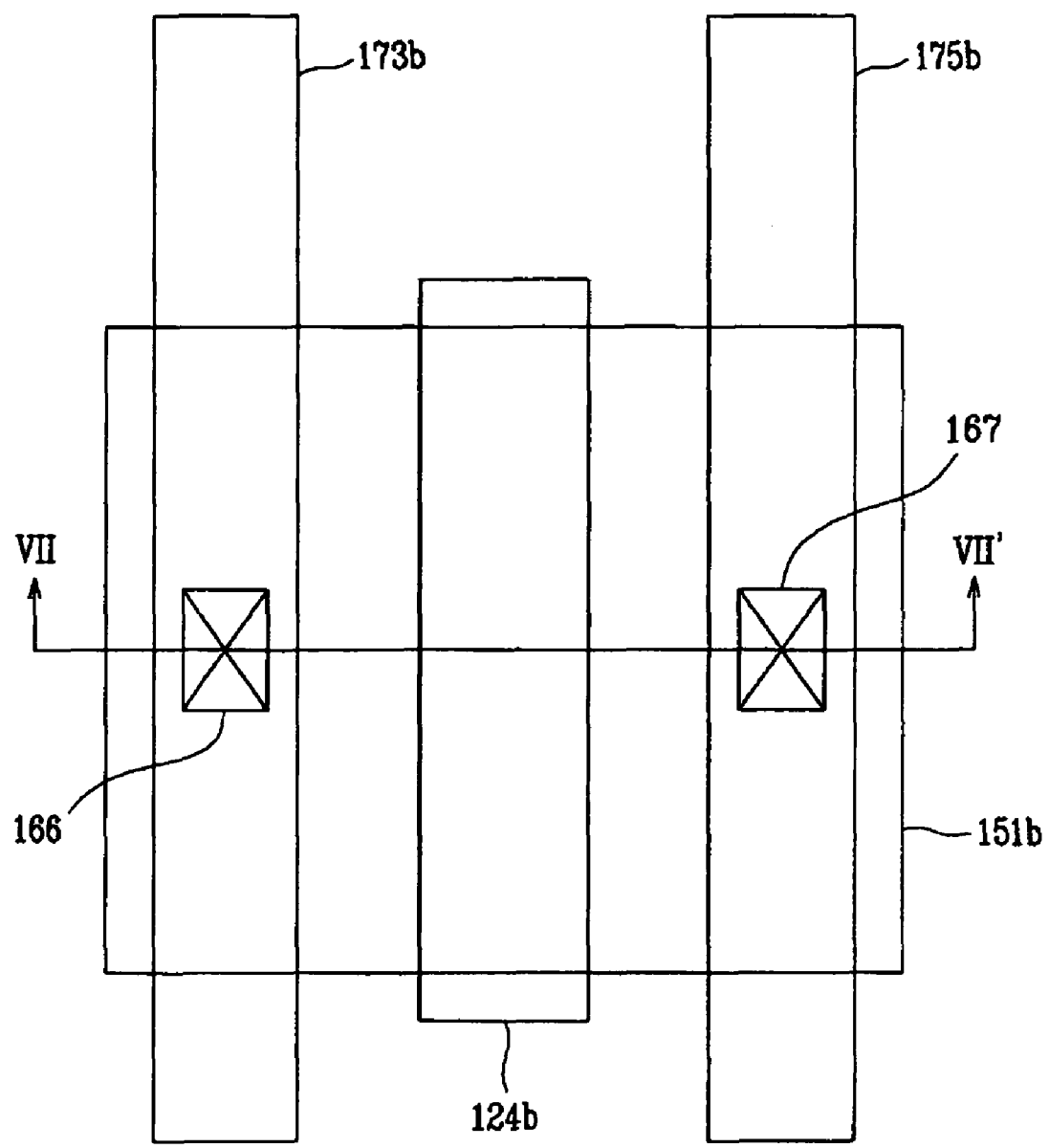
Figure 7:
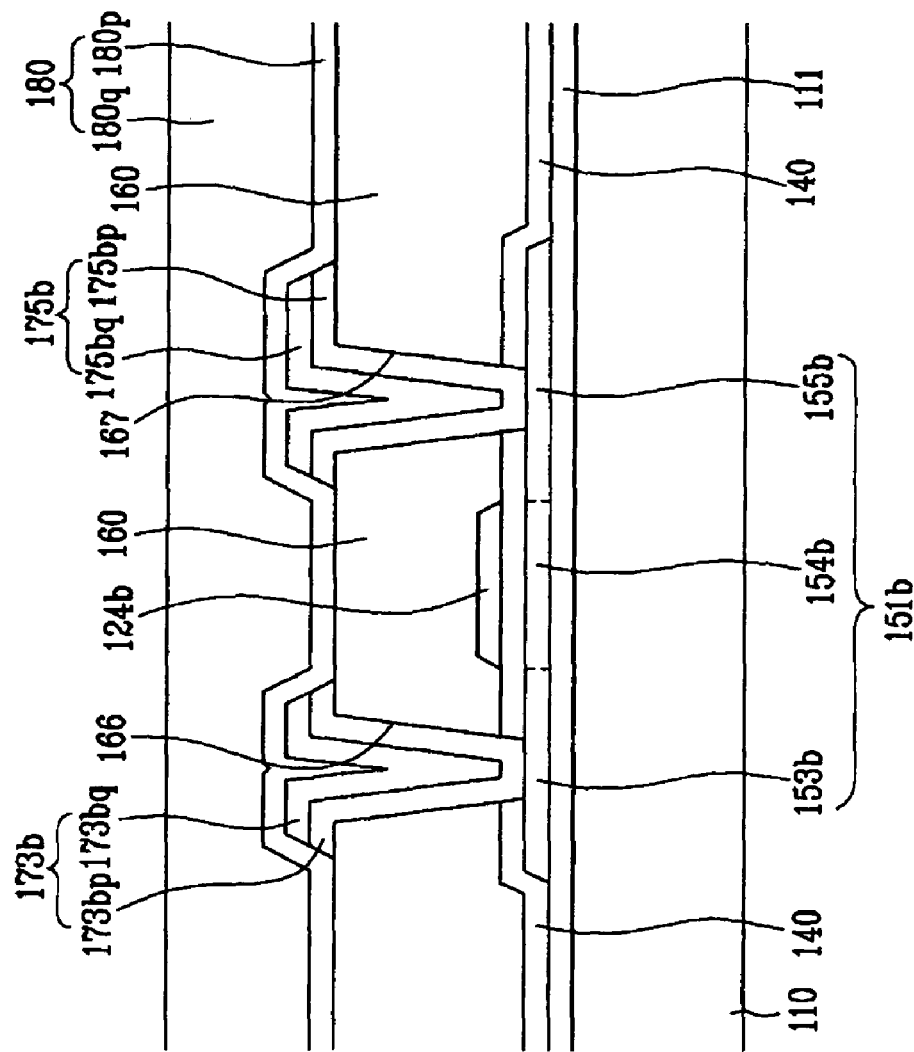

FIGS. 4 and 6 are layout views of the TFT array panel shown in FIGS. 1 and 2 according to an embodiment of the present invention, and FIGS. 5 and 7 are sectional views of the TFT array panel shown in FIGS. 4 and 6 taken along the lines V-V and VII-VII, respectively.

N-type and P-type devices will be described with regard to pixels PX and gate drivers 400 as examples of thin film transistors according to embodiments of the present invention.

A blocking film 111, preferably comprising silicon oxide (SiOx) or silicon nitride (SiNx), is formed on an insulating substrate 110 such as transparent glass, quartz, or sapphire. The blocking film 111 may have a dual-layered structure.

A plurality of semiconductor islands 151a and 151b, preferably comprising polysilicon, are formed on the blocking film 111. The semiconductor islands 151a and 151b may have protrusions, which are formed during the process of crystallizing amorphous silicon into polysilicon, on their surface. The semiconductor islands 151a correspond to the pixel regions and the semiconductor islands 151b correspond to a driver region. Each of the semiconductor islands 151a and 151b comprises a plurality of extrinsic regions containing N-type or P-type conductive impurities, and at least one intrinsic region containing few conductive impurities. The extrinsic regions may comprise a heavily doped region and a lightly doped region.

With regard to the semiconductor island 151a for the display area, the intrinsic regions include a channel region 154a, and the extrinsic regions include a plurality of heavily doped regions such as source and drain regions 153a and 155a separated from each other with respect to the channel region 154a, and a middle region 156a. The extrinsic regions further include a plurality of lightly doped regions 152 disposed between the intrinsic regions 154a and the heavily doped regions 153a, 155a, and 156a. The lightly doped regions 152 have relatively small thicknesses and lengths compared with the heavily doped regions 153a, 155a, and 156a, and are disposed close to surfaces of the semiconductor islands 151a. The lightly doped regions 152 disposed between the source region 153a and the channel region 154a and between the drain region 155a and the channel region 154a are referred to as "lightly doped drain (LDD) regions". The LDD regions prevent leakage current from the TFTs. In other embodiments, the LDD regions may be replaced with offset regions that contain substantially no impurities, and may be omitted.

With regard to the semiconductor island 151b for the driver region, the intrinsic regions include a channel region 154b, and the extrinsic regions include a plurality of heavily doped regions such as source and drain regions 153b and 155b separated from each other with respect to the channel region 154b.

Boron (B) or gallium (Ga) may be used as the P-type impurity and phosphorus (P) or arsenic (As) can be used as the N-type impurity.

A gate insulating layer 140 comprising silicon oxide ($SiO_2$) or silicon nitride (SiNx) is formed on the semiconductor islands 151a and 151b, and on the blocking film 111.

A plurality of gate conductors and a plurality of storage electrode lines 131 are formed on the gate insulating layer 140. The gate conductors include a plurality of gate lines 121 having a plurality of gate electrodes 124a and a plurality of control electrodes 124b, The gate lines 121 for transmitting gate signals extend substantially in a transverse direction, and the gate electrodes 124a for pixels protrude upward to overlap the channel areas 154a of the semiconductor islands 151a. Each gate line 121 may include an expanded end portion having a large area for contact with another layer or an external driving circuit. The gate lines 121 may be directly connected to a gate driving circuit for generating the gate signals, which may be integrated on the substrate 110.

The control electrode 124b overlaps the channel region 154b of the semiconductor island 154b, and is connected to the signal line (not shown) to apply a control signal.

The storage electrode lines 131 are supplied with a predetermined voltage such as a common voltage. The storage electrode lines 131 include a plurality of expansions 137 protruding upward and a plurality of longitudinal parts 133 extending upward (as seen from the perspective shown in FIG. 4).

The gate conductors 121, 124a, and 124b, and the storage electrode lines 131 preferably comprise a low resistivity material including an Al-containing metal such as Al or an Al alloy (e.g. Al—Nd), an Ag-containing metal such as Ag or an Ag alloy, a Cu-containing metal such as Cu or a Cu alloy, a Mo-containing metal such as Mo or a Mo alloy, Cr, Ti, W, or Ta.

The gate conductors 121, 124a, and 124b, and the storage electrode lines 131 may have a multi-layered structure including two films having different physical characteristics. One of the two films preferably comprises a low resistivity metal comprising an Al-containing metal, an Ag-containing metal, or a Cu-containing metal for reducing signal delay or voltage drop in the gate conductors 121, 124a, and 124b, and the storage electrode lines 131. The other film preferably comprises a material such as Cr, Mo, a Mo alloy, Ta, or Ti, which have good physical, chemical, and electrical contact characteristics with other materials such as indium tin oxide (ITO) and indium zinc oxide (IZO). Examples of suitable multi-layered structures include a lower Cr film and an upper Al (or Al alloy) film, and a lower Al (or Al alloy) film and an upper Mo film. In addition, the gate conductors 121, 124a and 124b, and the storage electrode lines 131 may comprise various metals and conductors.

The lateral sides of the gate conductors 121, 124a, and 124b, and the storage electrode line 131 are inclined relative to a surface of the substrate 110, and the inclination angle thereof ranges from about 30 to about 80 degrees.

An interlayer insulating layer 160 is formed on the gate conductors 121, 124a, and 124b, and the electrode lines 131. The interlayer insulating layer 160 preferably comprises an organic material having a good flatness characteristic, a low dielectric insulating material such as a-Si:C:O and a-Si:O:F formed by plasma enhanced chemical vapor deposition (PECVD), or an inorganic material such as silicon nitride and silicon oxide. The interlayer insulating layer 160 may comprise a photosensitive organic material.

The interlayer insulating layer 160 and the gate insulating layer 140 have a plurality of contact holes 163, 165, 166, and 167 respectively exposing the source regions 153a and 153b, and the drain regions 155a and 155b.

A plurality of data conductors including a plurality of data lines 171, a plurality of drain electrodes 175a for connection with pixel electrodes 191, and a plurality of input and output electrodes 173b and 175b for the driver region are formed on the interlayer insulating layer 160.

The data lines 171 for transmitting data voltages extend substantially in the longitudinal direction and intersect the gate lines 121. Each data line 171 includes a plurality of source electrodes 173a for pixels connected to the source regions 153a through the contact holes 163. Each data line 171 may include an expanded end portion having a large area for contact with another layer or an external driving circuit. The data lines 171 may be directly connected to a data driving circuit for generating the gate signals, which may be integrated on the substrate 110.

The drain electrodes 175a are separated from the source electrodes 173a and connected to the drain regions 155a through the contact holes 165. The drain electrodes 175a include a plurality of expansions 177 and a plurality of longitudinal parts 176 respectively overlapping the expansions 137 and the longitudinal parts 133 of the storage electrode lines 131. The longitudinal parts 133 of the storage electrode lines 131 are located between the longitudinal parts 176 of the drain electrode 175a and the boundary of the data lines 171 facing the drain electrode 175a such that the longitudinal parts 133 of the storage electrode lines 131 block signal interference between the longitudinal parts 176 of the drain electrode 175a and the data lines 171.

The input electrode 173b and the output electrode 175b are separated from each other, and may be connected to other signal lines.

The data conductors 171, 175a, 173b, and 175b comprise an upper film and a lower film. The lower film comprises amorphous silicon and may include conductive impurities, and the upper film may comprise a material comprising an Al-containing metal such as Al or an Al alloy (e.g. Al—Nd). It is preferable that the thickness of the lower film is in the range of 500-1,000 Å.

The lower films of the data conductors 171, 175a, 173b, and 175b are respectively contacted to the source regions 153a and 153b, and to the drain regions 155a and 155b of the semiconductor islands 151a and 151b, and their surfaces contacting with the amorphous silicon layer are flat. As such, the lower films of amorphous silicon have good adhesion characteristics with the -polysilicon semiconductor islands 151a and 151b such that the contact resistance between the lower film of the data conductors 171, 175a, 173b, and 175b and the semiconductor islands 151a and 151b may be reduced even though the semiconductor islands 151a and 151b have the protrusions. Also, the upper surface of the data conductors 171, 175a, 173b, and 175b is smoother than that of the semiconductor islands 151a and 151b.

As described above, because the upper surface of the lower film of the data conductors 171, 175a, 173b, and 175b is smoother than that of the semiconductor islands 151a and 151b, it is preferable that the semiconductor islands 151a and 151b contact the lower film of the data conductors 171, 175a, 173b, and 175b rather than the upper film of the data conductors 171, 175a, 173b, and 175b in order to minimize the contact resistance therebetween.

Because the contact resistances between the lower films of the data conductors 171, 175a, 173b, and 175b, and the semiconductor islands 151a and 151b, or the upper film of the data conductors 171, 175a, 173b, and 175b are all small, the total contact resistance between the upper film and the lower film may be small.

In addition, the particles of Al in the upper film may diffuse into the lower film of the data conductors 171, 175a, 173b, and 175b, such that the resistance of the lower film may be reduced.

As shown in FIGS. 4 to 7, "p" and "q" are added to the reference numerals of the lower and upper films for the data conductors 171, 175a, 173b, and 175b. The letter "p" indicates the lower film and the letter "q" indicates the upper film.

Like the gate conductors 121, 124a, and 124b, the data conductors 171, 175a, 173b, and 175b have tapered lateral sides relative to a surface of the substrate 110, and the inclination angles thereof range from about 30 to about 80 degrees.

A passivation layer 180 is formed on the data conductors 171, 175a, 173b, and 175b and the interlayer insulating layer 160. The passivation layer 180 also preferably comprises a photosensitive organic material having a good flatness characteristic, a low dielectric insulating material having a dielectric constant lower than 4.0 such as a-Si:C:O and a-Si:O:F formed by PECVD, or an inorganic material such as silicon nitride and silicon oxide. The passivation 180 may be omitted on the driver region.

The passivation layer 180 has a plurality of contact holes 185 exposing the expansions 177 of the drain electrodes 175a. The passivation layer 180 may have a plurality of contact holes (not shown) exposing end portions of data lines 171, and may further have a plurality of contact holes (not shown) exposing end portions of the gate lines 121.

A plurality of pixel electrodes 191, which preferably comprise at least one of a transparent conductor such as ITO or IZO and an opaque reflective conductor such as Al or Ag, are formed on the passivation layer 180.

The pixel electrodes 191 are physically and electrically connected to the drain electrodes 175a through the contact holes 185 such that the pixel electrodes 191 receive the data voltages from the drain regions 155a via the drain electrodes 175a.

The pixel electrodes 191 supplied with the data voltages generate electric fields in cooperation with the common electrode 270 on the upper panel 200. These electric fields determine orientations of liquid crystal molecules in a liquid crystal layer 3 disposed between the upper panel 200 and the lower panel 100. The pixel electrodes 191 may also supply an electrical current to a light emitting member (not shown) to cause the light emitting member to emit light.

Referring to FIG. 2, a pixel electrode 191 and a common electrode 270 form a liquid crystal capacitor $C_{LC}$, which stores applied voltages after turn-off of the TFT Q. The pixel electrode 191 and the portion of the drain electrode 175a connected thereto and a storage electrode line 131 including the storage electrodes 137 form a storage capacitor $C_{ST}$.

When the passivation layer 180 comprises an organic material having a low dielectric constant, the pixel electrodes 191 may overlap the gate lines 121 and the data lines 171 to increase the aperture ratio of the display.

A method of manufacturing the TFT array panel shown in FIGS. 1 to 7 according to an embodiment of the present invention will be described in detail below with reference to FIGS. 8 to 21 as well as FIGS. 1 to 7.

Figure 8:
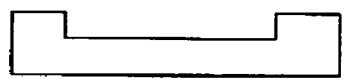
FIGS. 8 and 9 are layout views of the TFT array panel shown in FIGS. 4 to 7 in the first step of a manufacturing method thereof according to an embodiment of the present invention.
Figure 8:
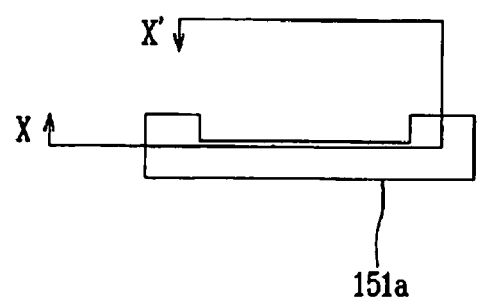
Figure 9:
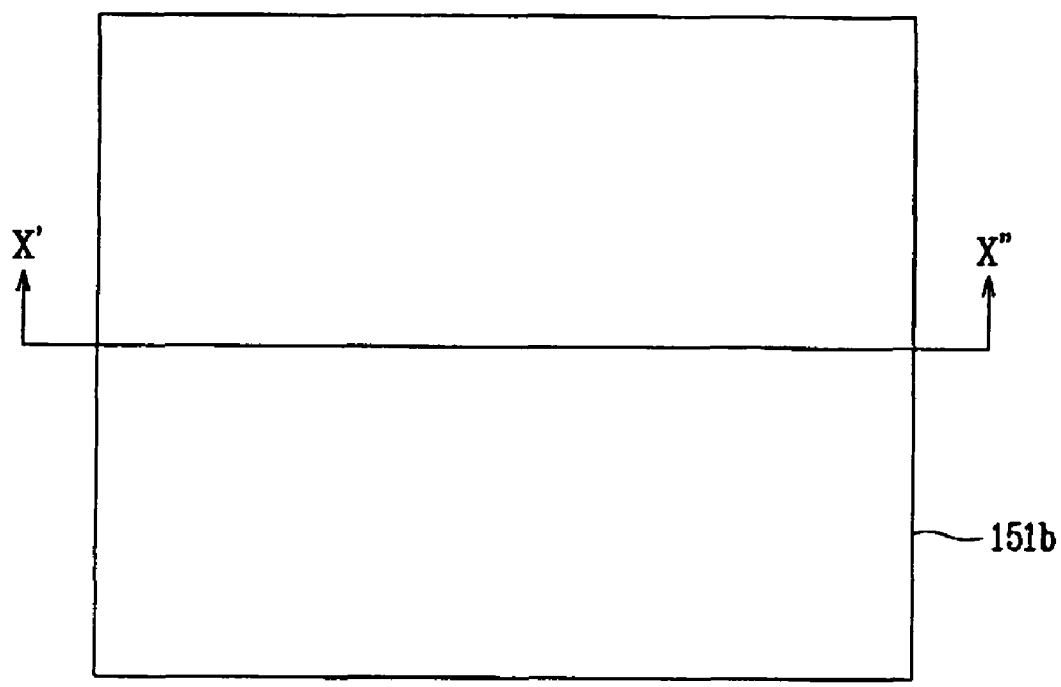
Figure 10:
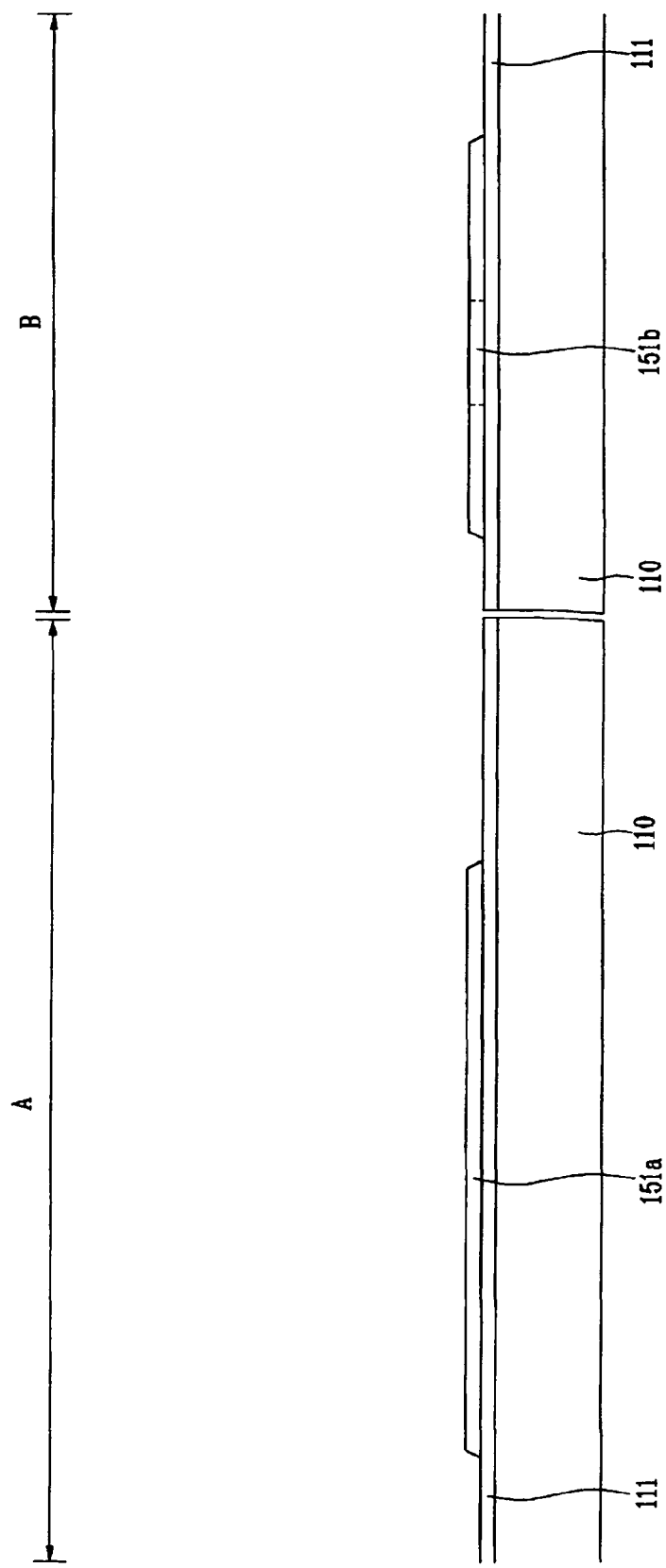
FIG. 10 is a sectional view of the TFT array panel shown in FIGS. 8 and 9 taken along the lines X-X' and X'-X"
Figure 11:
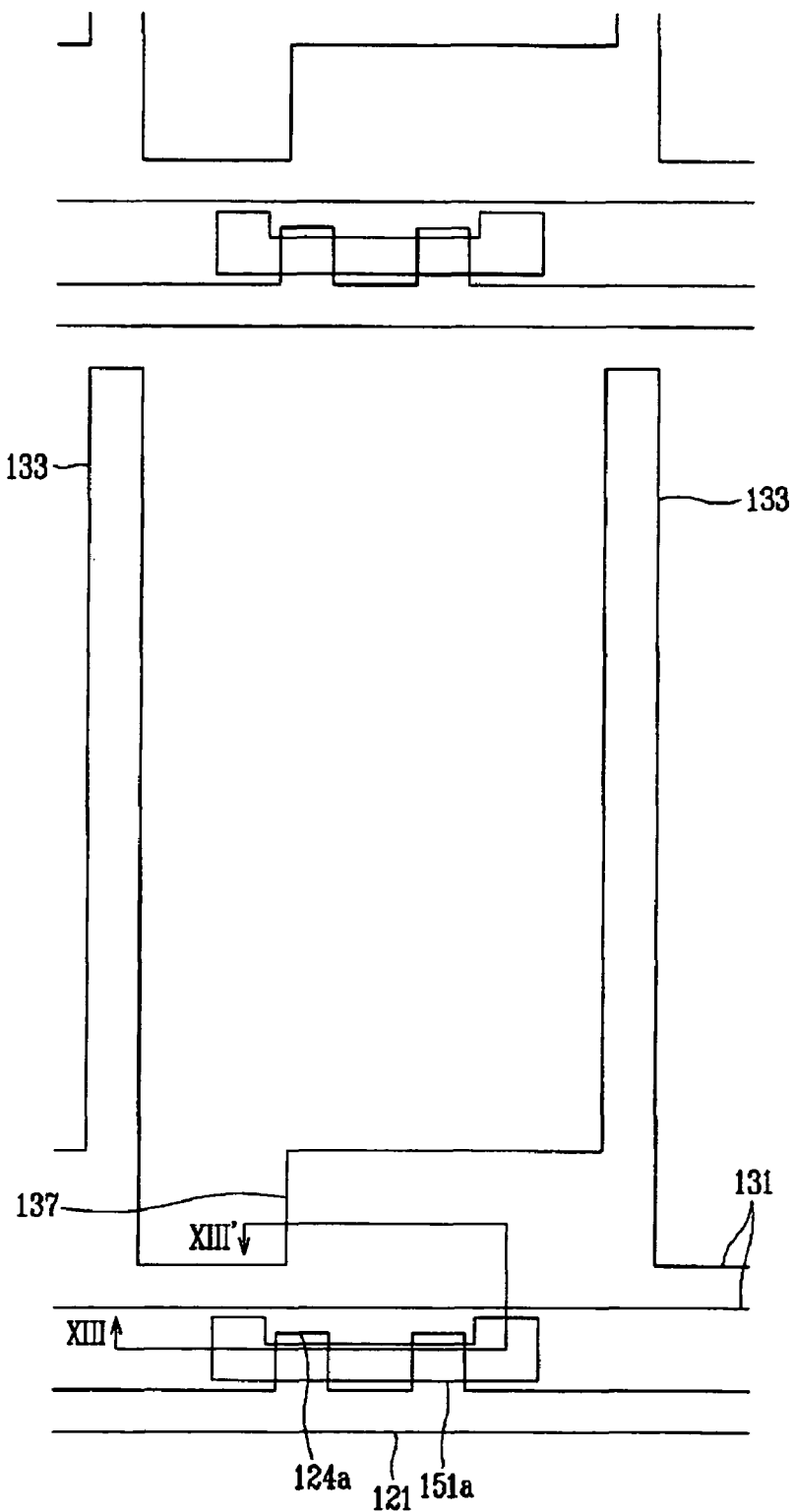
FIGS. 11 and 12 are layout views of the TFT array panel in the step following the step shown in FIGS. 8 and 9.
Figure 12:
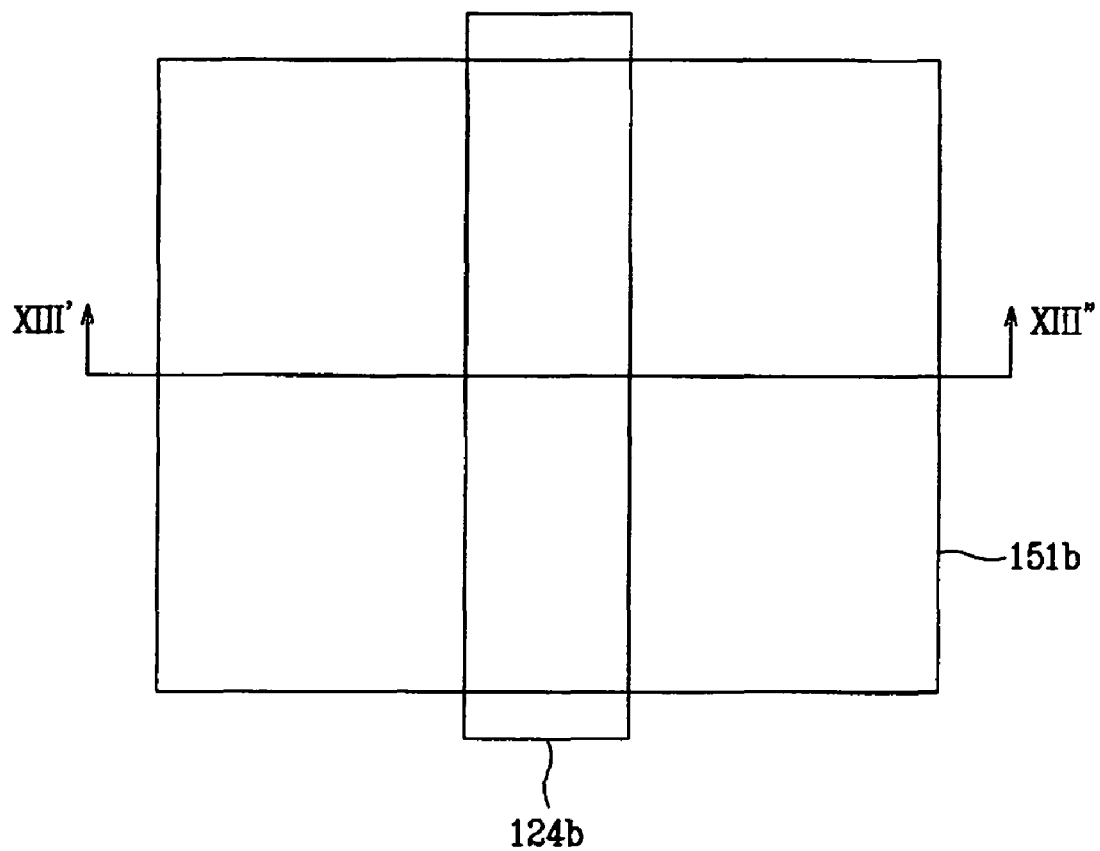
Figure 13:
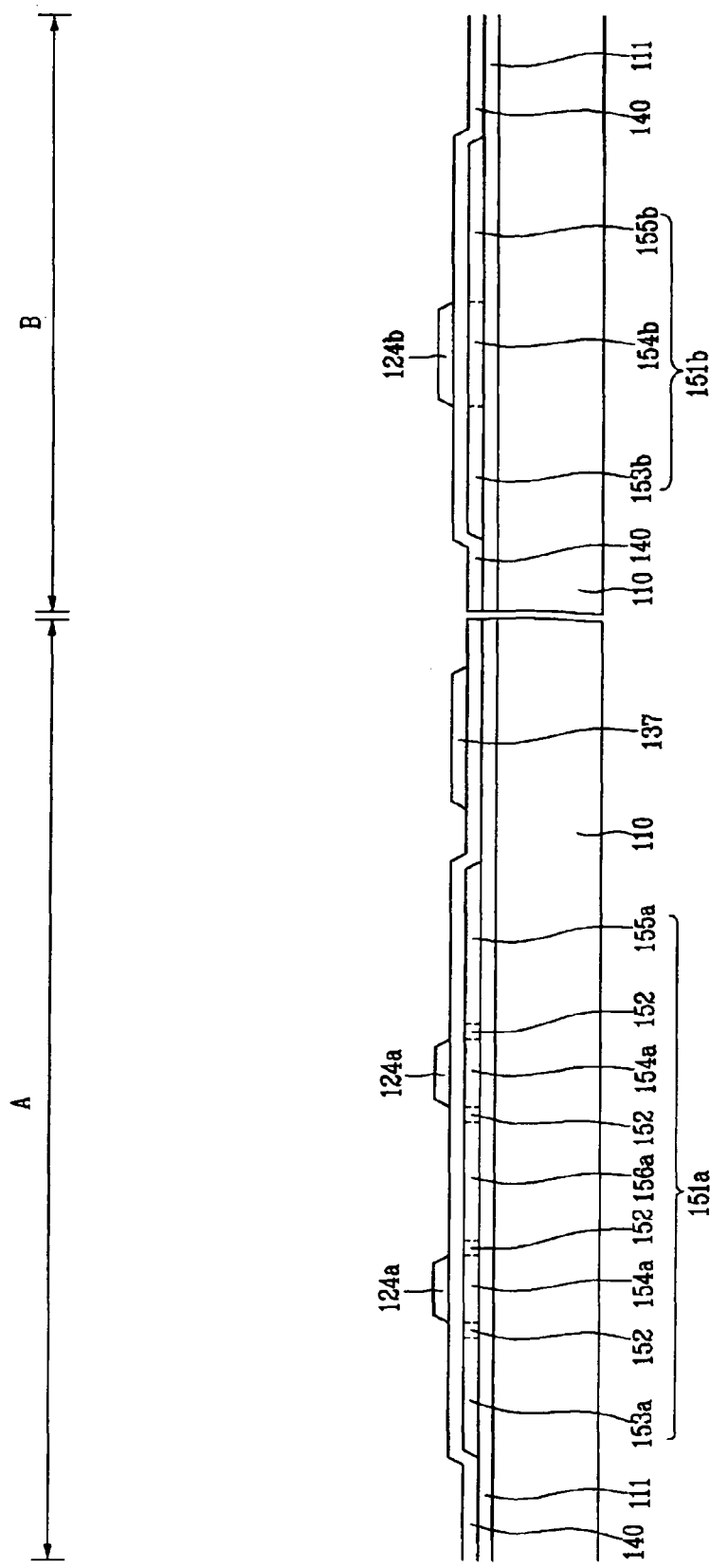
FIG. 13 is a sectional view of the TFT array panel shown in FIGS. 11 and 12 taken along the lines XII-XII' and XII'-XII"
Figure 14:
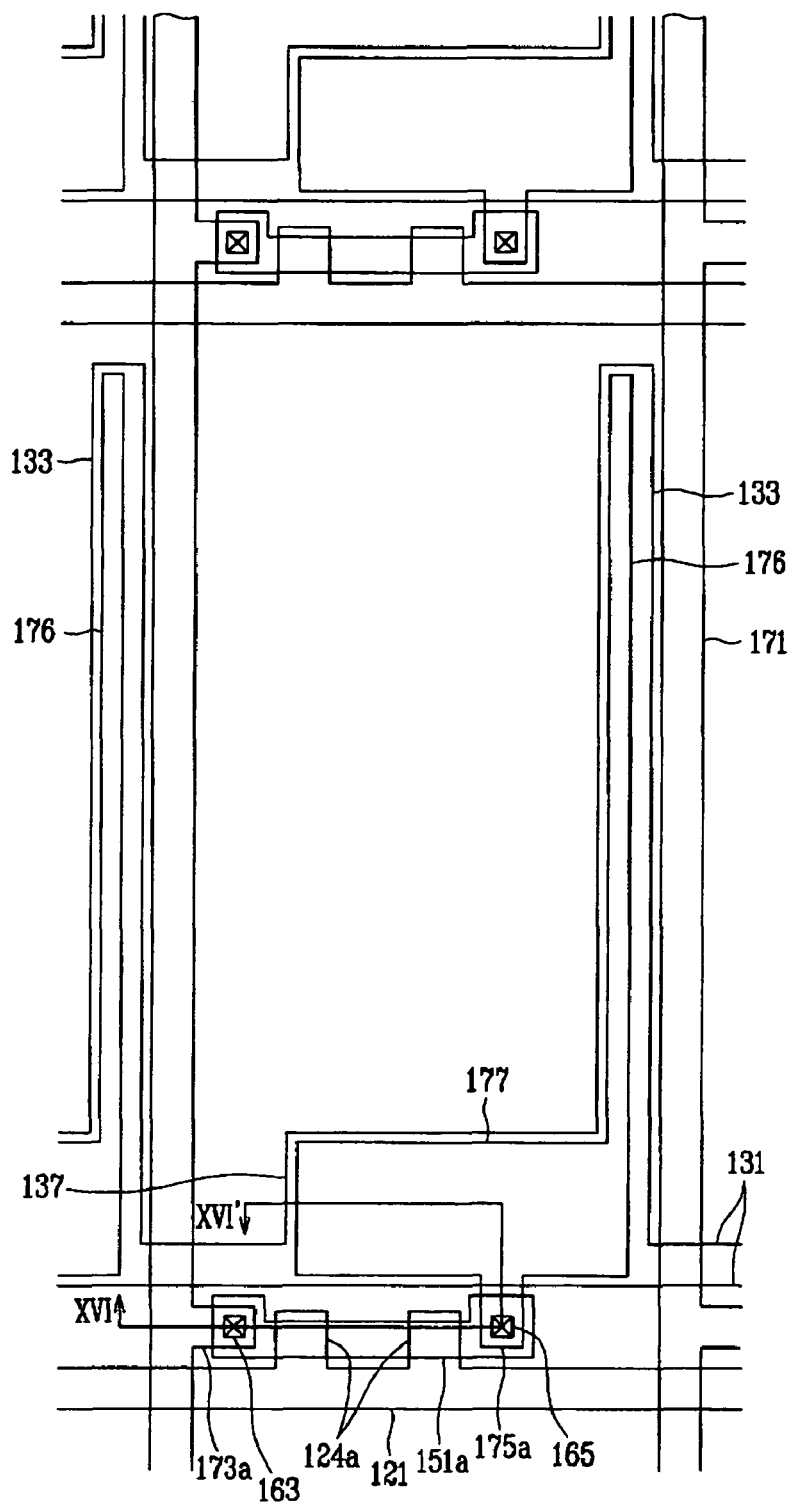
FIGS. 14 and 15 are layout views of the TFT array panel in the step following the step shown in FIGS. 11 and 12.
Figure 15:
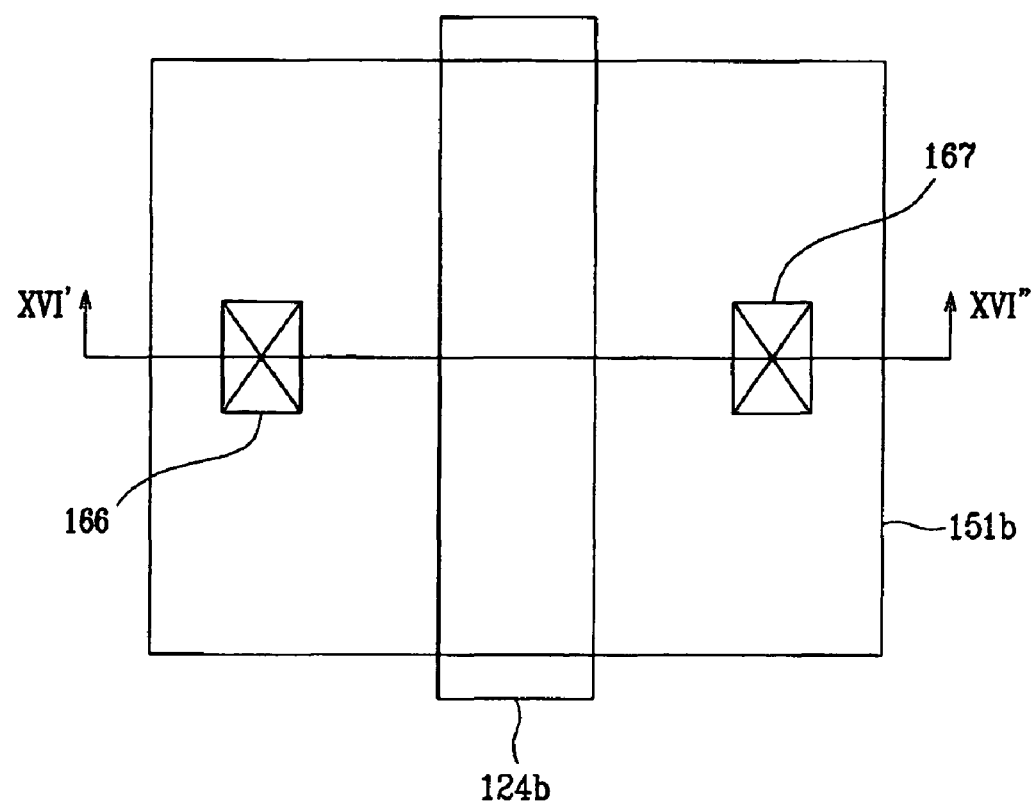
Figure 16:
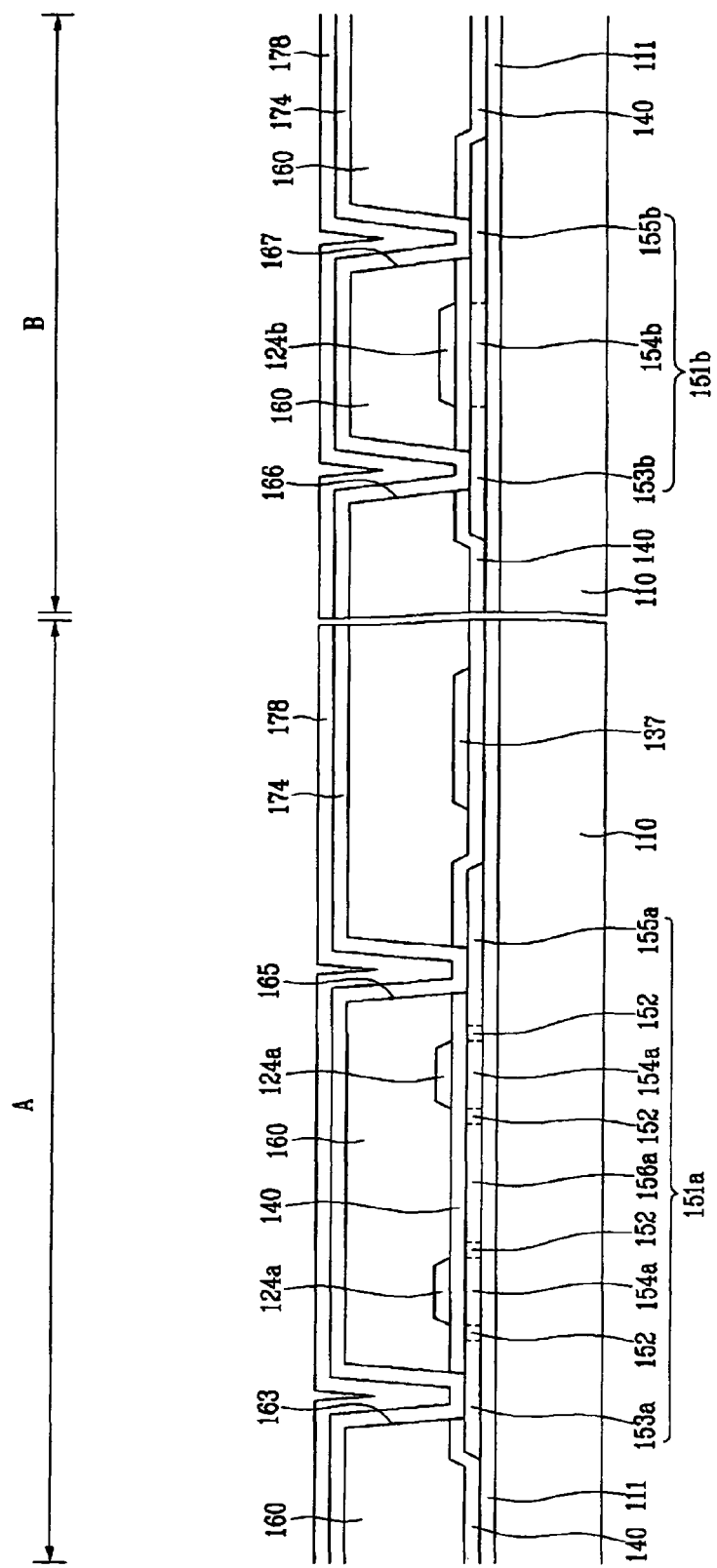
FIG. 16 is a sectional view of the TFT array panel shown in FIGS. 14 and 15 taken along the lines XVI-XVI' and XVI'-XVI"
Figure 17:
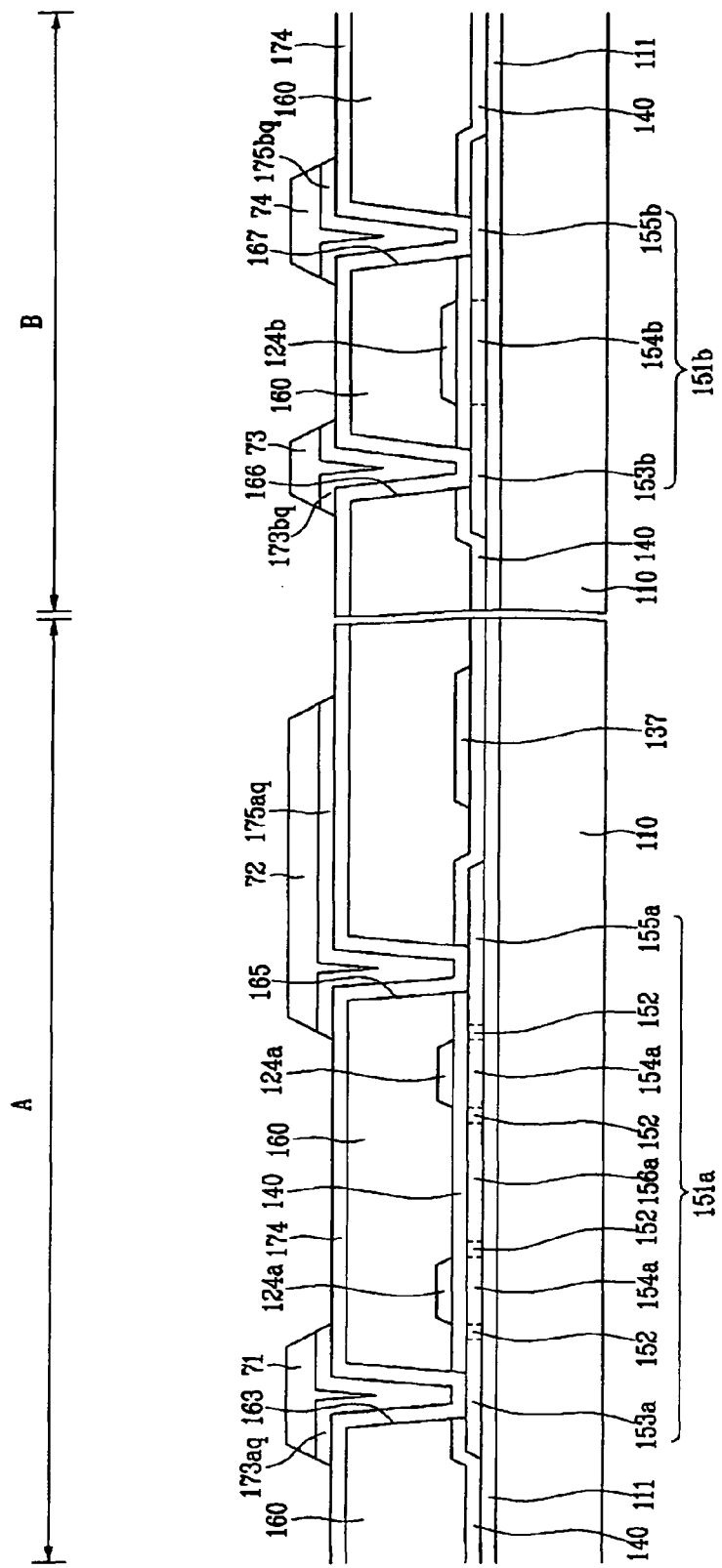
FIG. 17 is a sectional view of the TFT array panel in the step following the step shown in FIG. 16 taken along the lines XVI-XVI' and XVI'-XVI"
Figure 18:
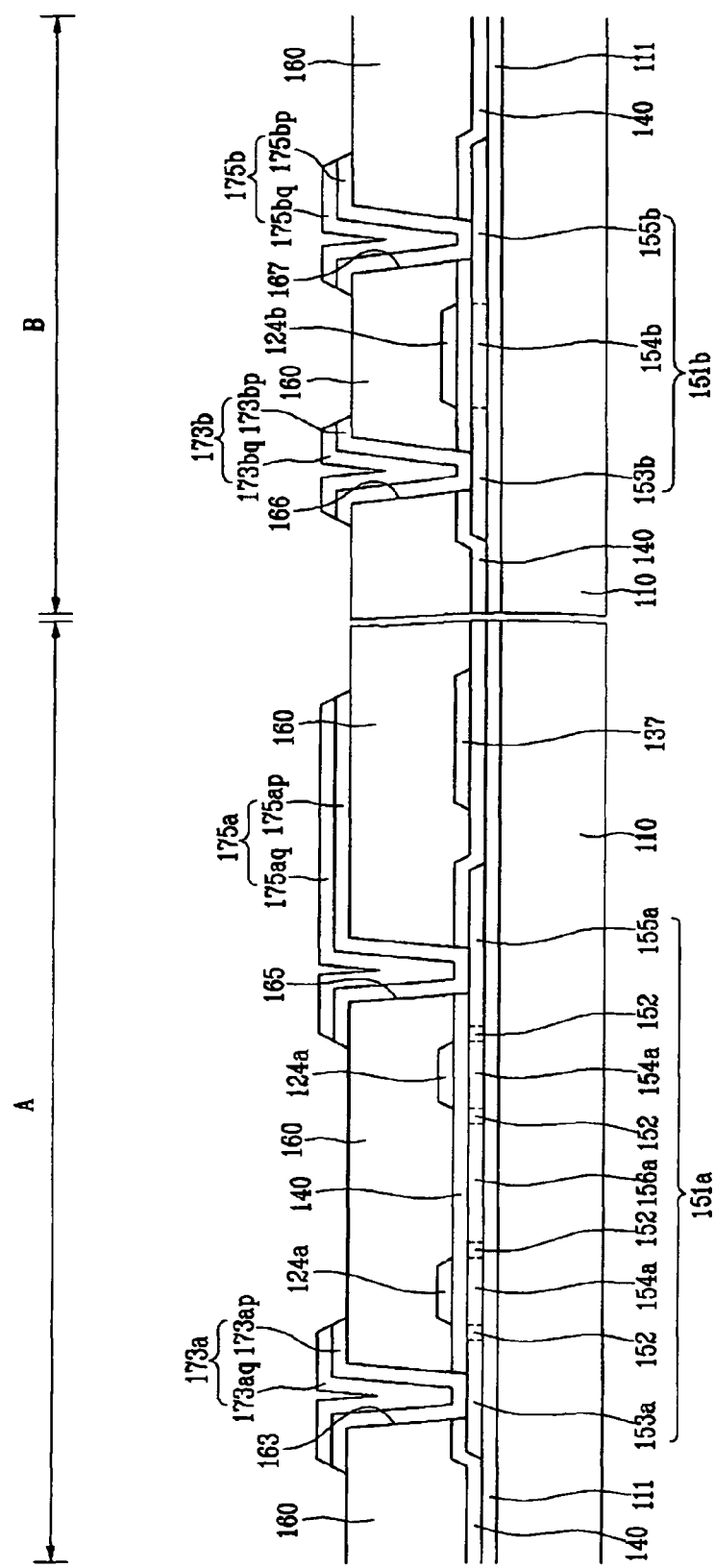
FIG. 18 is a sectional view of the TFT array panel in the step following the step shown in FIG. 17 taken along the lines XVI-XVI' and XVI'-XVI"
Figure 19:
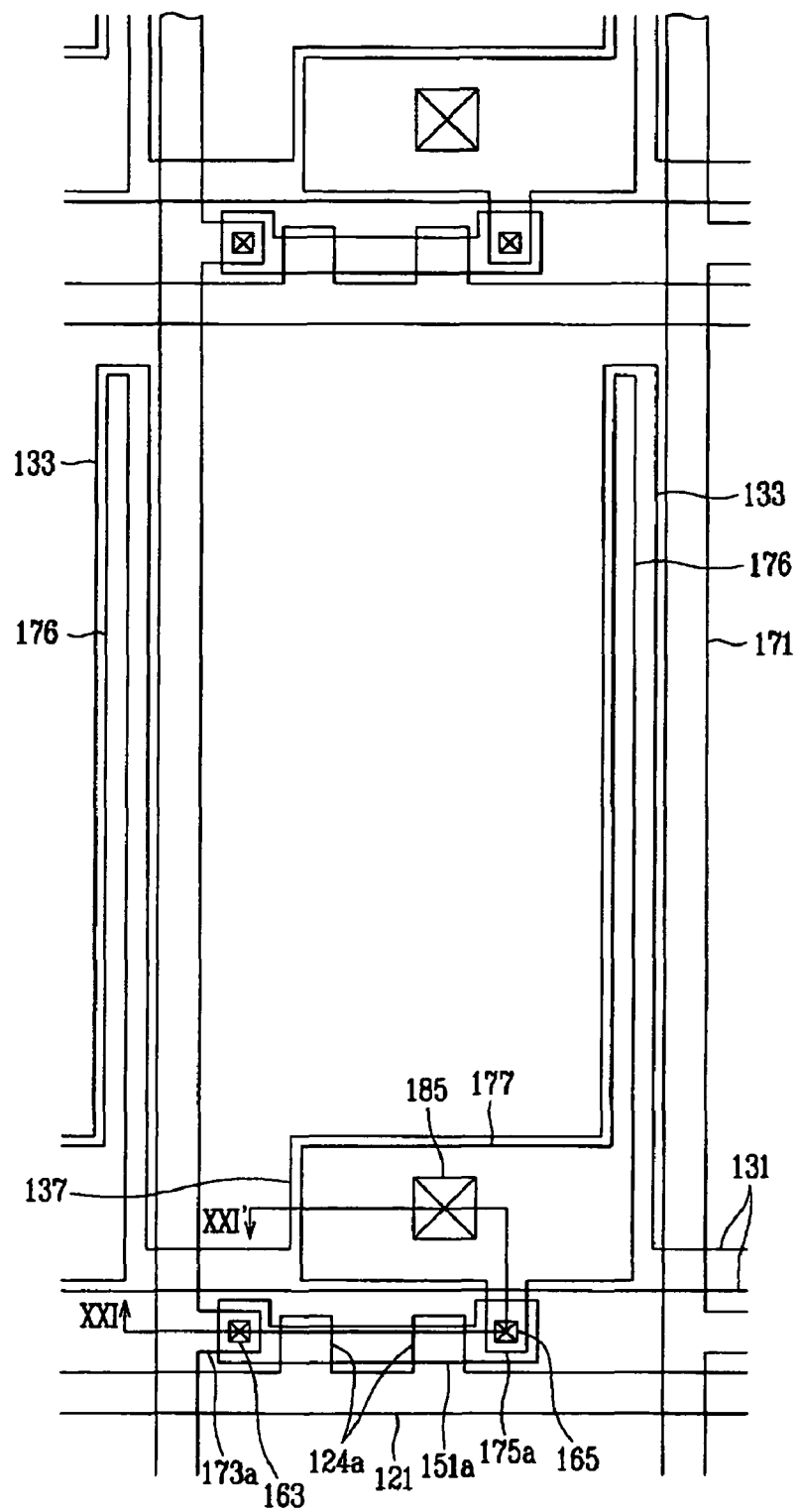
FIGS. 19 and 20 are layout views of the TFT array panel in the step following the step shown in FIGS. 14 and 15.
Figure 20:
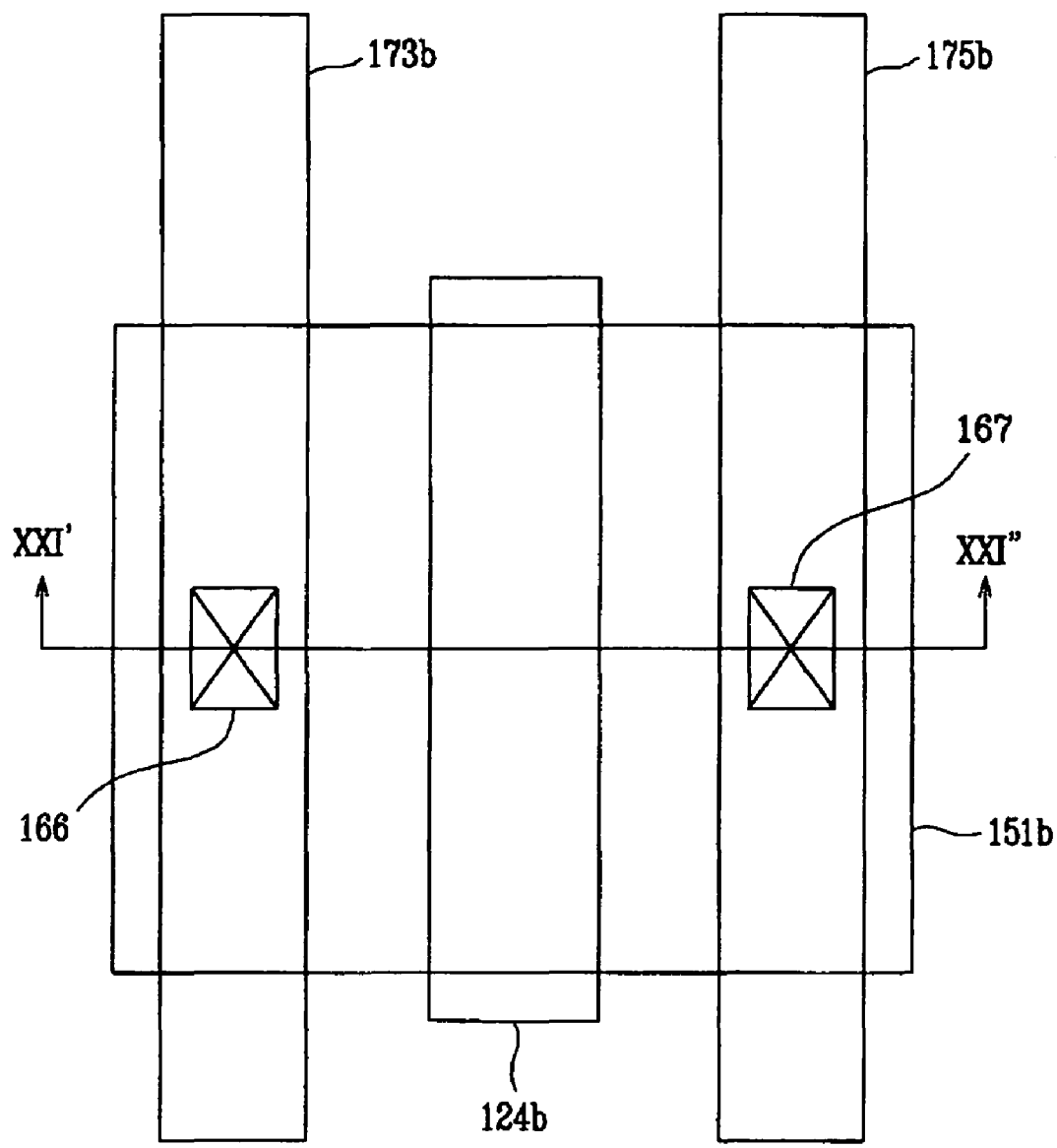
Figure 21:
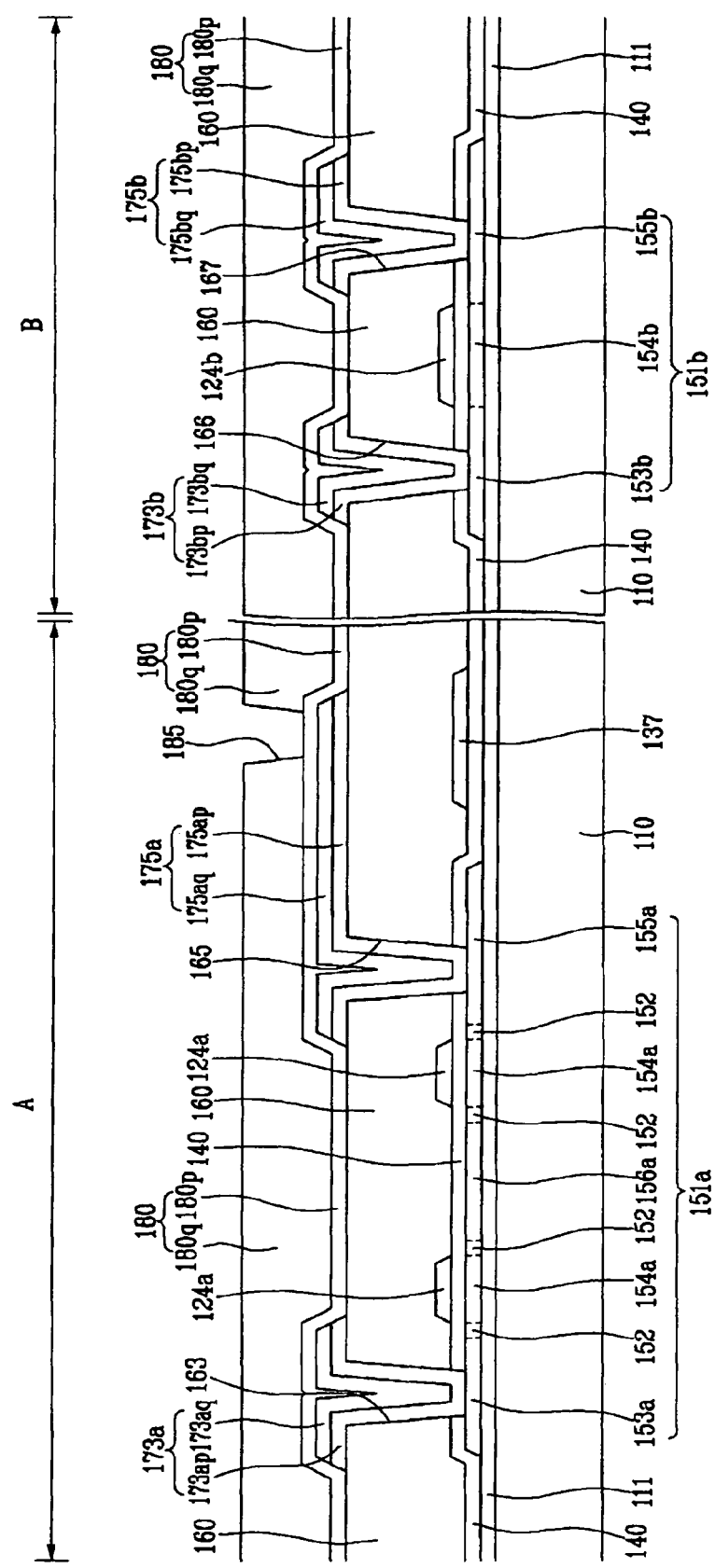
FIG. 21 is a sectional view of the TFT array panel shown in FIGS. 19 and 20 taken along the lines XXI-XXI' and XXI'-XXI"

FIGS. 8 and 9 are layout views of the TFT array panel shown in FIGS. 4 to 7 in the first step of a manufacturing method thereof according to an embodiment of the present invention. FIG. 10 is a sectional view of the TFT array panel shown in FIGS. 8 and 9 taken along the lines X-X' and X'-X". FIGS. 11 and 12 are layout views of the TFT array panel in the step following the step shown in FIGS. 8 and 9. FIG. 13 is a sectional view of the TFT array panel shown in FIGS. 11 and 12 taken along the lines XIII-XIII' and XIII'-XIII". FIGS. 14 and 15 are layout views of the TFT array panel in the step following the step shown in FIGS. 11 and 12. FIG. 16 is a sectional view of the TFT array panel shown in FIGS. 14 and 15 taken along the lines XVI-XVI' and XVI'-XVI". FIG. 17 is a sectional view of the TFT array panel in the step following the step shown in FIG. 16 taken along the lines XVI-XVI' and XVI'-XVI". FIG. 18 is a sectional view of the TFT array panel in the step following the step shown in FIG. 17 taken along the lines XVI-XVI' and XVI'-XVI". FIGS. 19 and 20 are layout views of the TFT array panel in the step following the step shown in FIGS. 14 and 15. FIG. 21 is a sectional view of the TFT array panel shown in FIGS. 19 and 20 taken along the lines XXI-XXI' and XXI'-XXI".

Referring to FIGS. 8 to 10, a blocking film 111 is formed on an insulating substrate 110, and a semiconductor layer preferably comprising amorphous silicon is deposited thereon. The semiconductor layer is then crystallized by laser annealing, furnace annealing, or solidification, and is patterned by lithography and etching to form a plurality of semiconductor islands 151a and 151b corresponding to a plurality of pixel regions and driver region, respectively. At this time, a plurality of protrusions may form on the surface of the semiconductor layer.

Referring to FIGS. 11 and 13, a gate insulating layer 140 preferably comprising silicon oxide or silicon nitride is deposited. Next, a plurality of gate lines 121 including a plurality of gate electrodes 124a, a plurality of storage electrode lines 131 including a plurality of expansions 137, and a plurality of control electrodes 124b are formed on the gate insulating layer 140.

Next, high-concentration N-type impurities are introduced into the semiconductor islands 151a and 151b by PECVD or plasma emulsion to form extrinsic regions 153a, 153b, 155a, and 155b, a channel region 154a, and lightly doped regions 152. At this time, the gate lines 121 and the storage electrode lines 131 may be used as an ion-implantation mask, and an additional process for forming the ion-implantation mask may be added to form the lightly doped regions 152.

Referring to FIGS. 14 to 18, an interlayer insulating layer 160 is deposited and patterned to form a plurality of contact holes 163, 165, 166, and 167 exposing the source regions 153a and 153b and the drain regions 155a and 155b.

Here, the deformation temperature of the interlayer insulating layer 160 is in the range of 200 to 300° C. The interlayer insulating layer 160 may comprise an organic material having high transmittance.

Thereafter, a plasma treatment process is executed to remove the impurities remaining on the surface of the semiconductor islands 151a and 151b exposed through the contact holes 163, 165, 166, and 167.

Next, a contact assistant layer 174 comprising an amorphous silicon layer and a metal layer 178 comprising a material including aluminum, such an Al—Nd alloy, are deposited sequentially on the interlayer insulating layer 160. Here, the sheet resistance of the amorphous silicon layer may be greater than 109Ω/square, and the N-type impurities such as phosphorus (P) may be heavily doped therein.

The contact assistant layer 174 has good adhesion characteristics with the polysilicon semiconductor islands 151a and 151b such that the contact resistance between the contact assistant layer 174 and the semiconductor islands 151a and 151b may be reduced even though the semiconductor islands 151a and 151b have protrusions. In addition, the exposed surface of the contact assistant layer 174 is flat such that the contact resistance between the contact assistant layer 174 and the metal layer 178 may be reduced. At this time, it is preferable that the thickness of the contact assistant layer 174 is in the range of 500 to 1,000 Å.

Thereafter, a thermal treatment process is executed in the range of 200 to 300° C. This process causes the metal particles of the metal layer 178 to diffuse into the inner portion of the contact assistant layer 174, such that the adhesion between the metal layer 178 and the contact assistant layer 174 may be improved and the contact resistance therebetween may be reduced.

Table 1 represents the contact sheet resistances between the metal layer 178 and the amorphous silicon layer after the thermal treatment process. Here, amorphous silicon layers having thicknesses of 300, 500, and 800 Å, an amorphous silicon layer (a-Si) containing little of the conductive impurities, and an amorphous silicon layer (n+a-Si) heavily doped with impurities are used as various examples.

| Contact | Number of test | | | | | |
|---|---|---|---|---|---|---|
| assistant layer | Test 1 | Test 2 | Test 3 | Test 4 | Test 5 | Average |
| n + a-Si (500 Å) | 7.225 | 8.484 | 6.72 | 7.01 | 8.42 | 7.57 |
| n + a-Si (800 Å) | 2.338 | 2.56 | 2.00 | 2.39 | 2.51 | 2.36 |
| a-Si (300 Å) | 6.416 | 1.1 | 1.35 | 1.04 | 1.03 | 1.036 |
| a-Si (500 Å | 1.96 | 2.451 | 1.072 | 2.65 | 2.37 | 2.654 |
| | | | | ($\times 10^4$) | | |

(All sheet resistance values are $\times 10^4$ Ω/square.)

As shown in Table 1, the sheet resistance of the amorphous silicon may be reduced by a factor of ~4 through the thermal treatment process, and the distribution of the sheet resistance contacting the amorphous silicon and the metal layer may be uniform.

Next, a photoresist (71, 72, 73, and 74) is formed on the metal layer 178.

Next, the metal layer 178 is patterned with a wet-etch or dry-etch technique using the photoresist (71, 72, 73, and 74) as an etch mask to form an upper film of a plurality of data lines 171 including a plurality of source electrodes 173a, a plurality of drain electrodes 175a, a plurality of input electrodes 173b, and a plurality of output electrodes 175b. Next, the contact assistant layer 174 is patterned using the photoresist (71, 72, 73, and 74) as an etch mask to form a lower film of a plurality of data lines 171 including a plurality of source electrodes 173a, a plurality of drain electrodes 175a, a plurality of input electrodes 173b, and a plurality of output electrodes 175b. At this time, the photoresist (71, 72, 73, and 74) may be removed, and thereafter the contact assistant layer 174 may be patterned using the upper film as an etch mask to form the lower film. It is preferable that the contact assistant layer 174 is dry-etched.

In FIGS. 17 and 18, the lower and the upper films of the source electrode 173a, the drain electrodes 175a, the input electrodes 173b, and the output electrodes 175b are indicated by reference numerals 173ap and 173aq, 175ap and 175aq, 173bp and 173bq, and 175bp and 175bq, respectively.

Referring to FIGS. 19 to 21, a lower passivation layer 180p comprising an inorganic material is deposited and an upper passivation layer 180q comprising a photosensitive organic material is coated onto the lower passivation layer 180p to form a passivation layer 180. Then, the upper passivation layer 180q is exposed using a photo-mask and is developed to expose the portion of the lower passivation layer 180p. The exposed portion of the lower passivation layer and the gate insulating layer 180p are dry-etched to form a plurality of contact holes 185 exposing the expansions 177 of the drain electrodes 175a.

Referring to FIGS. 2 and 4, a plurality of pixel electrodes 191 are formed on the passivation layer 180.

A TFT array panel for an LCD according to another embodiment of the present invention will be described in detail with reference to FIGS. 22 to 25.

Figure 22:
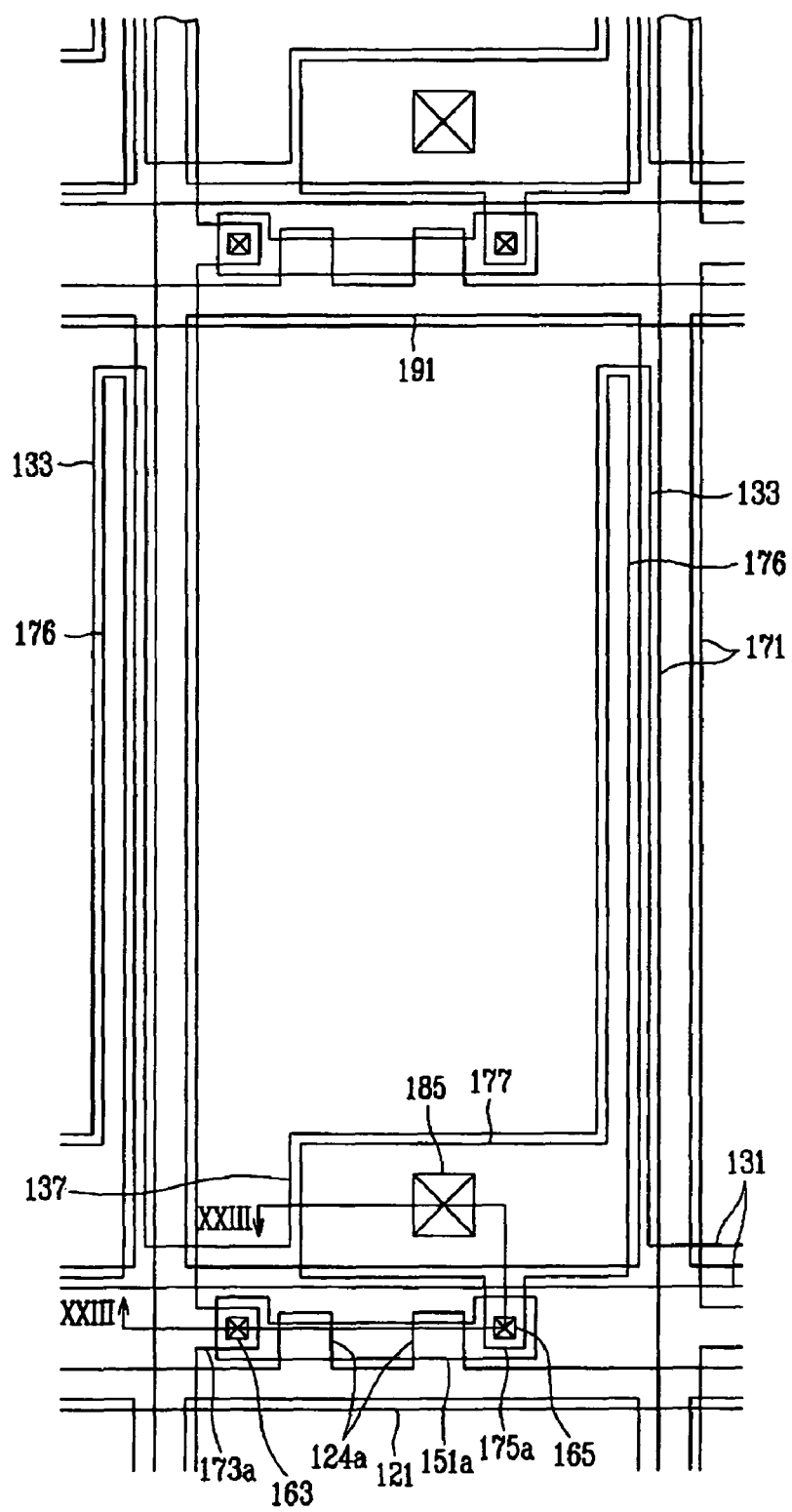
FIGS. 22 and 24 are layout views of the TFT array panel according to another embodiment of the present invention.
Figure 23:
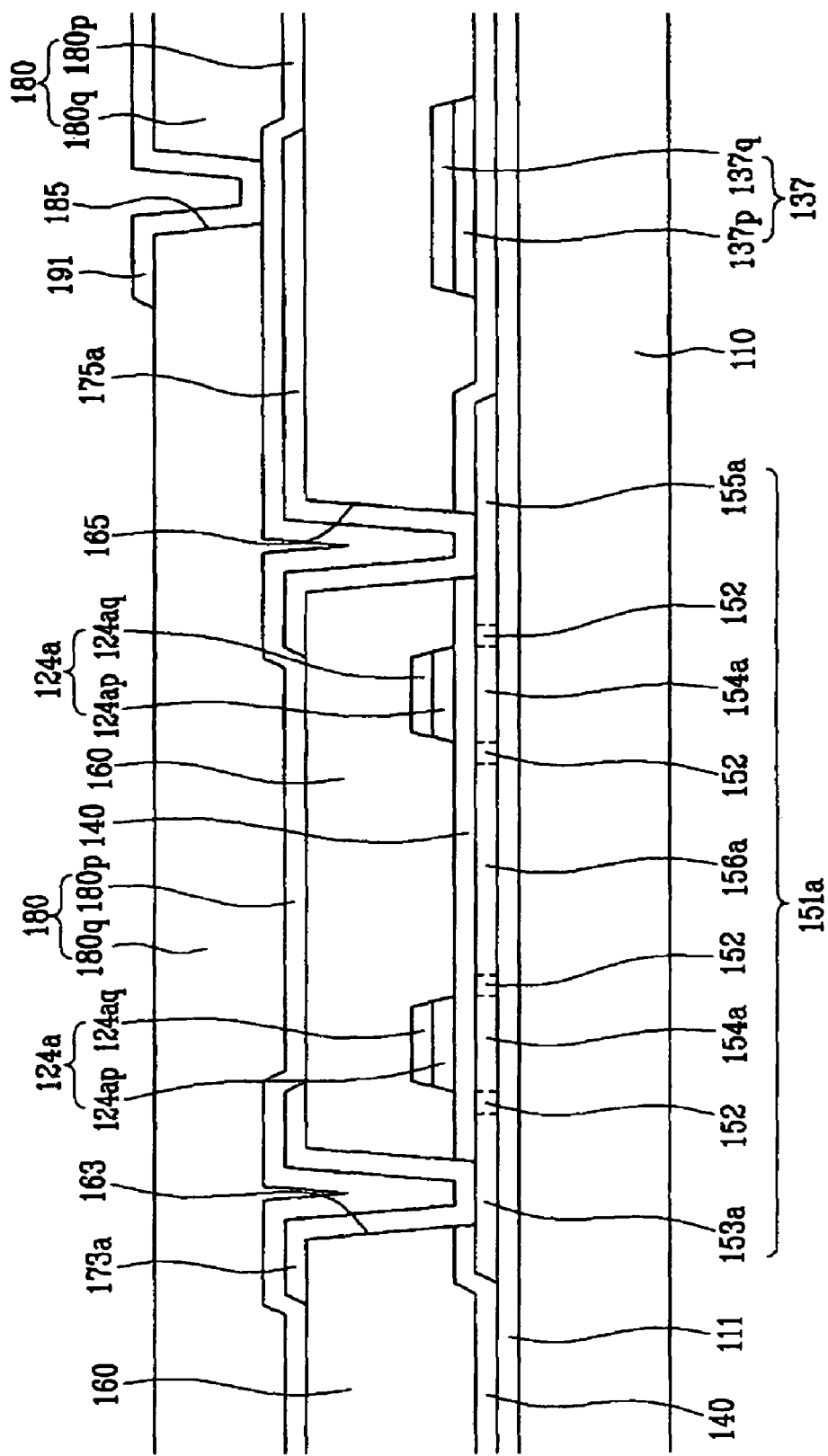
FIGS. 23 and 25 are sectional views of the TFT array panel shown in FIGS. 22 and 24 taken along the lines XXIII-XXIII and XXV-XXV.
Figure 24:
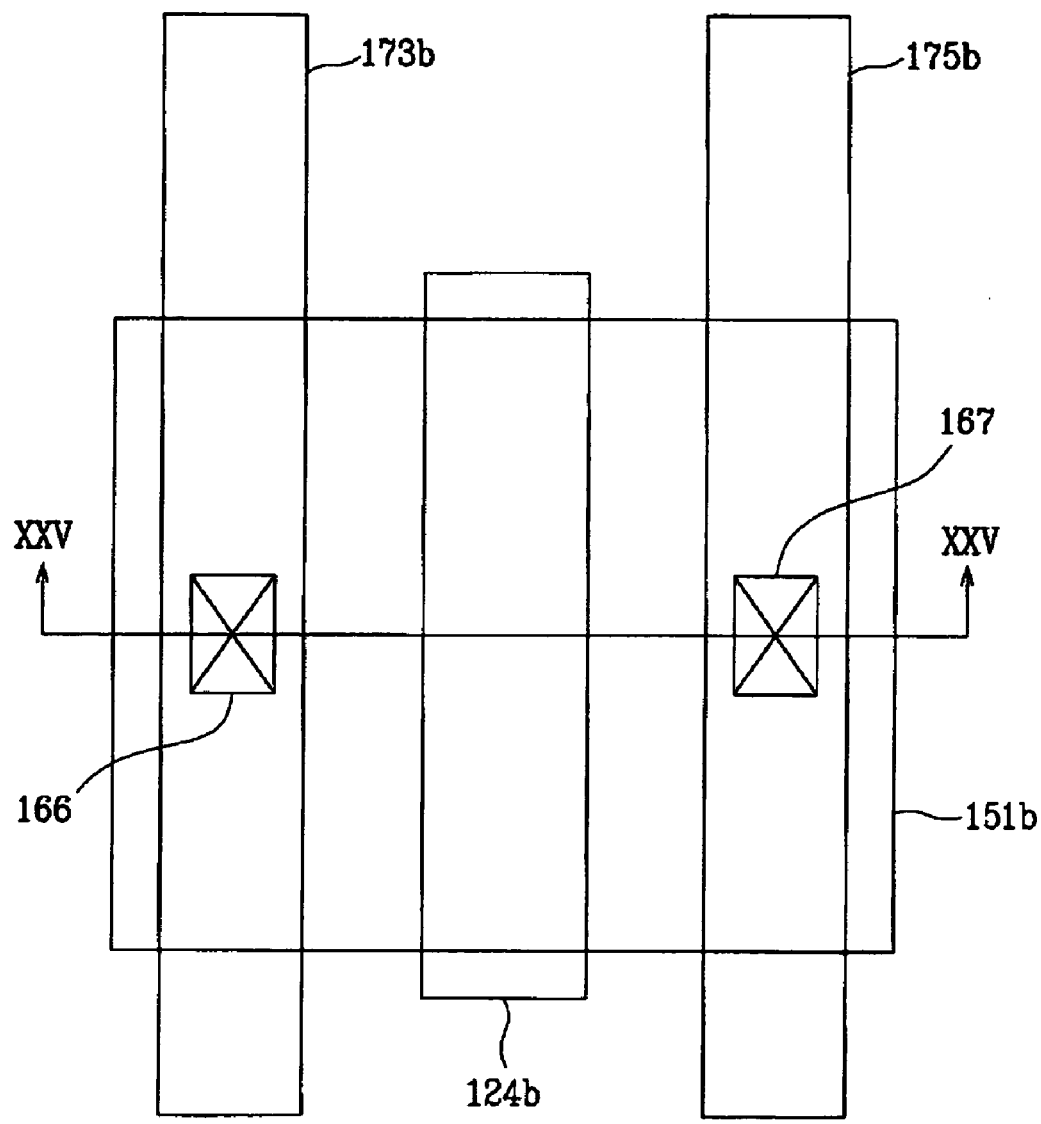
Figure 25:
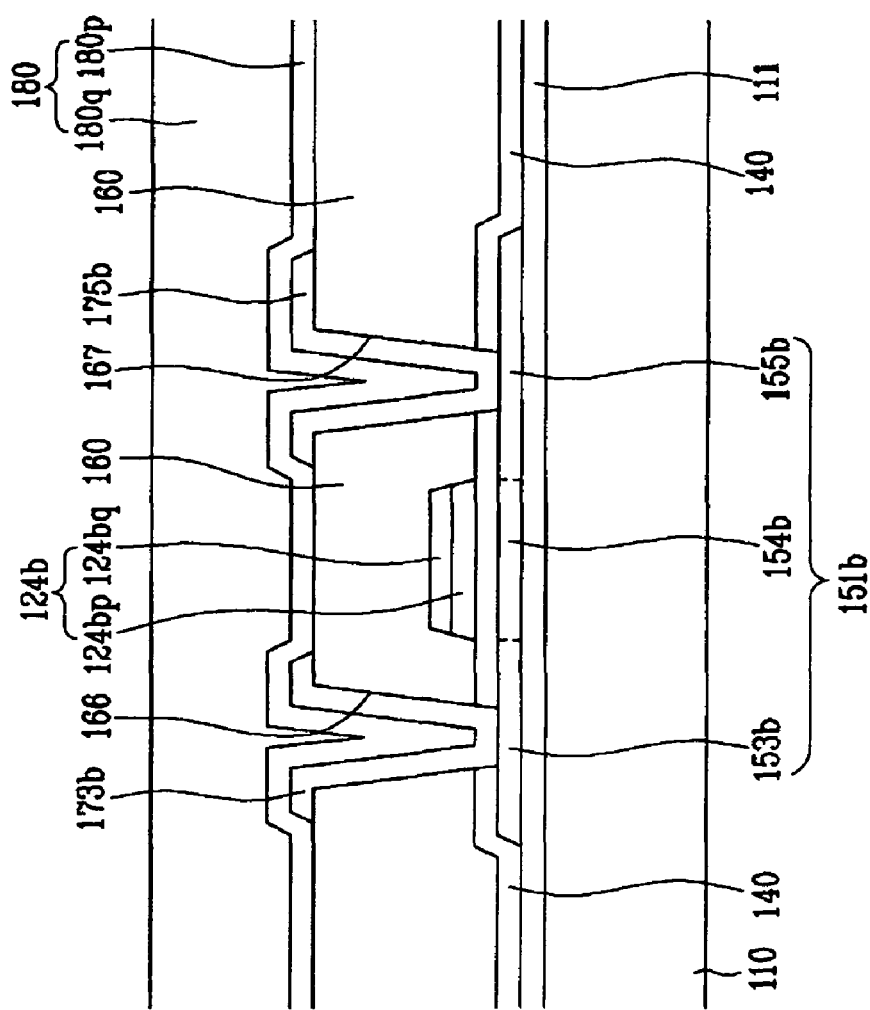

FIGS. 22 and 24 are layout views of the TFT array panel according to another embodiment of the present invention, and FIGS. 23 and 25 are sectional views of the TFT array panel shown in FIGS. 22 and 24 taken along the lines XXIII-XXIII and XXV-XXV. Referring to FIGS. 22 to 25, layered structures of the TFT panels according to this embodiment are almost the same as those shown in FIGS. 4 to 7.

A plurality of semiconductor islands 151a and 151b are formed on an insulating substrate 110, and a gate insulating layer 140 is formed thereon. A plurality of gate conductors comprising a plurality of gate lines 121 having a plurality of gate electrodes 124a and a plurality of control electrodes 124b, and a plurality of storage electrode lines 131 are formed on the gate insulating layer 140.

An interlayer insulating layer 160 is formed on the gate conductors 121, 124a, and 124b, and on the storage electrode lines 131. A plurality of contact holes 163, 165, 166, and 167 are formed through the interlayer insulating layer 160 and the gate insulating layer 140. A plurality of data conductors including a plurality of data lines 171, a plurality of drain electrodes 175a for connection with the pixel electrodes 191, and a plurality of input and output electrodes 173b and 175b for the driver region are formed on the interlayer insulating layer 160.

A passivation layer 180 is formed on the data conductors 171, 175a, 173b, and 175b and the interlayer insulating layer 160. A plurality of pixel electrodes 191 are formed on the passivation layer 180.

One difference between the LCD shown in FIGS. 4 to 7 and the LCD shown in FIGS. 22 to 25 is that the gate conductors 121, 124a, and 124b, and the storage electrode lines 131 comprise an upper film and a lower film. The lower film comprises amorphous silicon and may include conductive impurities. The upper film may comprise a material comprising an Al-containing metal such as Al or an Al alloy (e.g. Al—Nd), or a Mo-containing metal such as Mo or a Mo alloy. Alternatively, the gate conductors 121, 124a, and 124b, and the storage electrode lines 131 may comprise two films including a lower film comprising Al (or Al alloy) or Mo (or Mo alloy) and an upper film comprising amorphous silicon. In yet other embodiments, the gate conductors 121, 124a, and 124b, and the storage electrode lines 131 may comprise three films including a lower film comprising amorphous silicon, a middle film comprising Al (or Al alloy) or Mo (or Mo alloy), and an upper film comprising amorphous silicon.

The particles of the Al or Mo in the upper film may diffuse into the lower film of the gate conductors 121, 124a, and 124b, and the storage electrode lines 131, such that the adhesion between the upper film and lower film is improved and the resistance of the lower film may be reduced. As shown in FIGS. 22 to 25, "p" and "q" are added to the reference numerals of the gate electrode 124a, the control electrode 124b, the storage electrode 137, and the passivation layer 180 to indicate the lower and upper films, wherein the "p" indicates the lower film and the "q" indicates the upper film.

In other embodiments, the gate conductors 121, 124a, and 124b, and the storage electrode lines 131 may be located under the semiconductor islands 151a and 151b. In addition, the gate insulating layer 140 may be disposed between the gate conductors 121, 124a, and 124b, and the storage electrode lines 131, and the semiconductor islands 151a and 151b.

The gate electrodes 124a, the control electrodes 124b, and the storage electrode lines 131 may overlap the lightly doped regions 152. A method of manufacturing the TFT array panel shown in FIGS. 22 to 25 will be described in detail below with reference to FIGS. 26 to 42 as well as FIGS. 22 to 25.

Figure 26:
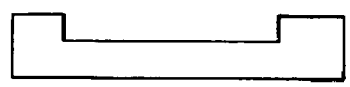
FIGS. 26 and 27 are layout views of the TFT array panel shown in FIGS. 22 to 25 in the first step of a manufacturing method thereof according to an embodiment of the present invention.
Figure 26:
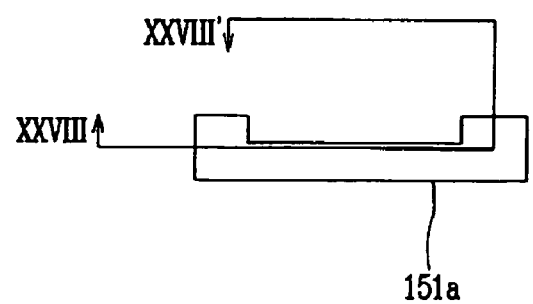
Figure 27:
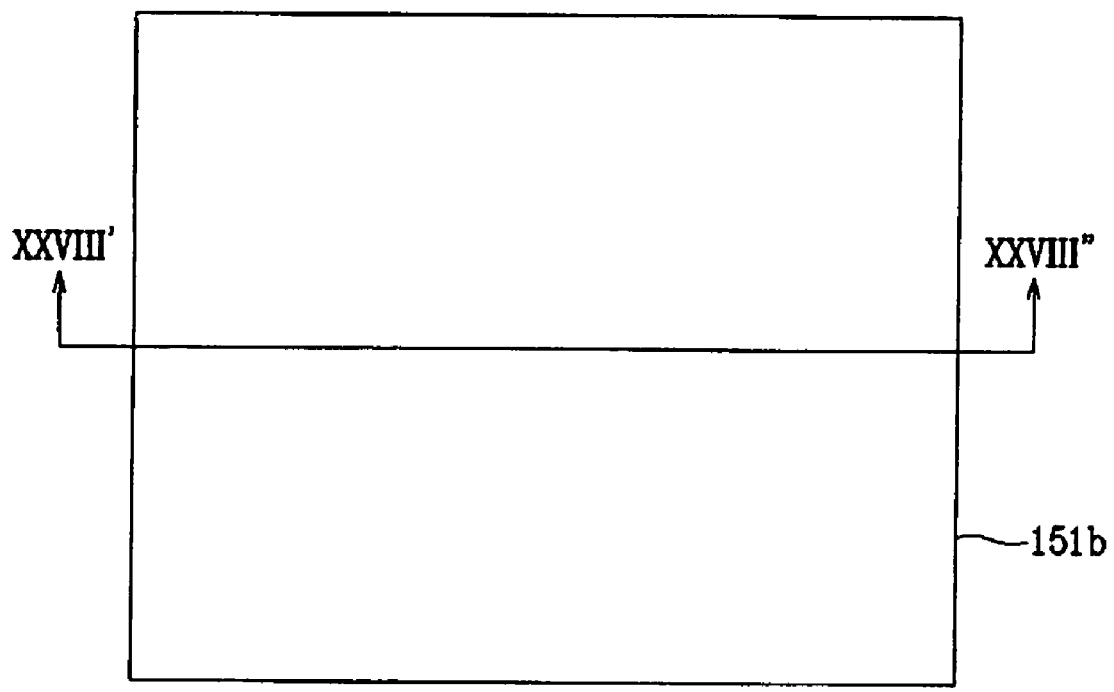
Figure 28:
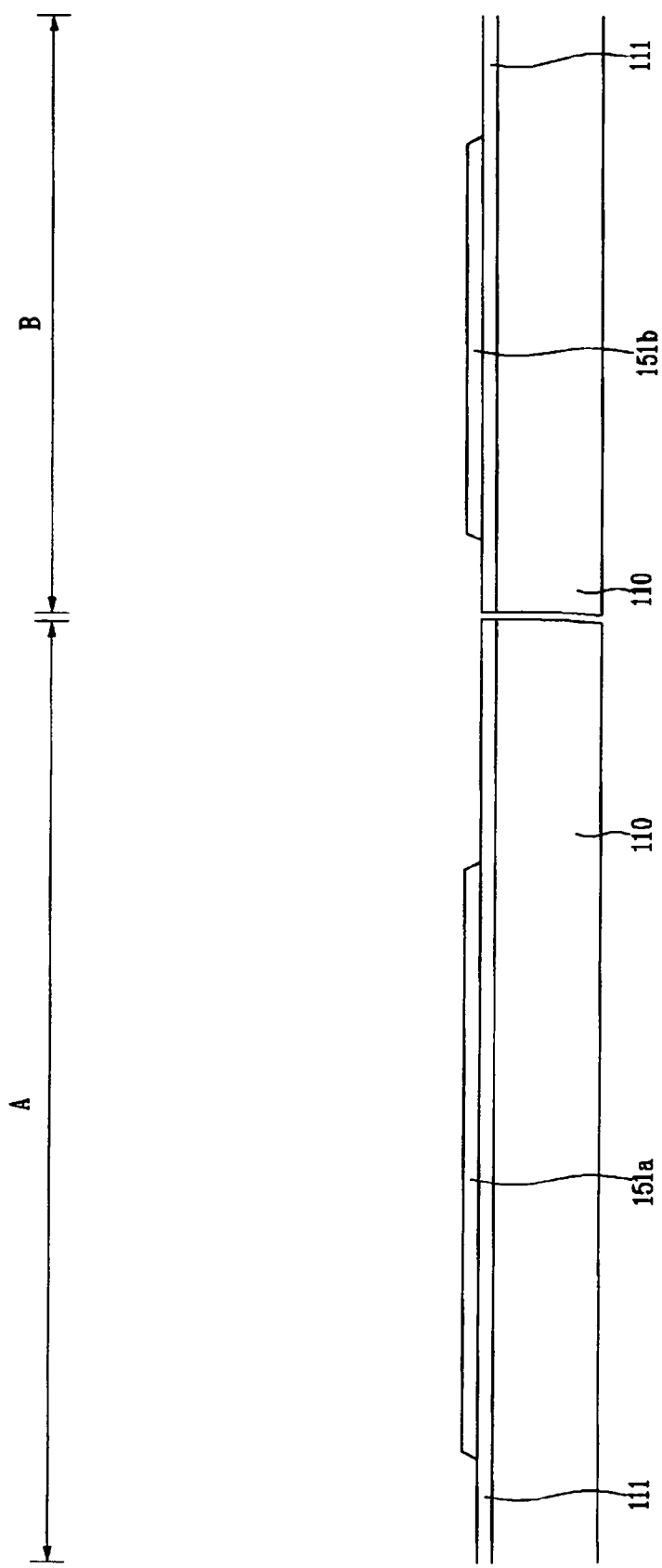
FIG. 28 is a sectional view of the TFT array panel shown in FIGS. 26 and 27 taken along the lines XXVIII-XXVIII' and XXVIII'-XXVIII"
Figure 29:
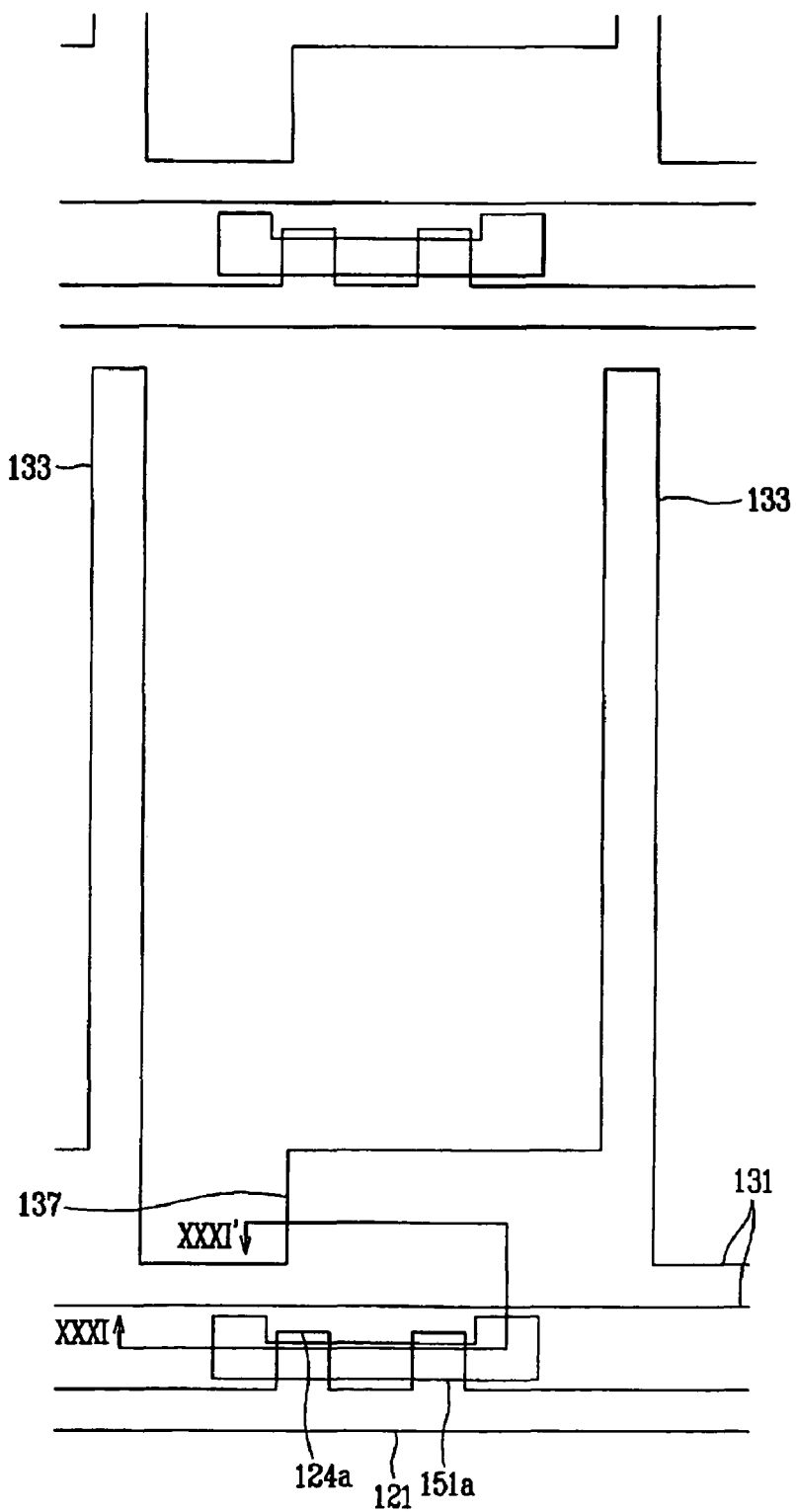
FIGS. 29 and 30 are layout views of the TFT array panel in the step following the step shown in FIGS. 26 and 27.
Figure 30:
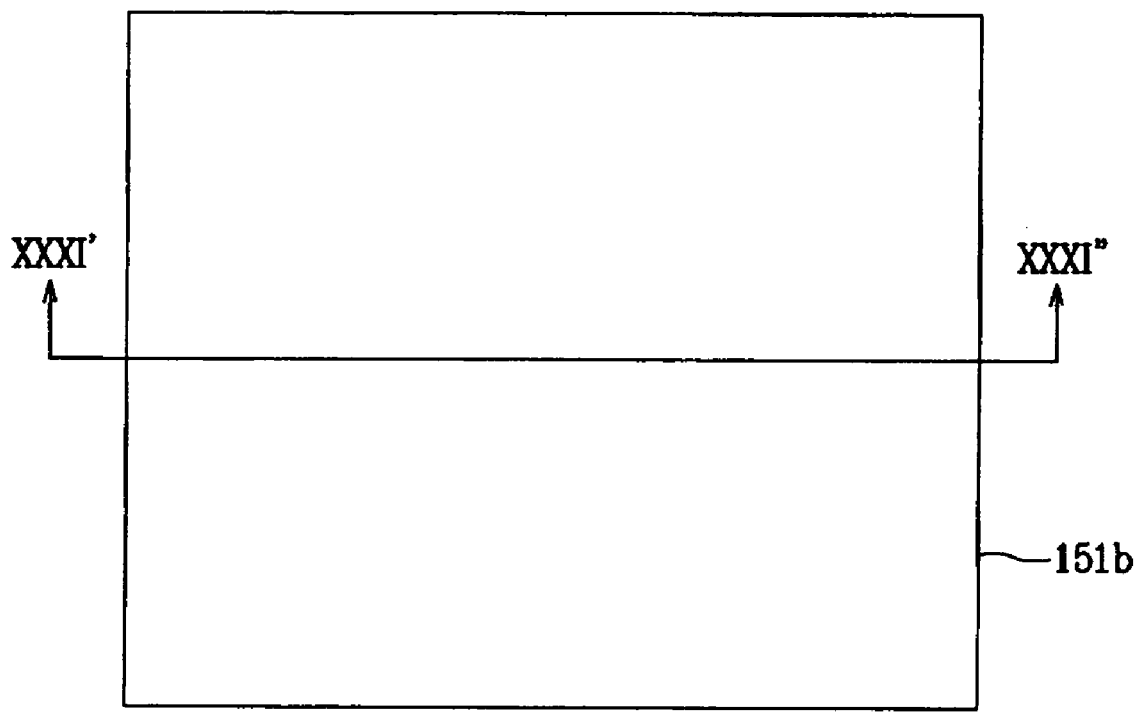
Figure 31:
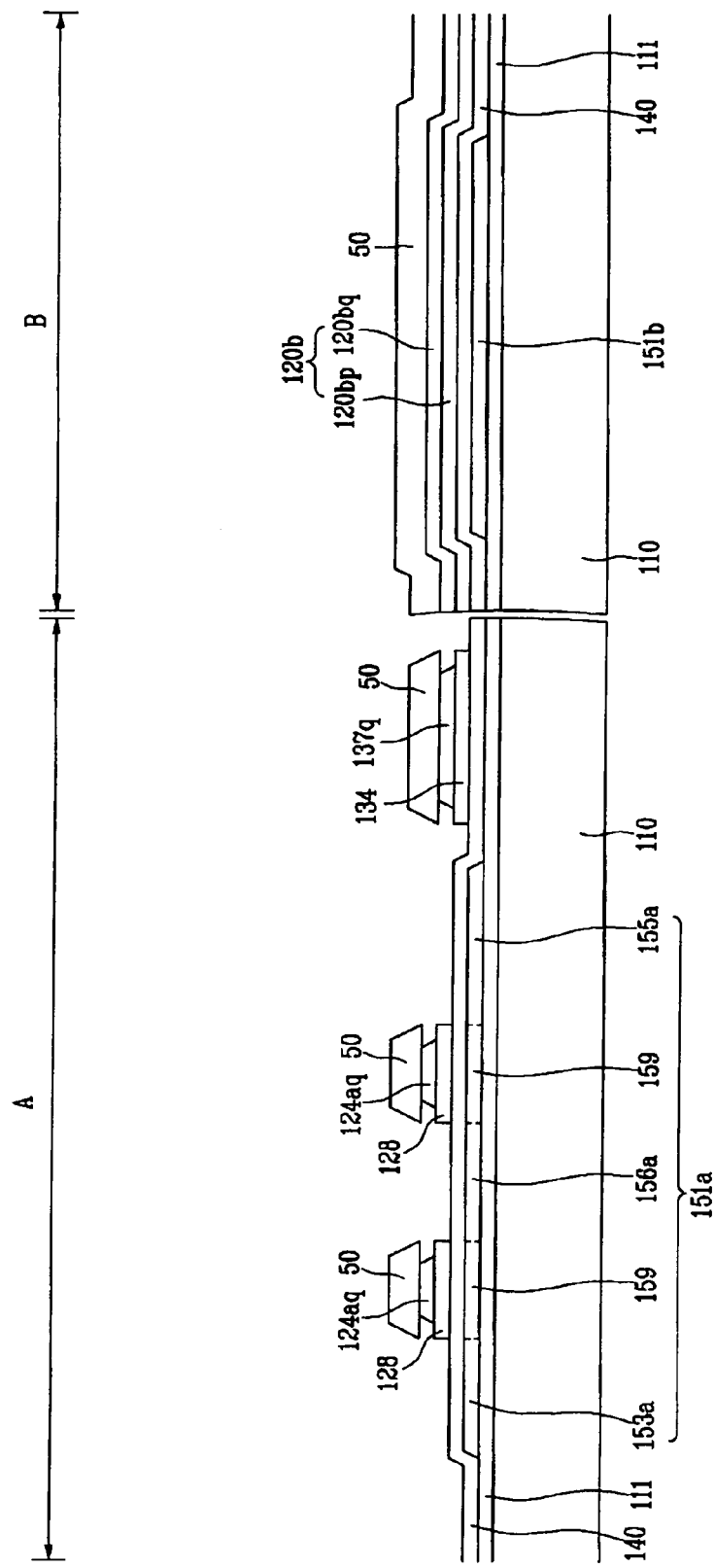
FIG. 31 is a sectional view of the TFT array panel shown in FIGS. 29 and 30 taken along the lines XXXI'-XXXI' and XXXI'-XXXI"
Figure 32:
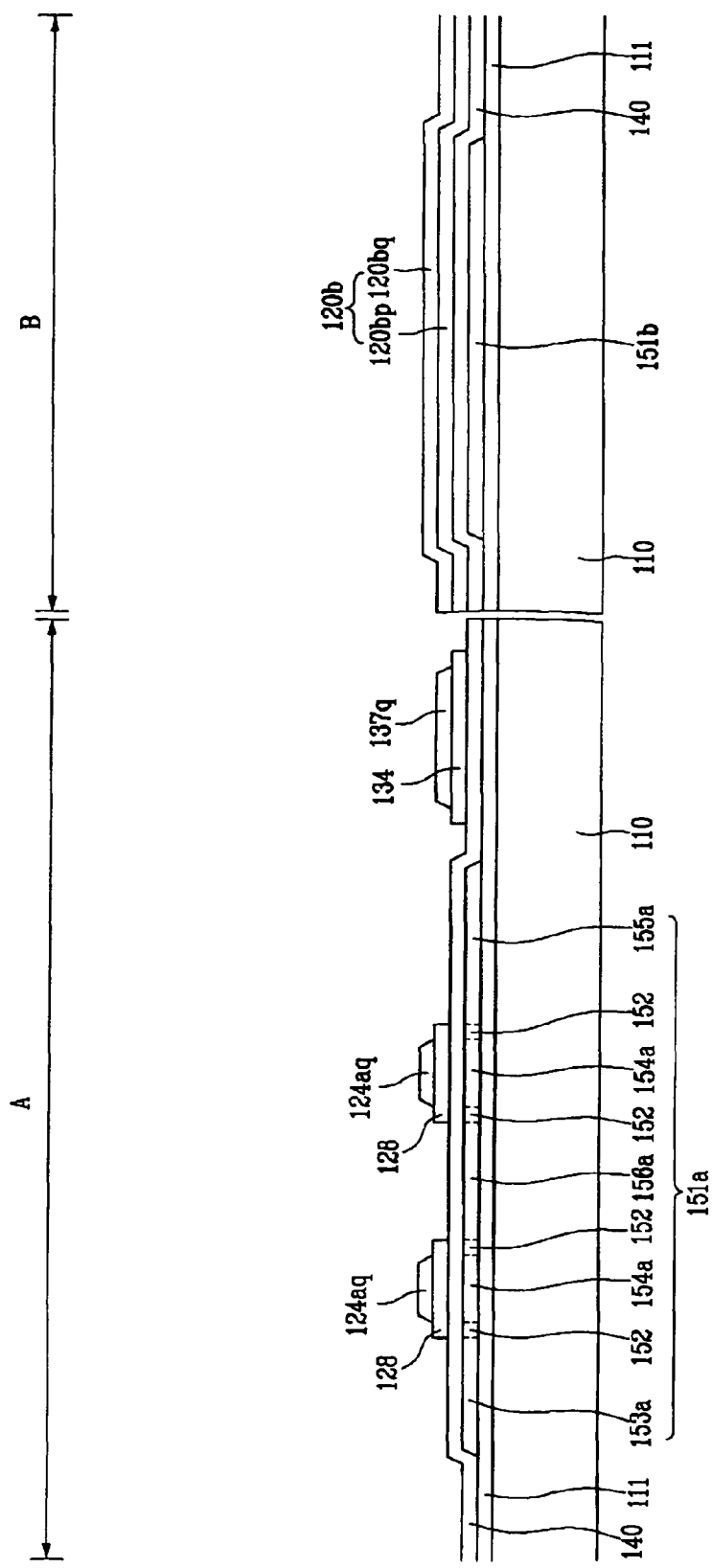
FIG. 32 is a sectional view of the TFT array panel in the step following the step shown in FIG. 31 taken along the lines XXXI-XXXI' and XXXI'-XXXI"
Figure 33:
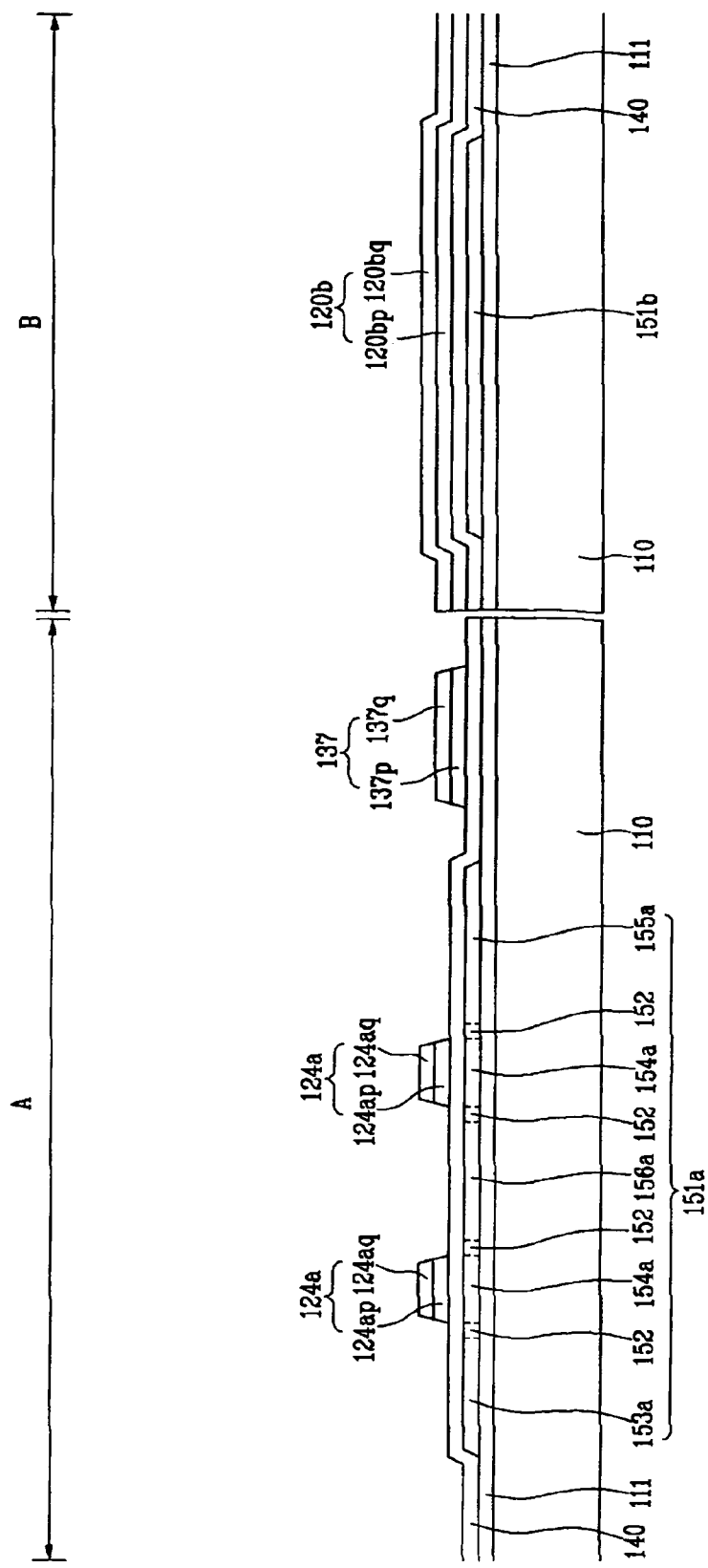
FIG. 33 is a sectional view of the TFT array panel in the step following the step shown in FIG. 32 taken along the lines XXXI-XXXI' and XXXI'-XXXI"
Figure 34:
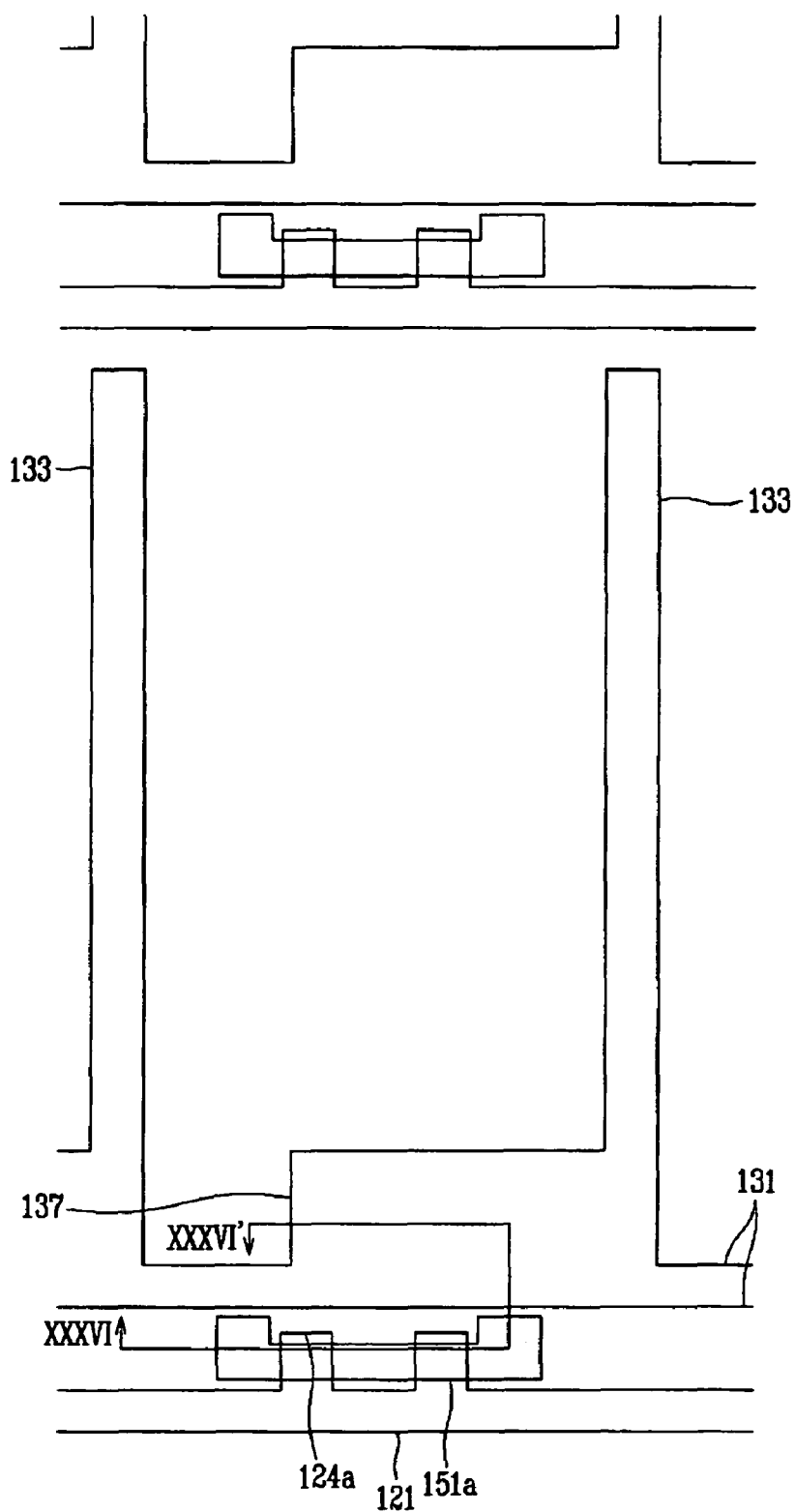
FIGS. 34 and 35 are layout views of the TFT array panel in the step following the step shown in FIGS. 29 and 30.
Figure 35:
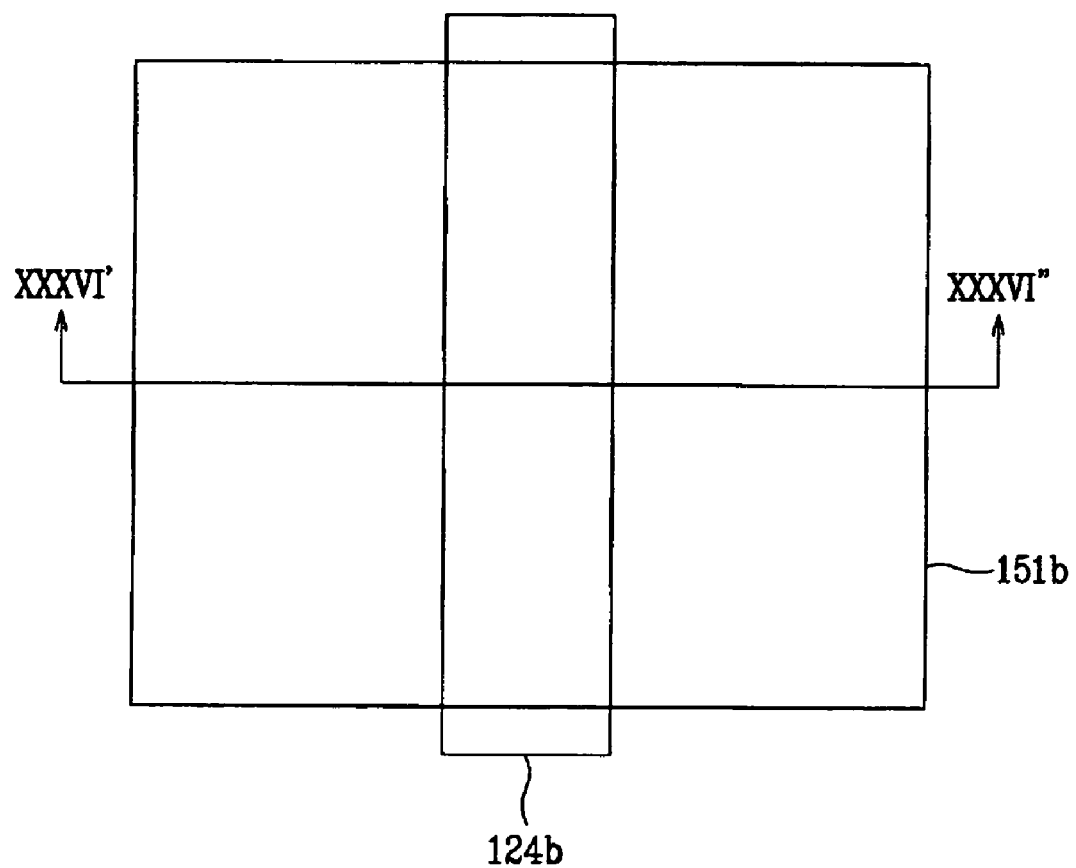
Figure 36:
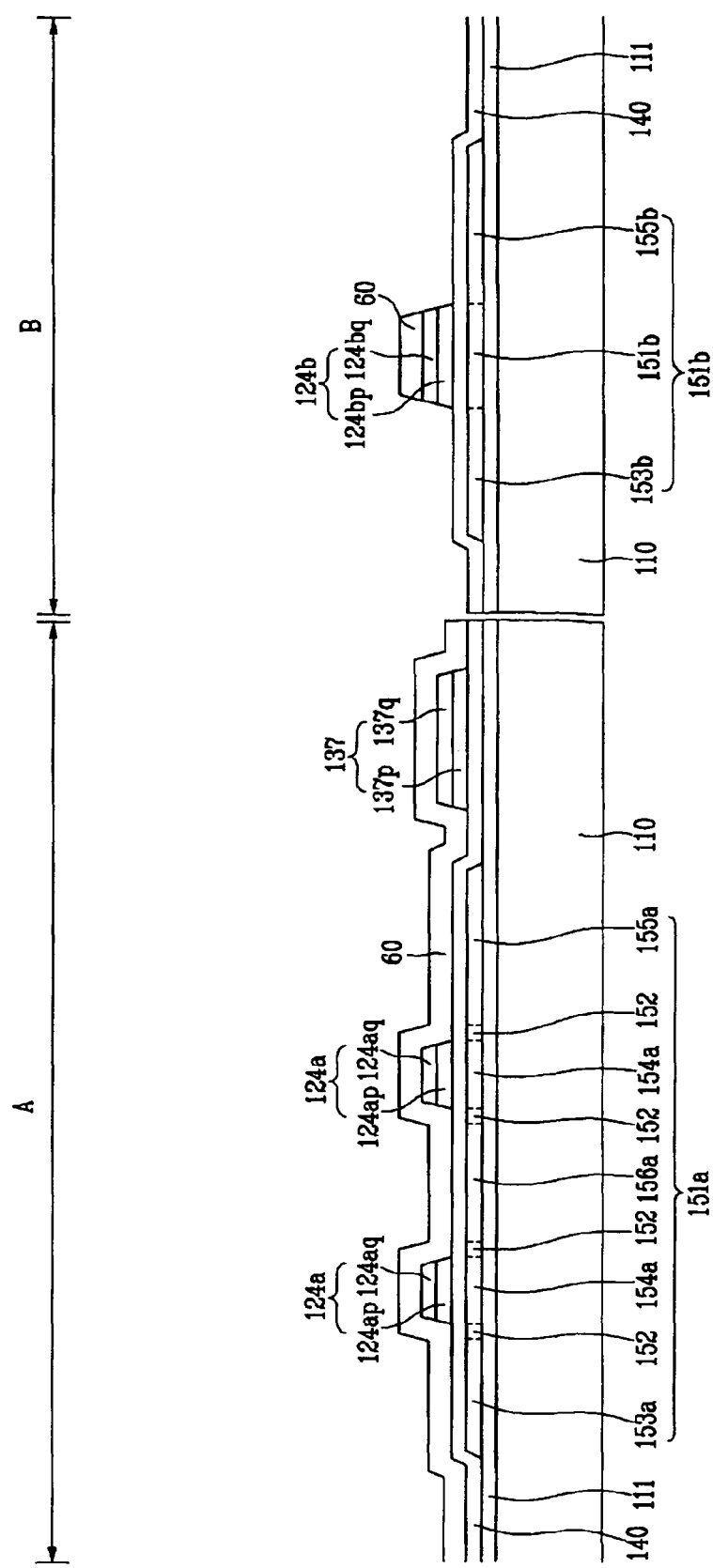
FIG. 36 is a sectional view of the TFT array panel shown in FIGS. 34 and 35 taken along the lines XXXVI-XXXVI' and XXXVI'-XXXVI"
Figure 37:
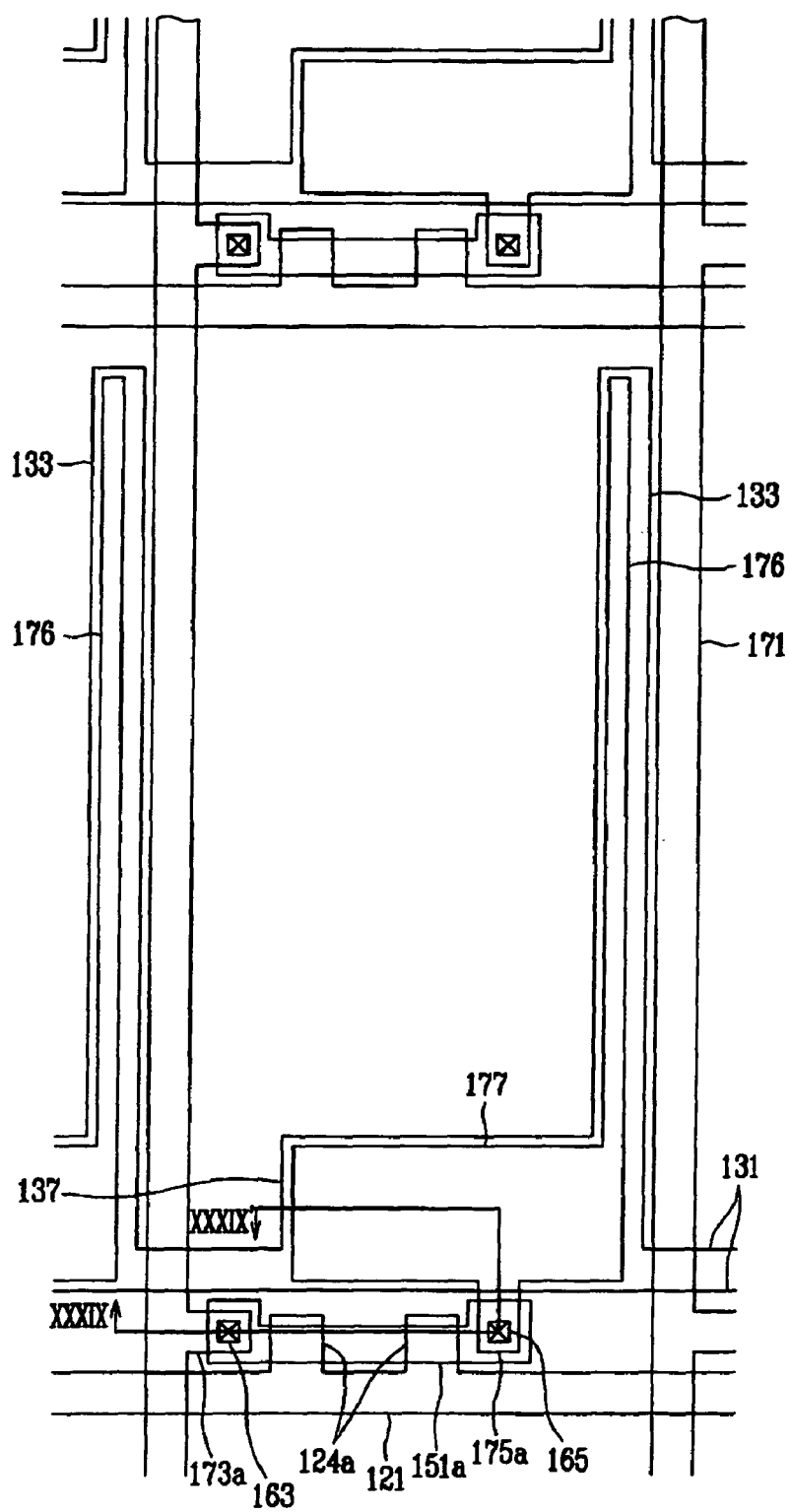
FIGS. 37 and 38 are layout views of the TFT array panel in the step following the step shown in FIGS. 34 and 35.
Figure 38:
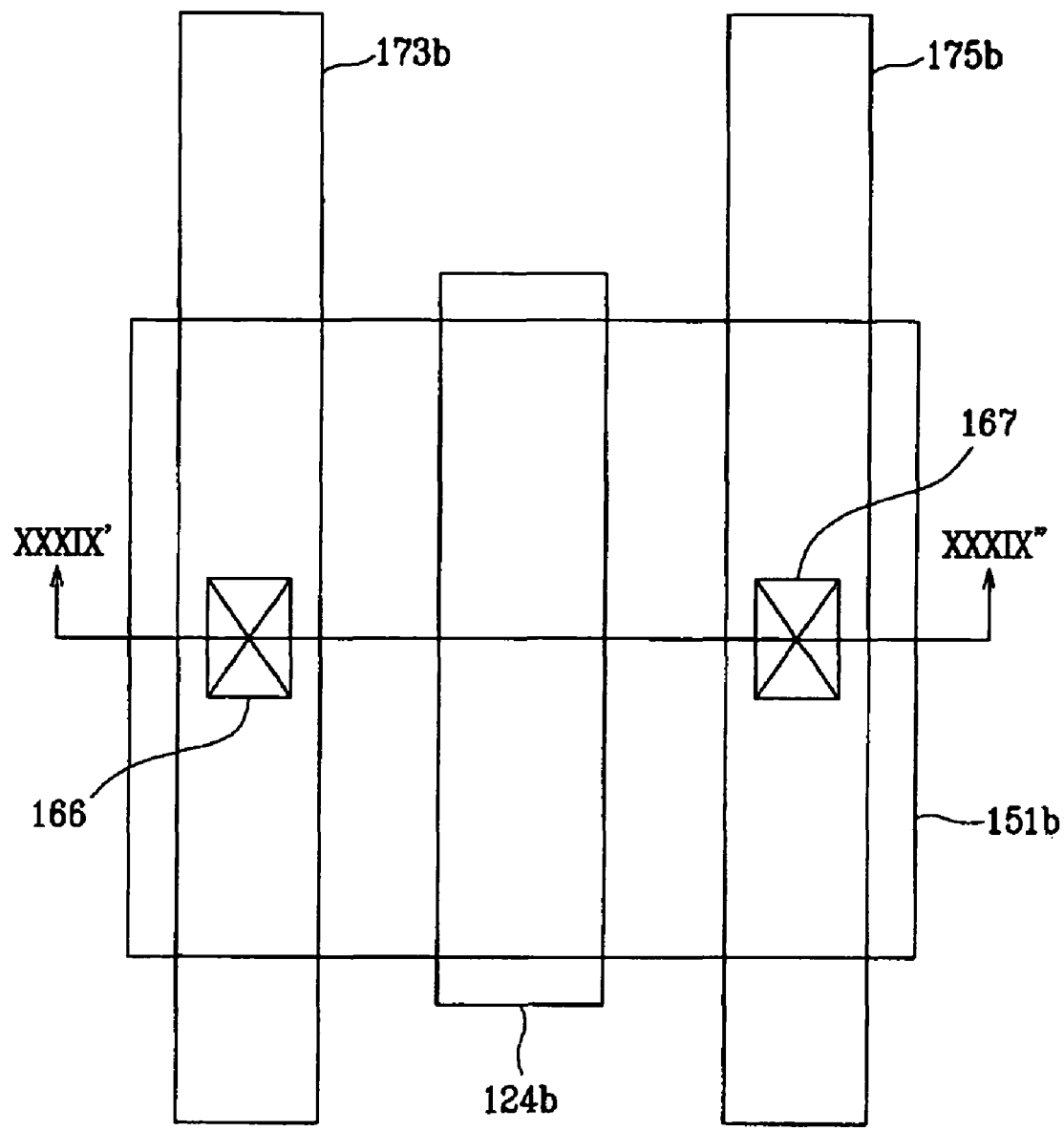
Figure 39:
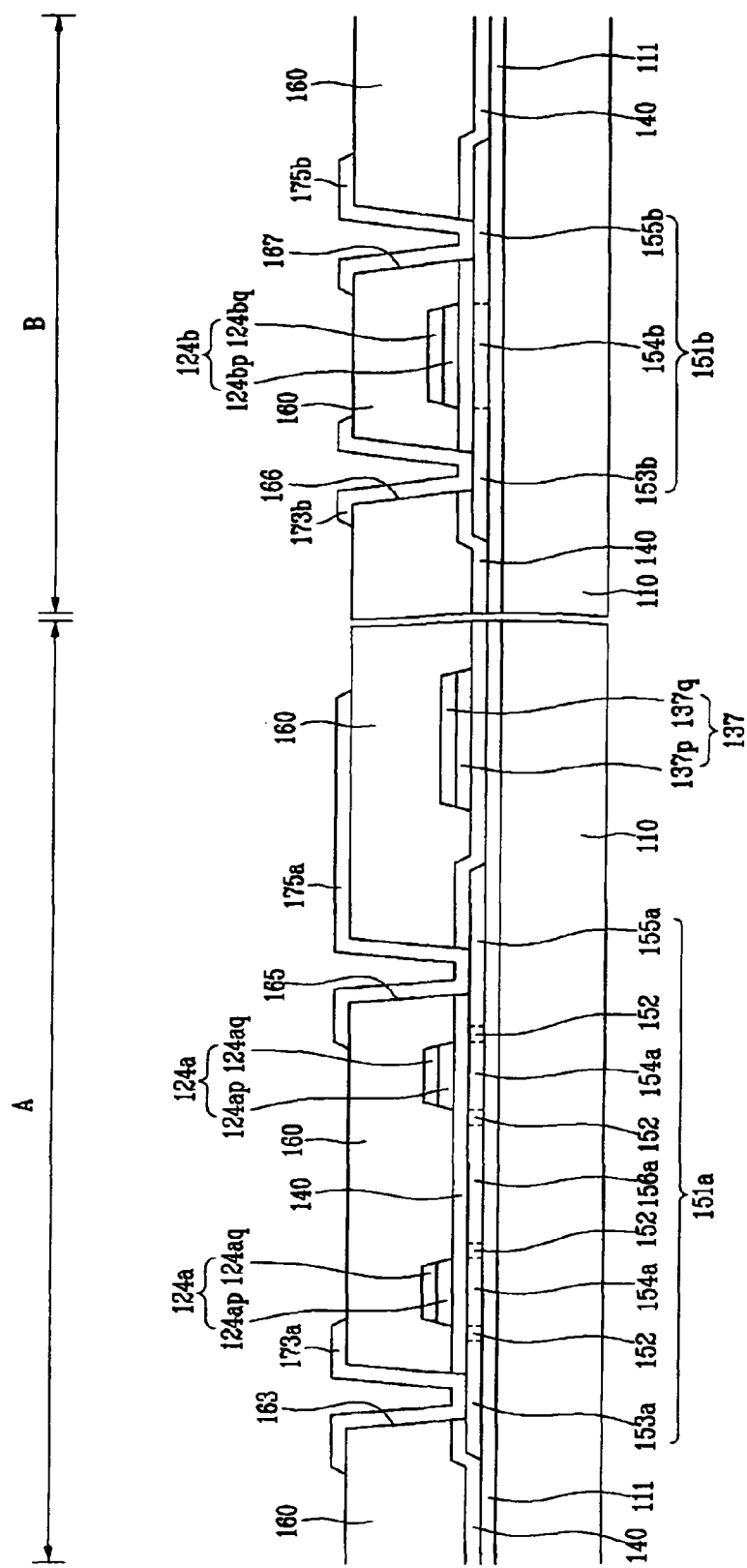
FIG. 39 is a sectional view of the TFT array panel shown in FIGS. 37 and 38 taken along the lines XXXIX-XXXIX' and XXXIX'-XXXIX"
Figure 40:
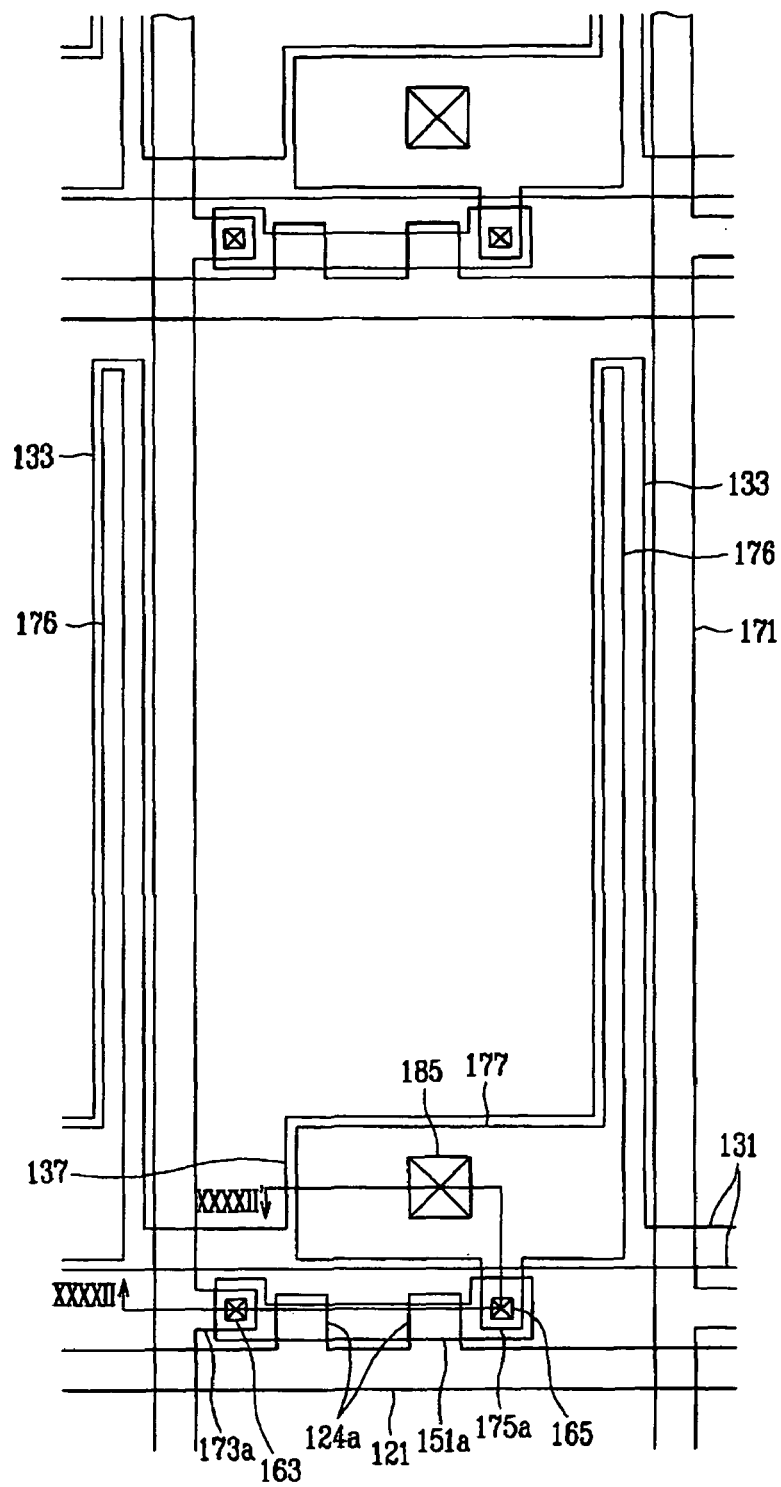
FIGS. 40 and 41 are layout views of the TFT array panel in the step following the step shown in FIGS. 37 and 38.
Figure 41:
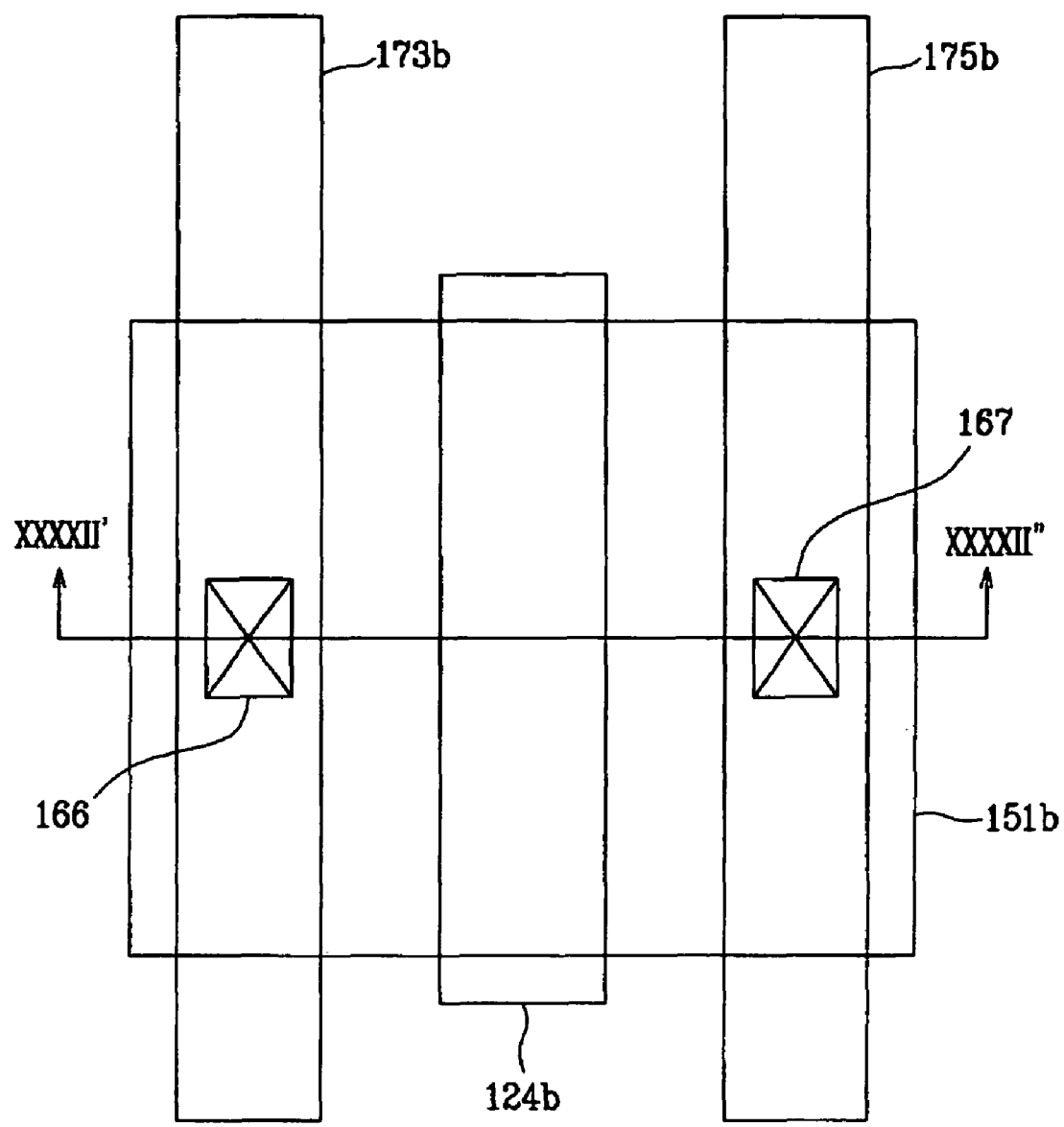
Figure 42:
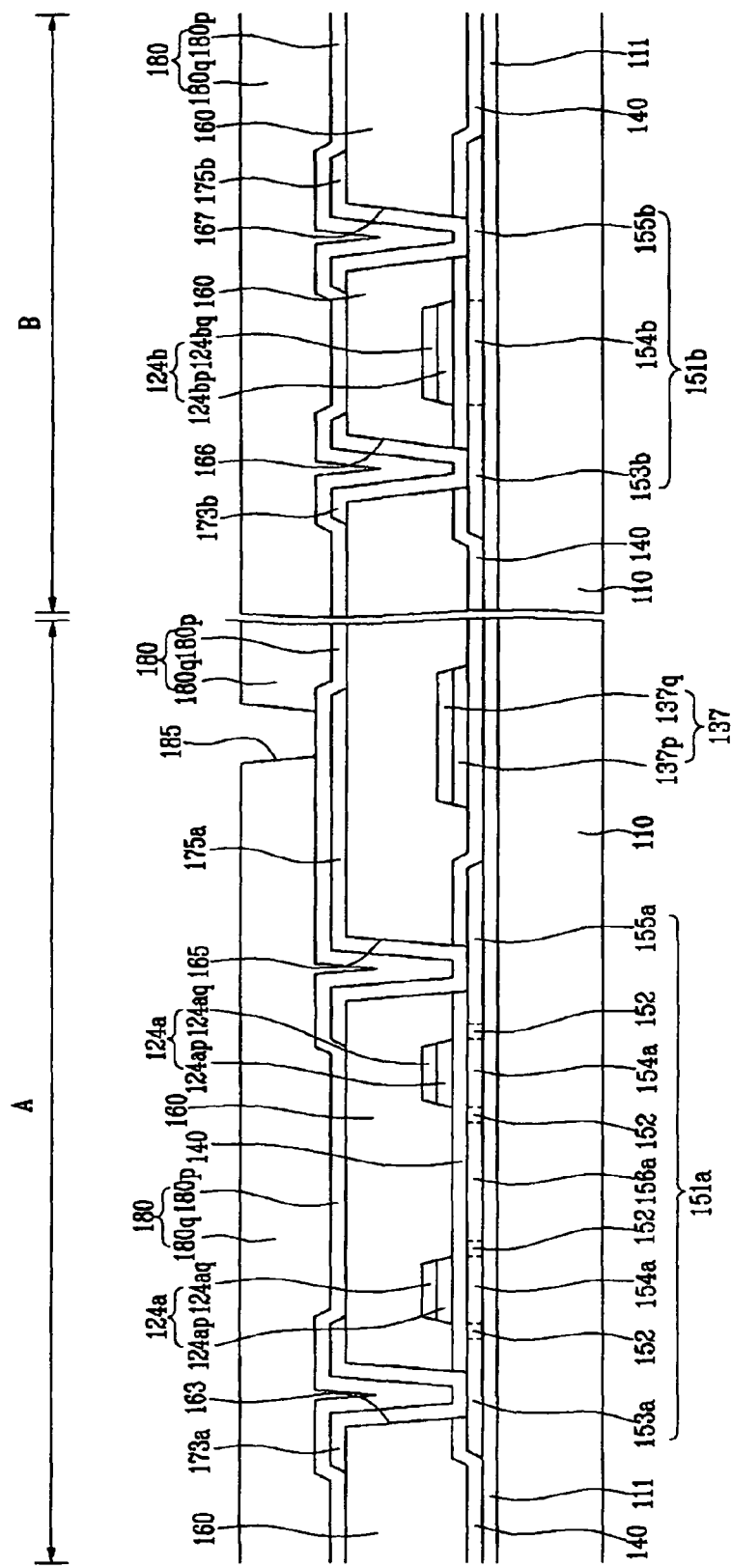
FIG. 42 is a sectional view of the TFT array panel shown in FIGS. 40 and 41 taken along the lines XLII-XLII' and XLII'-XLII"

FIGS. 26 and 27 are layout views of the TFT array panel shown in FIGS. 22 to 25 in the first step of a manufacturing method thereof according to an embodiment of the present invention. FIG. 28 is a sectional view of the TFT array panel shown in FIGS. 26 and 27 taken along the lines XXVIII-XXVIII' and XXVIII'-XXVIII". FIGS. 29 and 30 are layout views of the TFT array panel in the step following the step shown in FIGS. 26 and 27. FIG. 31 is a sectional view of the TFT array panel shown in FIGS. 29 and 30 taken along the lines XXXI-XXXI' and XXXI'-XXXI". FIG. 32 is a sectional view of the TFT array panel in the step following the step shown in FIG. 31 taken along the lines XXXI-XXXI' and XXXI'-XXXI". FIG. 33 is a sectional view of the TFT array panel in the step following the step shown in FIG. 32 taken along the lines XXXI-XXXI' and XXXI'-XXXI". FIGS. 34 and 35 are layout views of the TFT array panel in the step following the step shown in FIGS. 29 and 30. FIG. 36 is a sectional view of the TFT array panel shown in FIGS. 34 and 35 taken along the lines XXXVI-XXXVI' and XXXVI'-XXXVI". FIGS. 37 and 38 are layout views of the TFT array panel in the step following the step shown in FIGS. 34 and 35. FIG. 39 is a sectional view of the TFT array panel shown in FIGS. 37 and 38 taken along the lines XXXIX-XXXIX' and XXXIX'-XXXIX". FIGS. 40 and 41 are layout views of the TFT array panel in the step following the step shown in FIGS. 37 and 38. FIG. 42 is a sectional view of the TFT array panel shown in FIGS. 40 and 41 taken along the lines XLII-XLII' and XLII'-XLII".

Referring to FIGS. 26 to 28, a blocking film 111 is formed on an insulating substrate 110, and a plurality of semiconductor islands 151a and 151b corresponding to a plurality of pixel regions and driver region, respectively, are formed thereon.

Referring to FIGS. 29 to 31, a gate insulating layer 140 preferably comprising silicon oxide or silicon nitride is deposited. Next, an amorphous silicon layer and a metal layer comprising a material including aluminum or molybdenum are deposited sequentially on the gate insulating layer 140.

Here, the sheet resistance of the amorphous silicon layer may be greater than $10^9 \Omega$/square. The amorphous silicon layer may be heavily doped with N-type impurities such as phosphorus (P).

Thereafter, a thermal treatment process is executed in the range of 200 to 300° C. This process causes the Al or Mo particles in the metal layer to diffuse into the inner portion of the amorphous silicon layer, such that the adhesion between the metal layer and the amorphous silicon layer may be improved and the contact resistance therebetween may be reduced. Furthermore, the sheet resistance of the amorphous silicon is reduced by a factor of about 10 4 through the thermal treatment process, and the distribution of the sheet resistance contacting the amorphous silicon and the metal layer may be made more uniform. Next, a photoresist 50 is formed on the metal layer.

Next, a metal layer is patterned by wet-etching using the photoresist 50 as an etch mask to form an upper film of a plurality of gate lines 121 including a plurality of gate electrodes 124a, and a plurality of storage lines 131 including a plurality of expansions 137. At this time, an upper film 120bq in the driver region remains. In FIG. 31, the upper films of the gate electrodes 124a and the expansions 137 of the storage electrode lines 131 are indicated by reference numerals 124aq and 137q, respectively.

At this time, the metal layer is over-etched. The over-etching causes the edges of the gate lines 121 and the storage electrode lines 131 to recede from edges of the photoresist 50.

Next, the amorphous silicon layer is etched using the photoresist 50 as an etch mask to form a preliminary lower film, and a lower film 120bp of the driver region remains. In FIG. 31, the preliminary lower film of the gate electrodes 124a and the expansions 137 are indicated by reference numerals 128 and 134. The width of the preliminary lower films of the gate lines 121 and the storage electrode lines 131 is wider than that of the upper films 124aq and 137q, respectively.

Next, as shown in FIG. 32, the photoresist 50 is removed, and high-concentration N-type impurities are introduced into the semiconductor islands 151a and 151b by PECVD or plasma emulsion such that regions of the semiconductor islands 151a and 151b disposed under the upper and the preliminary films are not doped, regions of the semiconductor islands 151a and 151b disposed under only the preliminary lower films are lightly doped, and remaining regions of the semiconductor islands 151a and 151b not under either the upper or preliminary films are heavily doped. Thus, heavily doped regions 153a, 155a, and 156a, intrinsic regions 154a, and lightly doped regions 152 are simultaneously formed.

Next, as shown in FIG. 33, the exposed preliminary lower films are dry-etched using the upper films 124aq and 137q of the gate lines 121 and the expansions 137 of the storage electrode lines 131 as an etch mask to form lower films 124ap and 137p of the gate lines 121 and the expansions 137 of the storage electrode lines 131, respectively. At this time, the widths of the upper films 124aq and 137q and the lower films 124ap and 137p may be different, and various inclined structures may be formed according to the widths of the upper films 124aq and 137q and the lower films 124ap and 137p.

Finally, a plurality of gate lines 121 including a plurality of gate electrodes 124a, and a plurality of storage electrode lines 131 including a plurality of expansions 137 are completed.

Referring to FIGS. 34 to 36, a photoresist 60 is formed, and the upper film 120bq and the lower film 120bp of the driver region are patterned using the photoresist 60 with dry-etch and wet-etch techniques to form a plurality of control electrodes 124b including a lower film 124bp and an upper film 124bq.

Thereafter, high-concentration P-type impurities are implanted into the semiconductor islands 151b by PECVD or plasma emulsion such that source and drain regions 153b and 155b, and channel regions 154b are formed.

Referring to FIGS. 37 to 39, an interlayer insulating layer 160 is deposited and patterned to form a plurality of contact holes 163, 165, 166, and 167 exposing the source regions 153a and 153b, and the drain regions 155a and 155b.

Next, a plurality of data conductors including a plurality of data lines 171 including source electrodes 173a for pixels, a plurality of drain electrodes 175a for pixels, and a plurality of input and output electrodes 173b and 175b for the driver region are formed on the interlayer insulating layer 160.

Referring to FIGS. 40 to 42, a lower passivation layer 180p comprising an inorganic material is deposited and an upper passivation 180q comprising a photosensitive organic material is coated to form a passivation layer 180. Then, the upper passivation layer 180q is exposed using a photo-mask and is developed to expose a portion of the lower passivation layer 180p. The exposed portion of the lower passivation layer 180p and the gate insulating layer 140 below are dry-etched to form a plurality of contact holes 185 exposing the expansions 177 of the drain electrodes 175a.

Referring to FIGS. 22 and 23, a plurality of pixel electrodes 191 are formed on the passivation layer 180.

A TFT array panel for an LCD according to another embodiment of the present invention will be described in detail below with reference to FIGS. 43 to 46.

Figure 43:
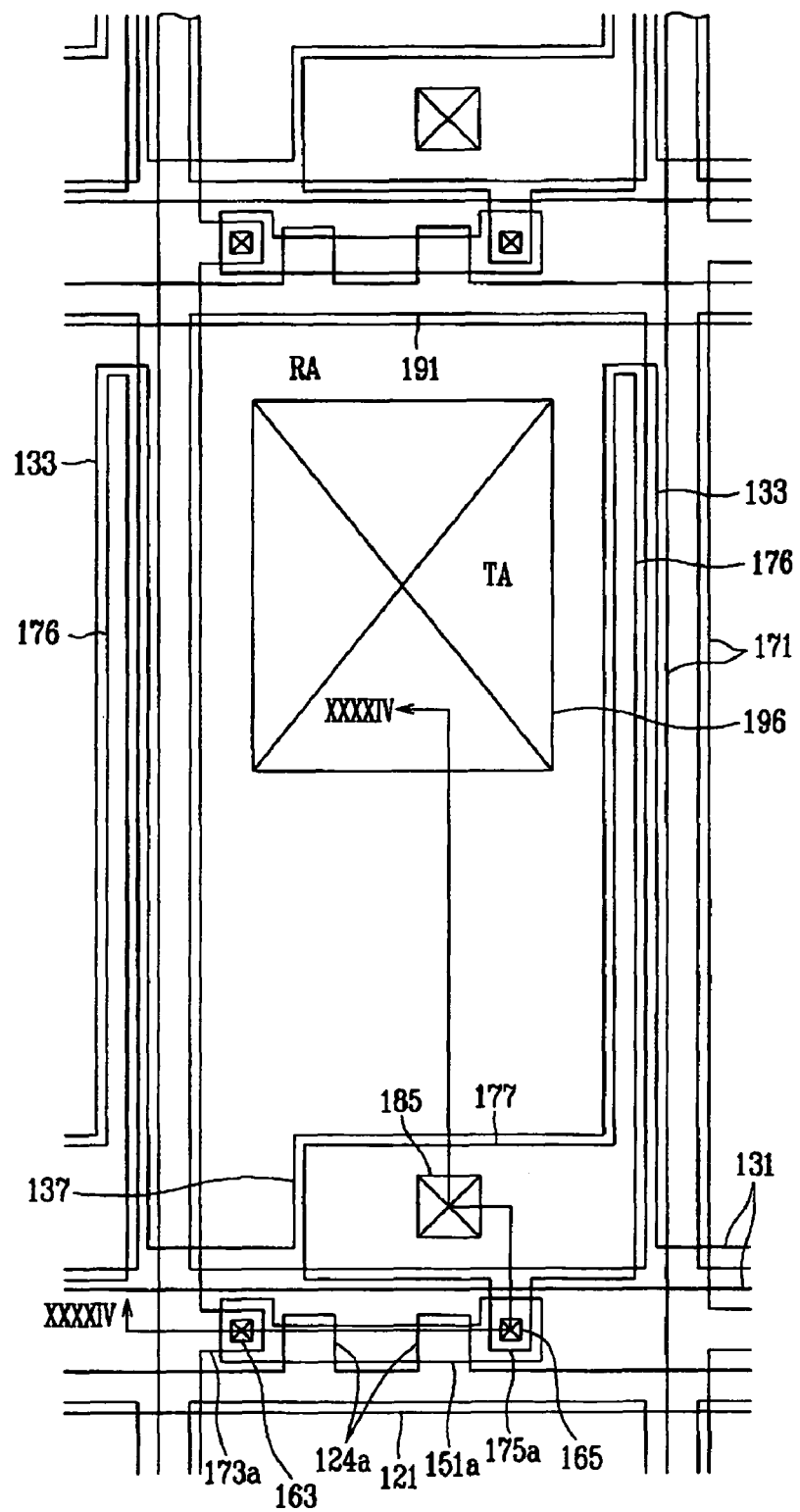
FIGS. 43 and 45 are layout views of the TFT array panel according to another embodiment of the present invention.
Figure 44:
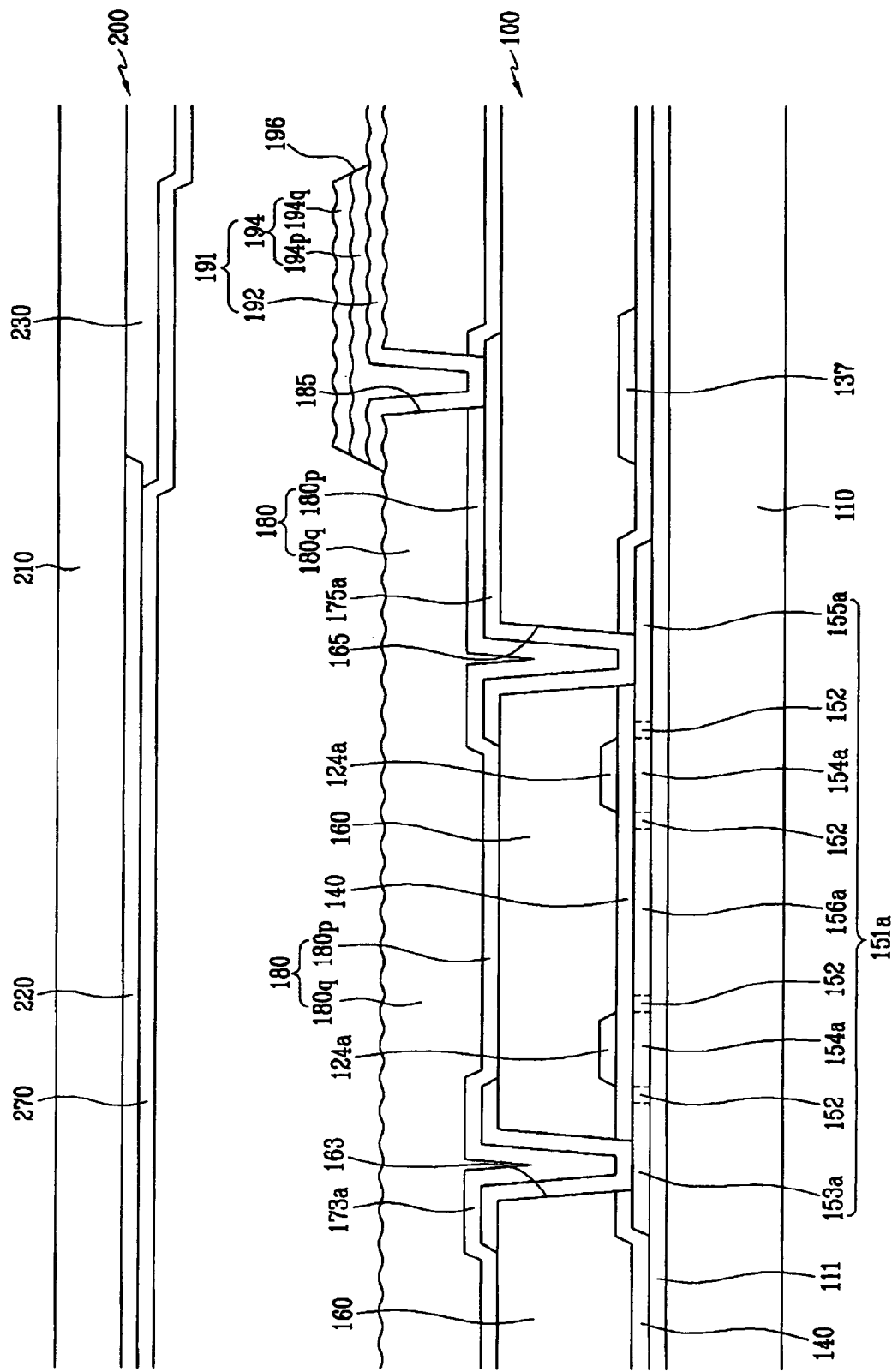
FIGS. 44 and 46 are sectional views of the TFT array panel shown in FIGS. 43 and 45 taken along the lines XXXXIV-XXXXIV and XXXXVI-XXXXVI.
Figure 45:
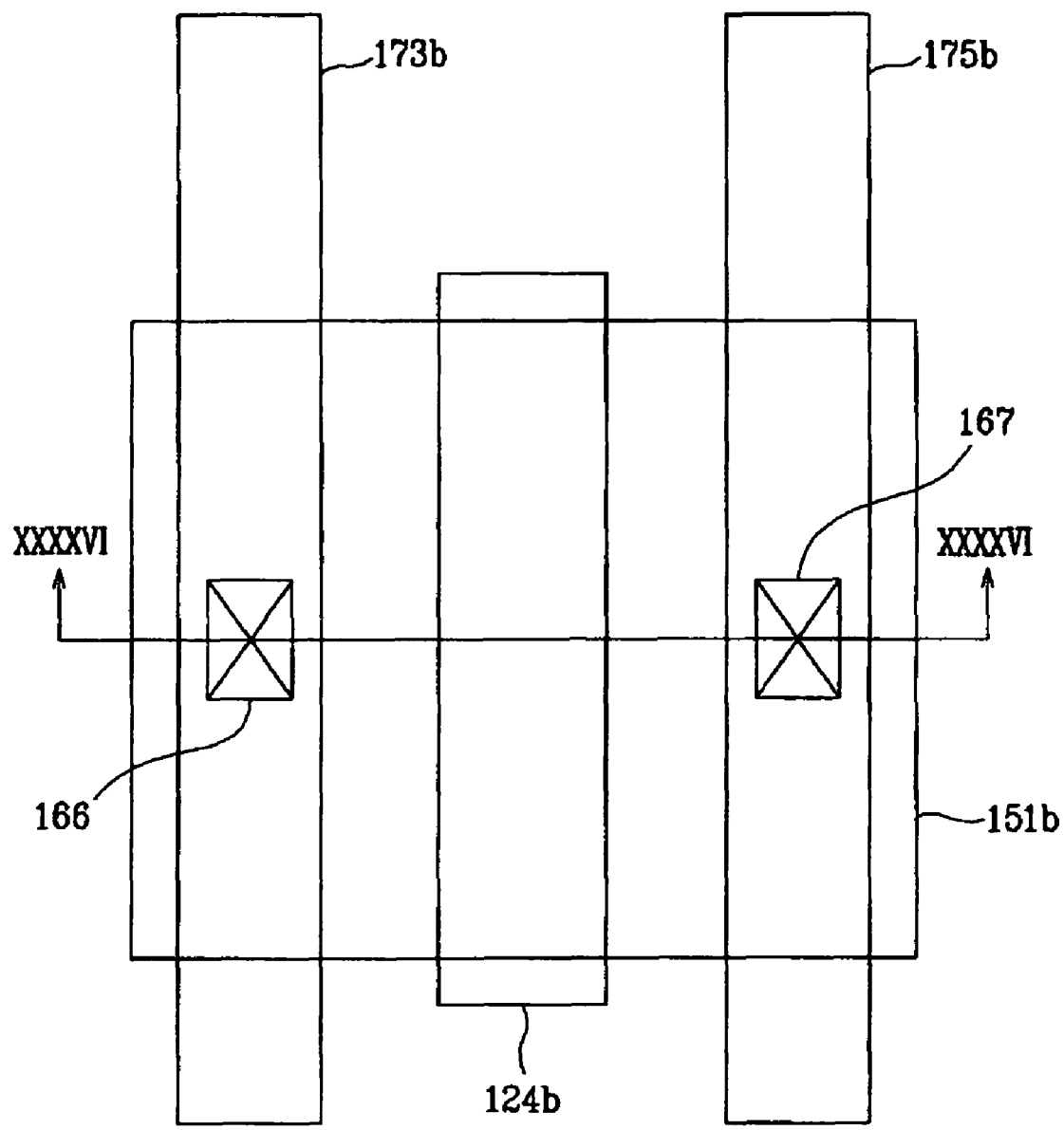
Figure 46:
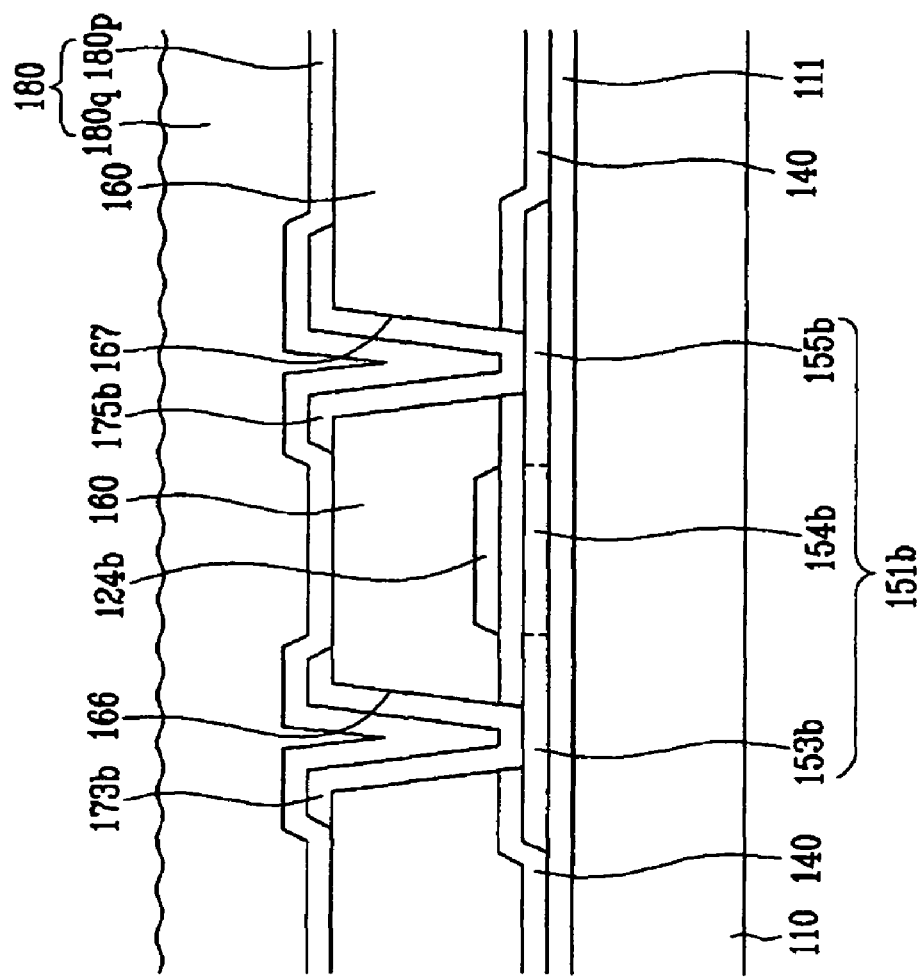

FIGS. 43 and 45 are layout views of the TFT array panel according to another embodiment of the present invention, and FIGS. 44 and 46 are sectional views of the TFT array panel shown in FIGS. 43 and 45 taken along the lines XXXXIV-XXXXIV and XXXXVI-XXXXVI.

Referring to FIGS. 43 to 45, layered structures of the TFT panel 100 according to this embodiment are almost the same as those shown in FIGS. 4 to 7, with the addition of a common electrode panel 200 facing the TFT panel.

A plurality of semiconductor islands 151a and 151b are formed on an insulating substrate 110. A gate insulating layer 140 is formed on the semiconductor islands 151a and 151b. A plurality of gate conductors including a plurality of gate lines 121 having a plurality of gate electrodes 124a and a plurality of control electrodes 124b, and a plurality of storage electrode lines 131 are formed on the gate insulating layer 140.

An interlayer insulating layer 160 is formed on the gate conductors 121, 124a, and 124b, and on the storage electrode lines 131. A plurality of contact holes 163, 165, 166, and 167 are formed through the interlayer insulating layer 160 and the gate insulating layer 140. A plurality of data conductors including a plurality of data lines 171, a plurality of drain electrodes 175a for connection with the pixel electrodes 191, and a plurality of input and output electrodes 173b and 175b for the driver region are formed on the interlayer insulating layer 160.

A passivation layer 180 is formed on the data conductors 171, 175a, 173b, and 175b and the interlayer insulating layer 160. A plurality of pixel electrodes 191 are formed on the passivation layer 180.

One difference between the LCD shown in FIGS. 4 to 7 and the LCD shown in FIGS. 43 to 45 is that the surface of the passivation layer 180 is uneven. In addition, the pixel electrodes 191 respectively include a transparent electrode 192, and a reflective electrode 194 which is formed on the transparent electrode 192. In this embodiment, the reflective electrode 194 comprises a lower film 194p and an upper film 194q.

The transparent electrodes 194 preferably comprise at least one of a transparent conductor such as ITO or IZO. The lower films 194p of the reflective electrodes 194 preferably comprise amorphous silicon, and the upper films 194q of the reflective electrodes 194 comprise a metal such as an opaque reflective conductor including Al or Ag. The amorphous silicon may include a conductive impurity.

Particles of Al or Ag of the upper film 194q may diffuse into the lower film 194p of the reflective electrode, such that the resistance of the lower film 194p and the contact resistance between the upper film 194q and the lower film 194p may be reduced.

In addition, the lower film 194p may prevent a reaction between the upper film 194q and the transparent electrode 192. The various films may form inclined sidewall structures.

The uneven surface of the passivation layer 180 causes each pixel electrode 191 formed thereon to be uneven as well. The reflective electrode 194 is located on the upper passivation layer 180q and includes a window 196 exposing a portion of the transparent electrode 192.

The liquid crystal display according to this embodiment has a transmissive area TA and a reflective area RA, which are respectively defined by the transparent electrode 192 and the reflective electrode 194. In other words, the transparent areas TA include the transmitting window 196 and include regions above and below the exposed portion of the transparent electrode 192. In addition, the reflective area RA includes the regions corresponding to the reflective electrode 194. Here, the transmissive area TA is primarily used for displaying images utilizing light from the back side of the TFT panel 100, while the reflective area RA is primarily used for displaying images utilizing light reflected from the reflective electrode 194.

A description of the common electrode panel 200 is provided below with reference to FIG. 44.

A light blocking member 220 called a black matrix for preventing light leakage is formed on an insulating substrate 210 such as transparent glass. The light blocking member 220 may include a plurality of openings that face the pixel electrodes 191. These openings may have substantially the same shape as the pixel electrodes 191.

A plurality of color filters 230 are formed on the substrate 210, and are disposed substantially in the openings enclosed by the light blocking member 220. The color filters 230 may extend substantially along the longitudinal direction along the pixel electrodes 191. The color filters 230 may represent one of the primary colors such as red, green, and blue.

In the LCD according to this embodiment, the thickness of the color filter 230 of the transmissive area TA may be thicker than that of the reflective area RA. The differing thicknesses are used to equalize the color reproduction properties of the two areas TA and RA due to the different amounts of light passing through the color filter 230 from the two areas TA and RA. Alternatively, the color filter 230 in the two areas TA and RA may have the same thickness, in which case, the color filter 230 of the reflective area RA may have an opening to equalize the color reproduction properties for the two areas TA and RA.

A common electrode 270 preferably comprising a transparent conductive material such as ITO and IZO is formed on the color filter 230 and the blocking member 220.

A method of manufacturing the TFT array panel shown in FIGS. 43 to 46 according to another embodiment of the present invention will be described in detail below with reference to FIGS. 47 to 60 as well as FIGS. 43 to 46.

Figure 47:
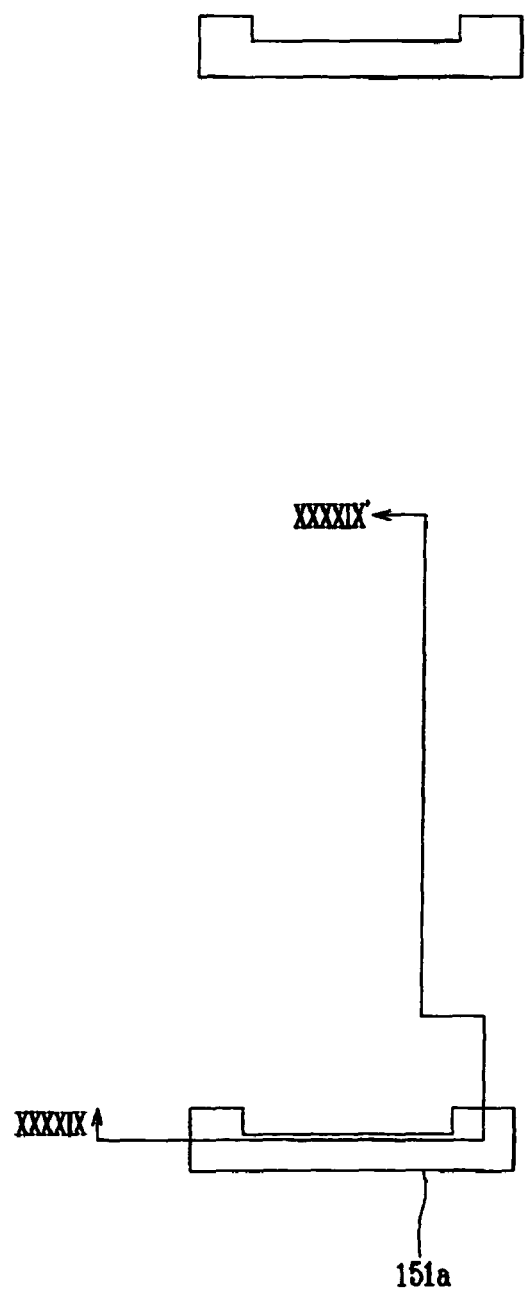
FIGS. 47 and 48 are layout views of the TFT array panel shown in FIGS. 43 to 46 in the first step of a manufacturing method thereof according to an embodiment of the present invention.
Figure 48:
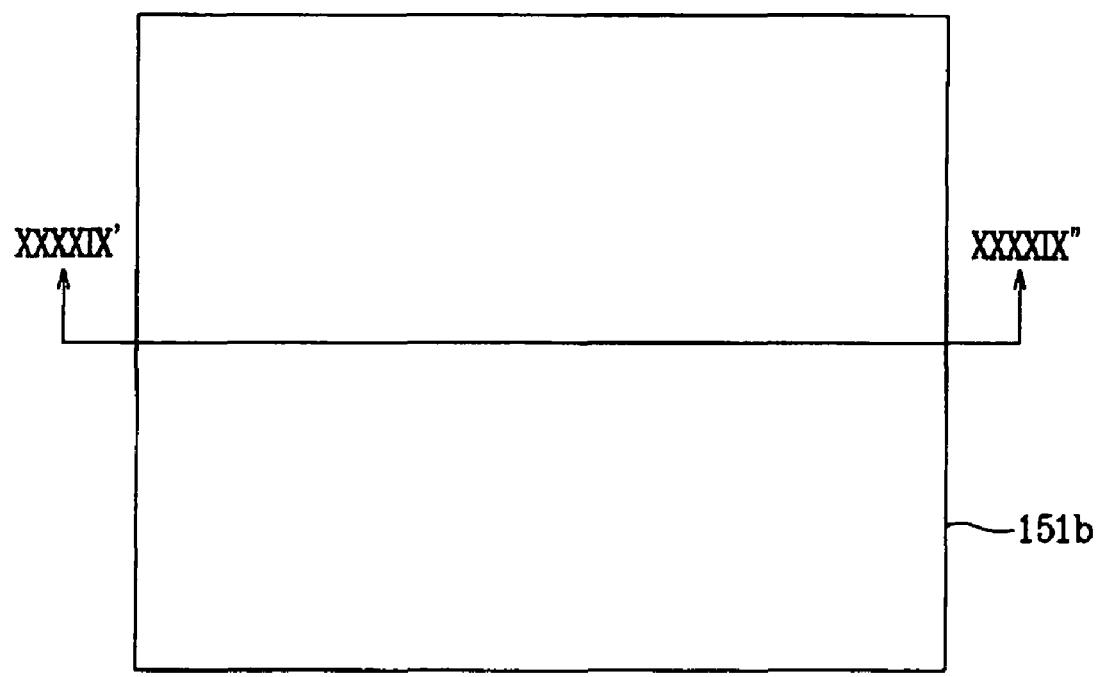
Figure 49:
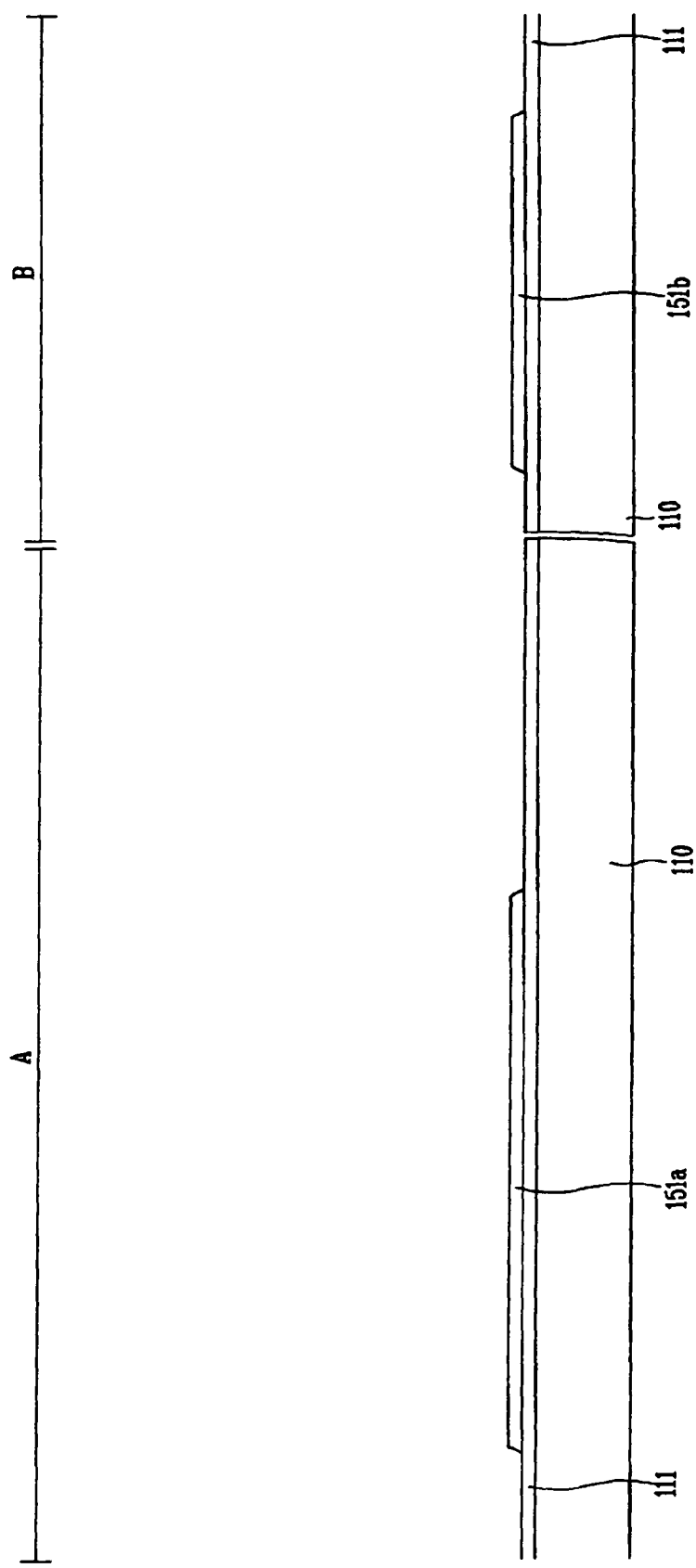
FIG. 49 is a sectional view of the TFT array panel shown in FIGS. 47 and 48 taken along the lines XLIX-XLIX' and XLIX'-XLIX"
Figure 50:
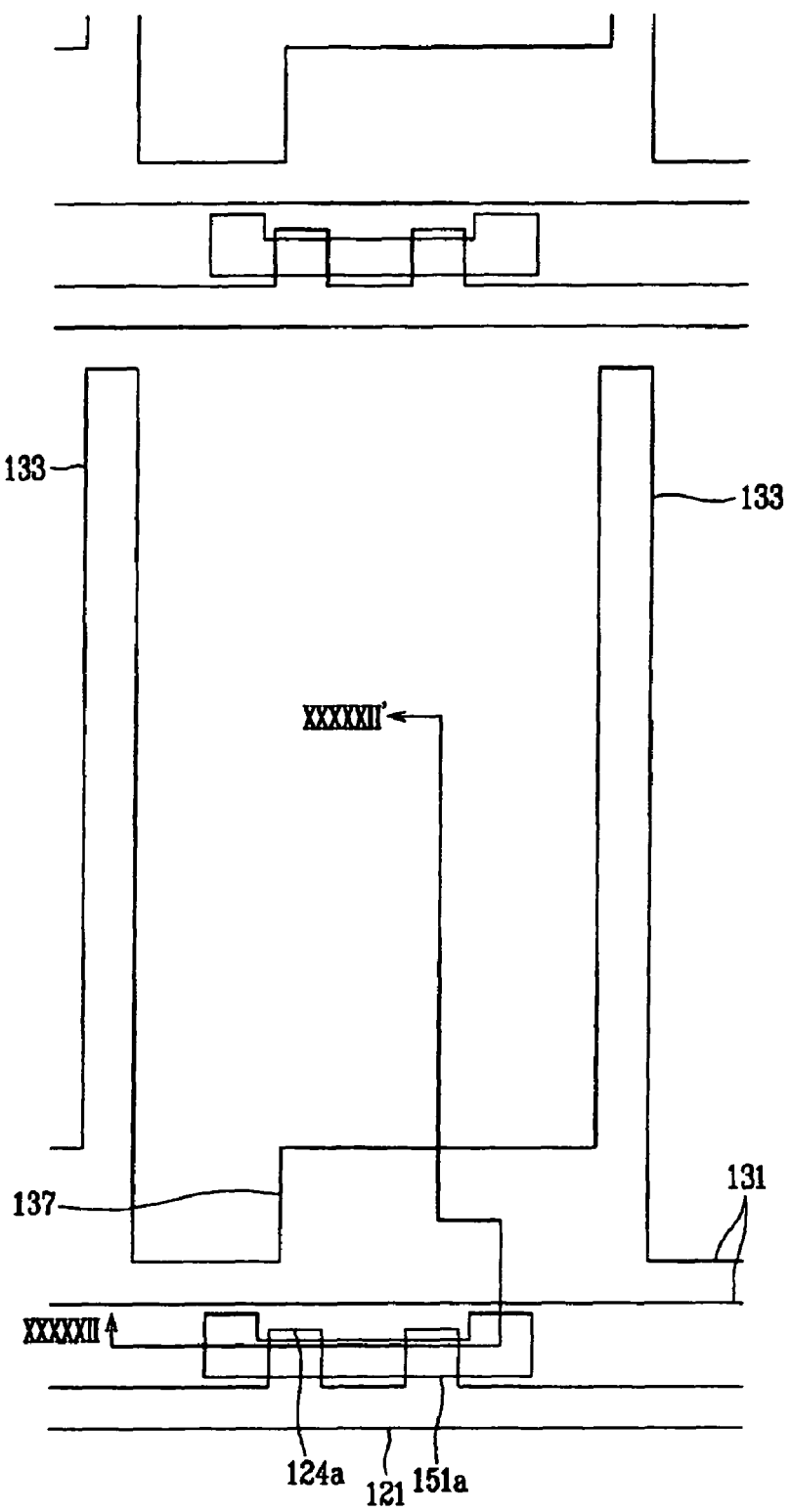
FIGS. 50 and 51 are layout views of the TFT array panel in the step following the step shown in FIGS. 47 and 48.
Figure 51:
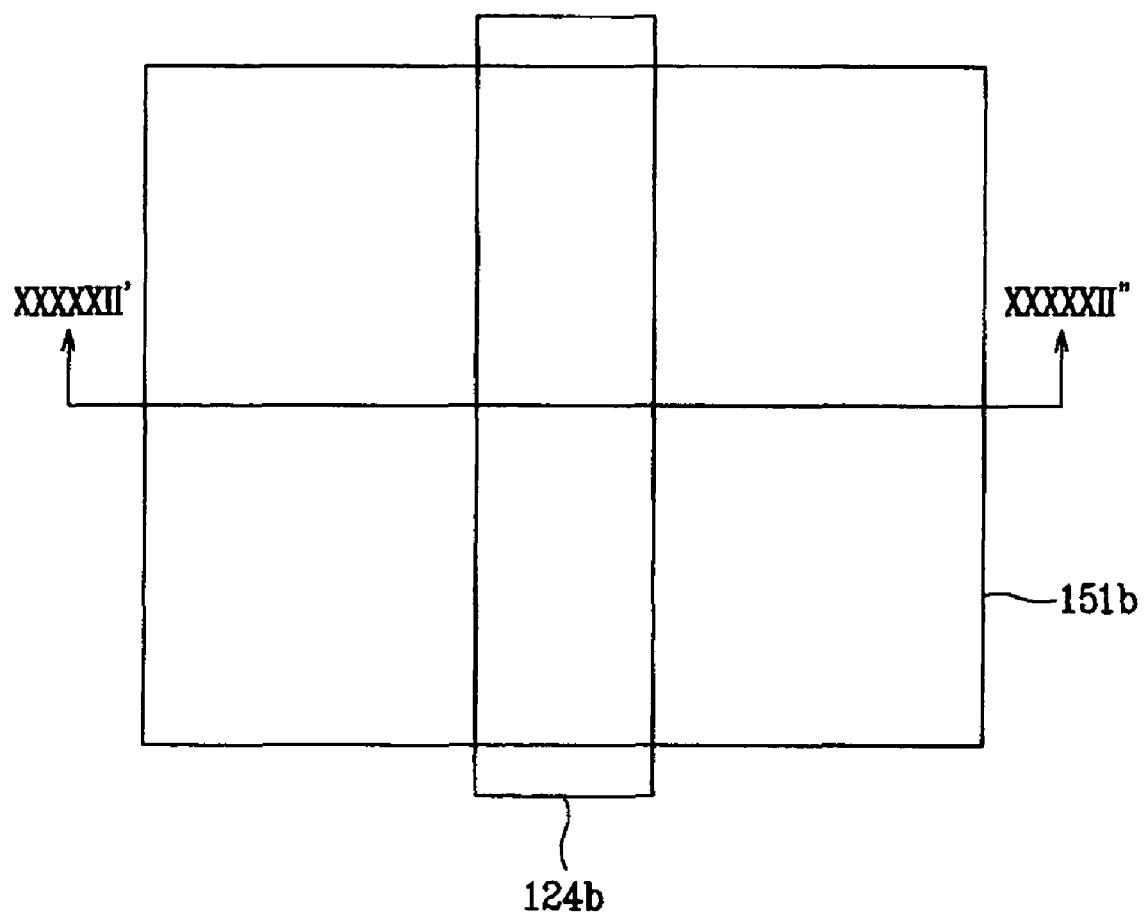
Figure 52:
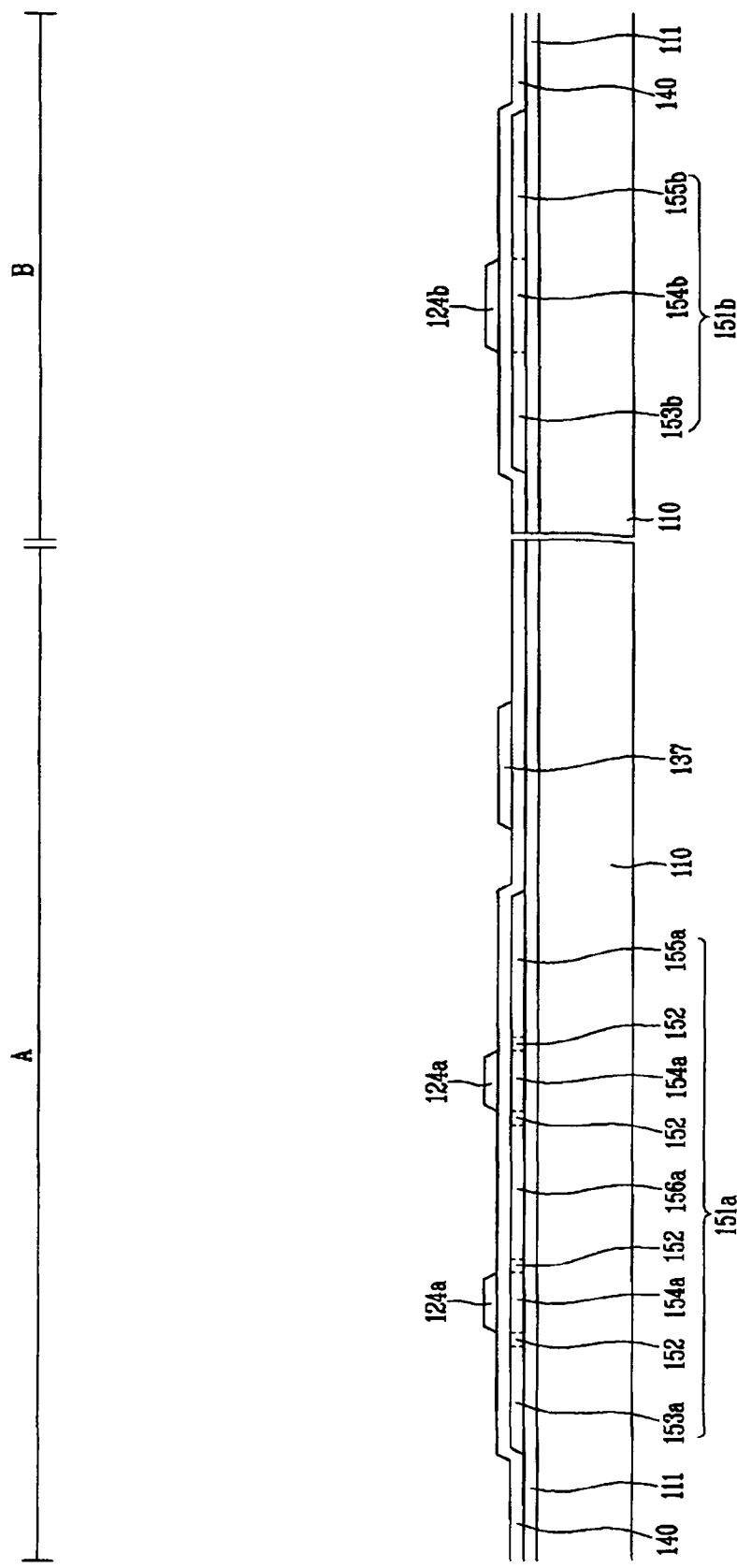
FIG. 52 is a sectional view of the TFT array panel shown in FIGS. 50 and 51 taken along the lines LII-LII' and LII'-LII"
Figure 53:
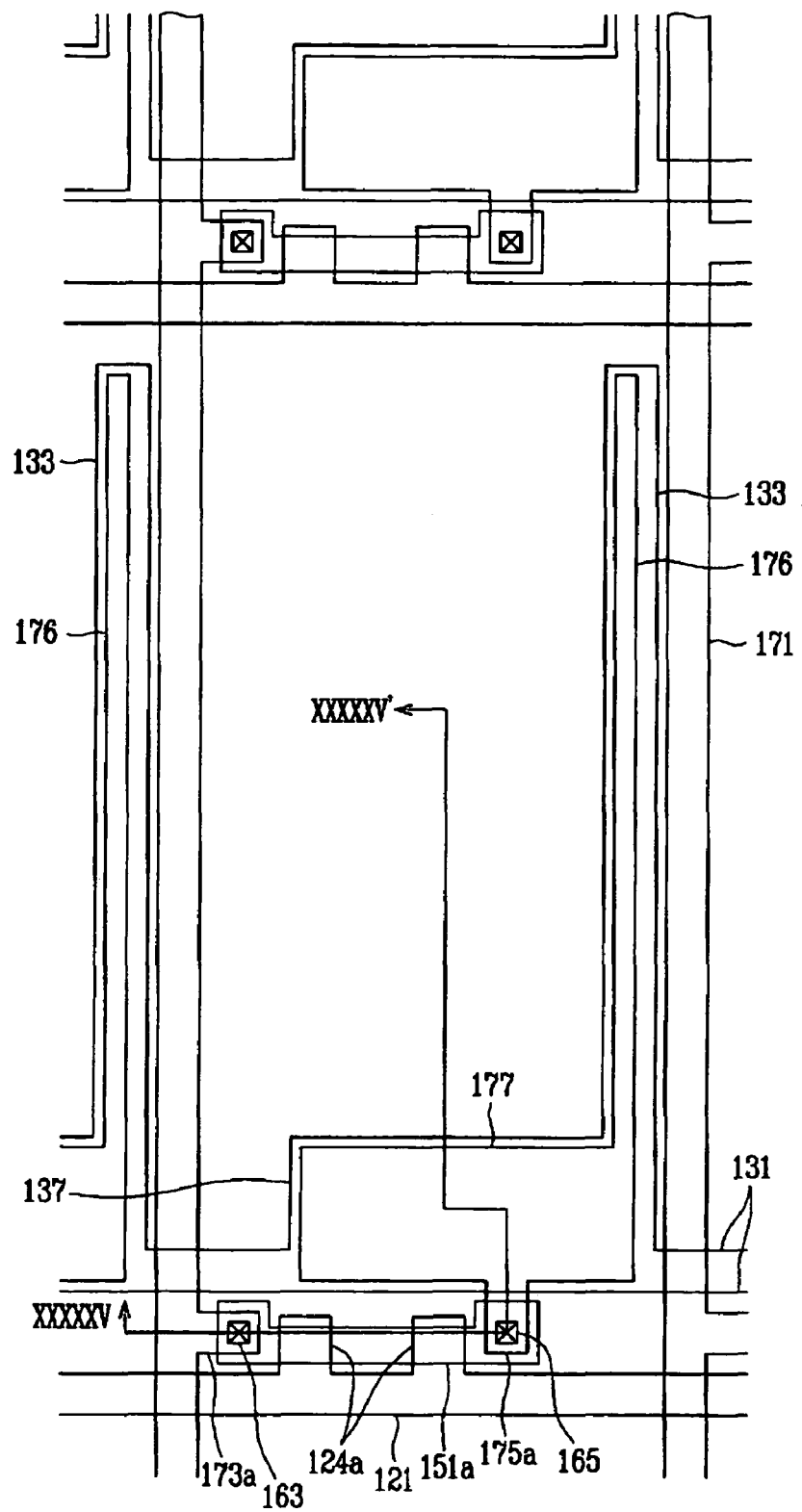
FIGS. 53 and 54 are layout views of the TFT array panel in the step following the step shown in FIGS. 50 and 51.
Figure 54:
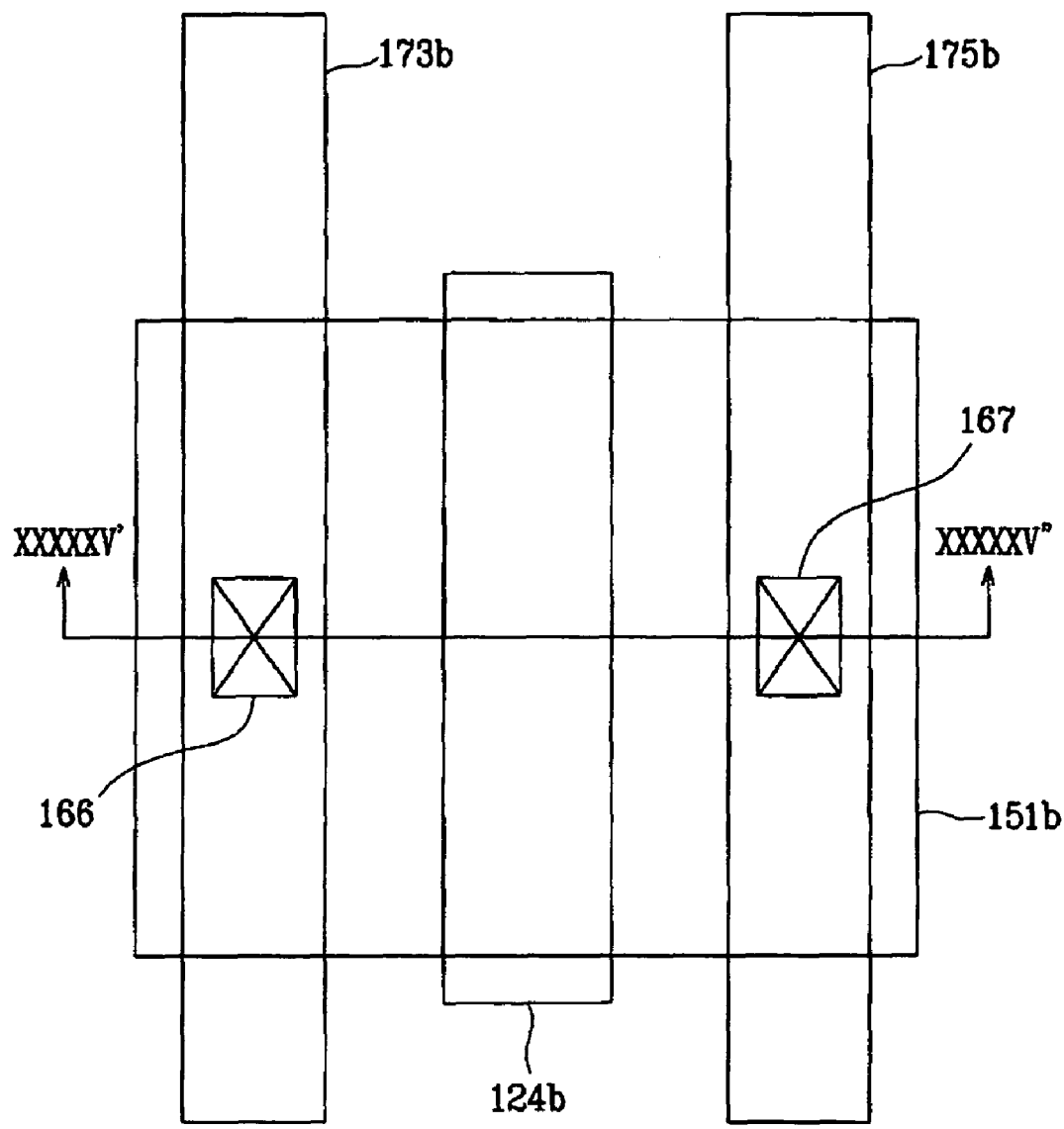
Figure 55:
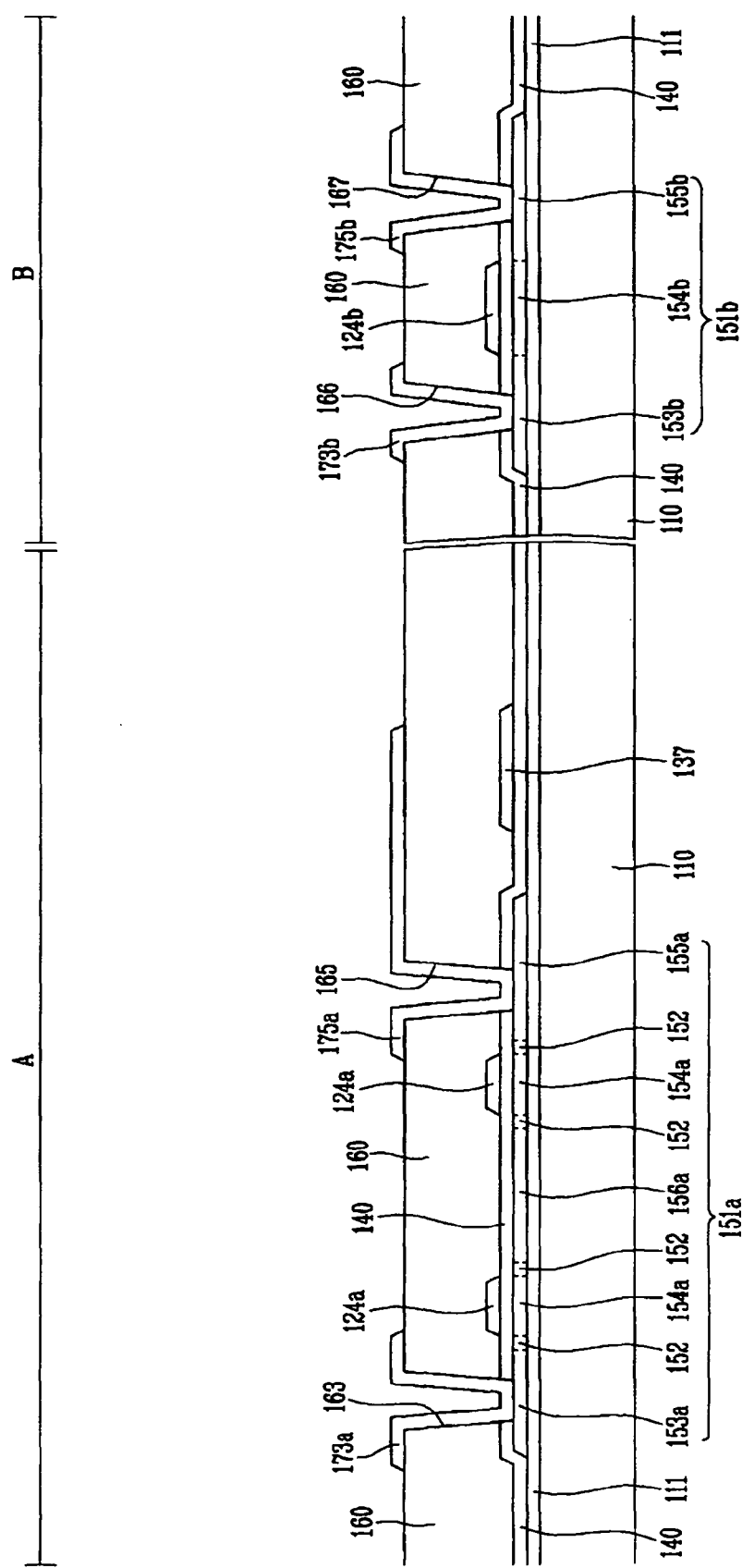
FIG. 55 is a sectional view of the TFT array panel shown in FIGS. 53 and 54 taken along the lines LV-LV' and LV'-LV"
Figure 56:
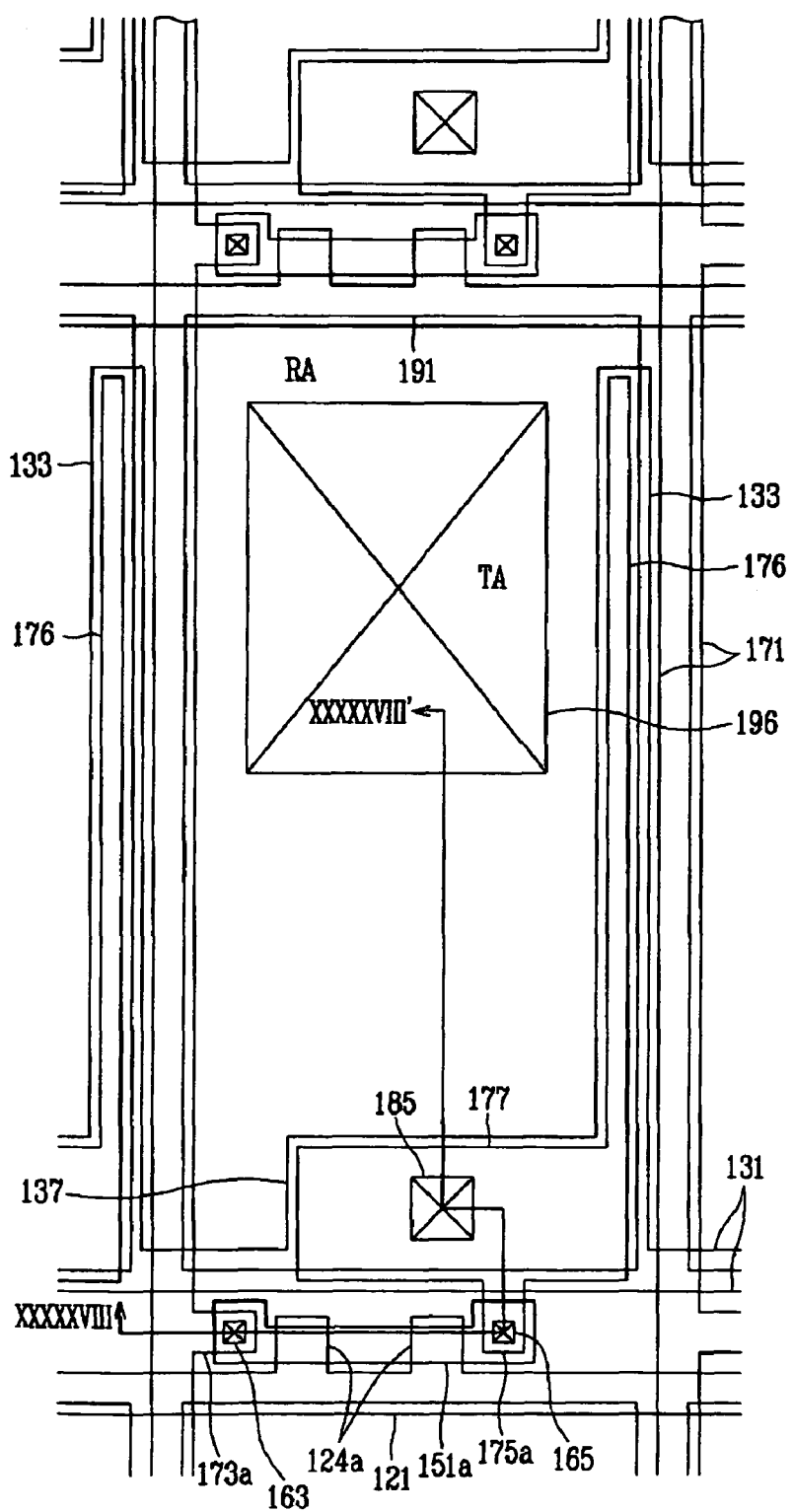
FIGS. 56 and 57 are layout views of the TFT array panel in the step following the step shown in FIGS. 53 and 54.
Figure 57:
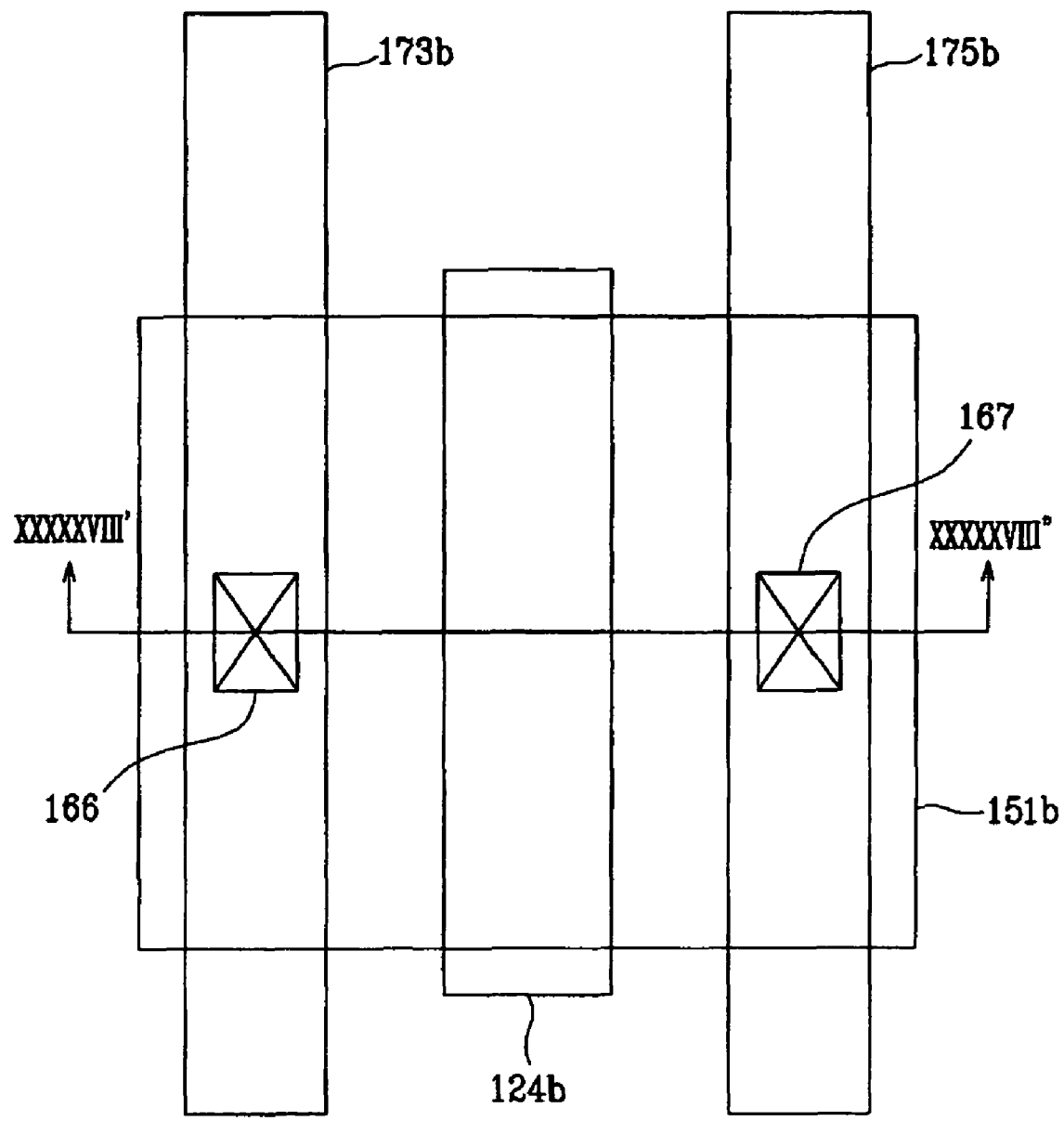
Figure 58:
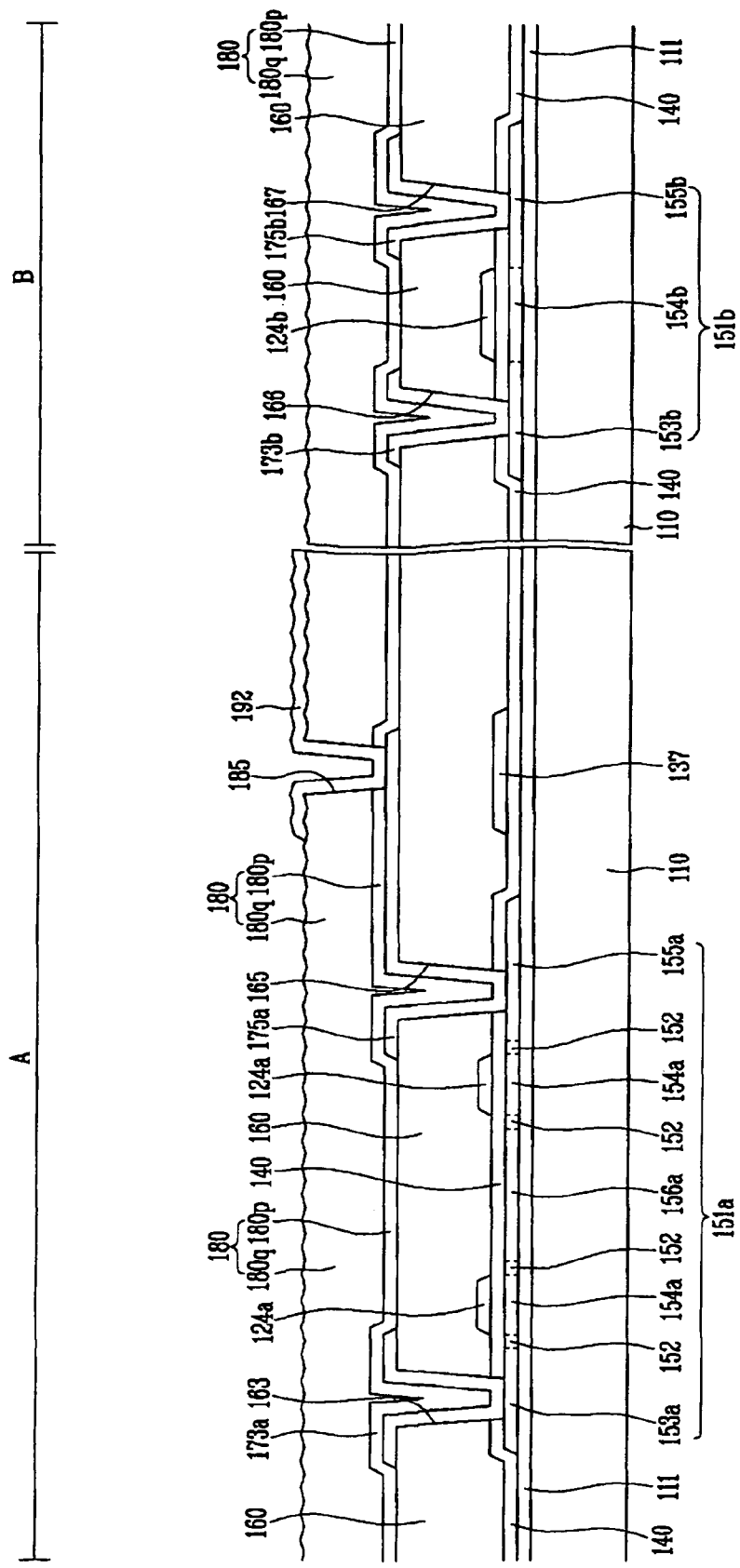
FIG. 58 is a sectional view of the TFT array panel shown in FIGS. 56 and 57 taken along the lines LVIII-LVIII' and LVIII'-LVIII"
Figure 59:
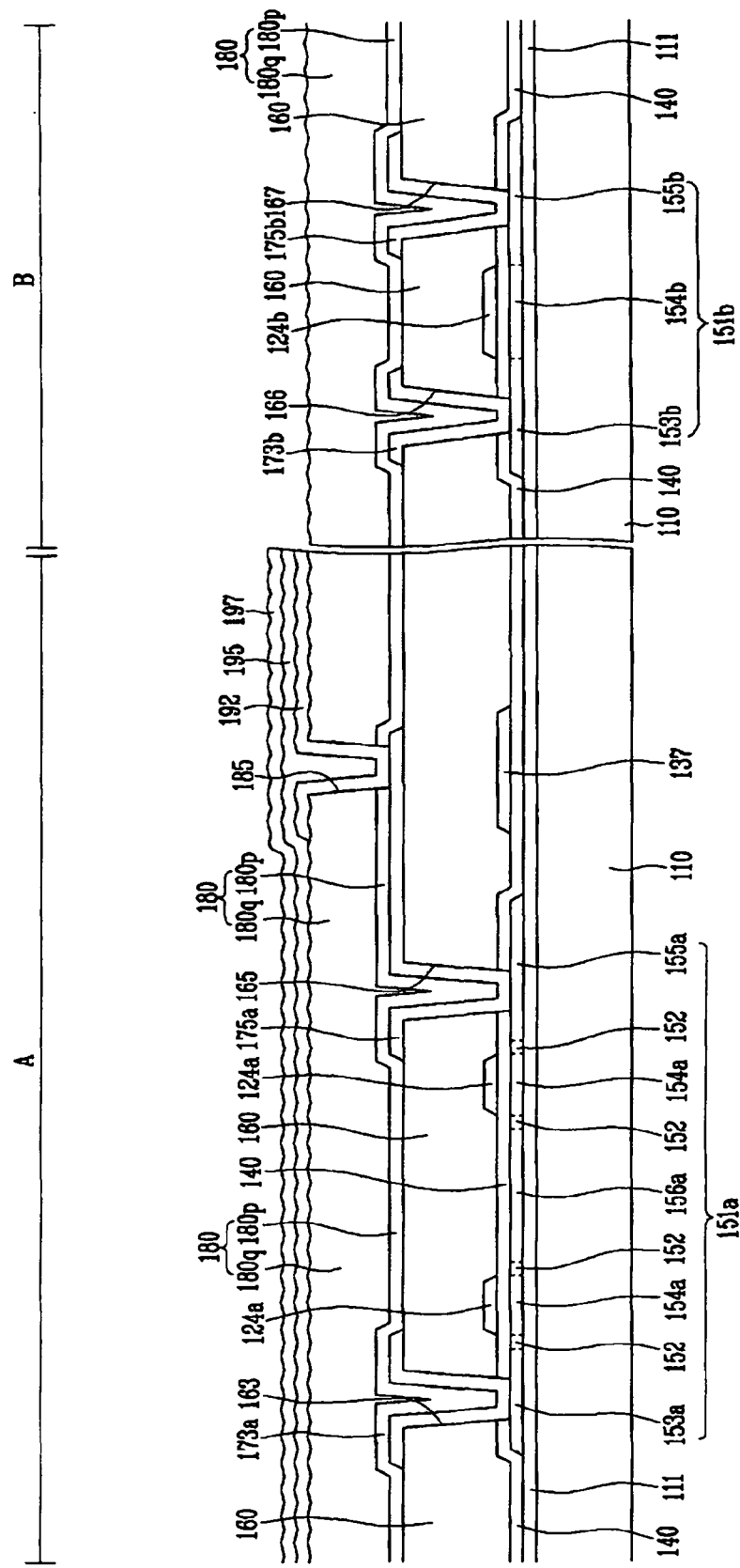
FIG. 59 is a sectional view of the TFT array panel in the step following the step shown in FIG. 58 taken along the lines LVIII-LVIII' and LVIII'-LVIII"
Figure 60:
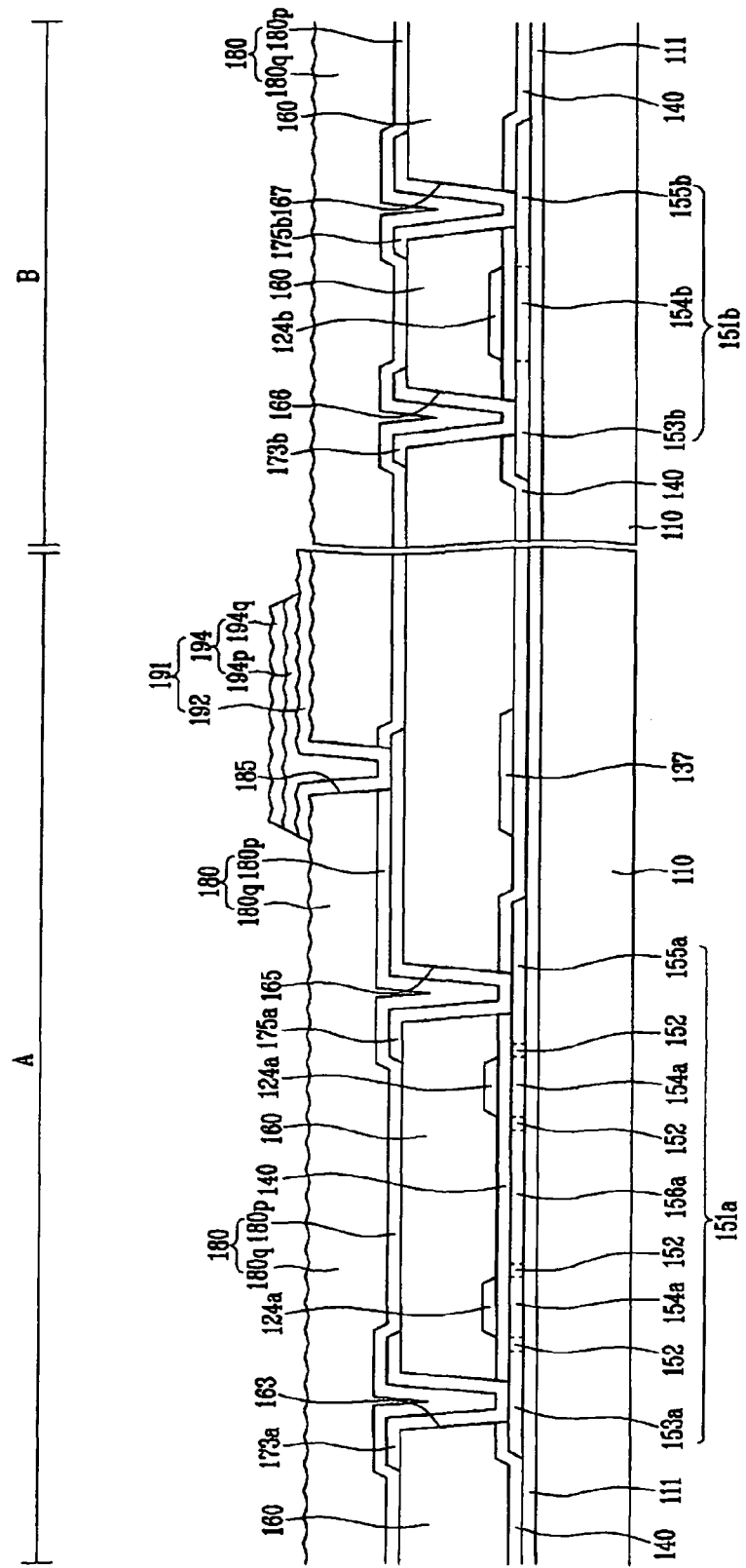
FIG. 60 is a sectional view of the TFT array panel in the step following the step shown in FIG. 59 taken along the lines LVIII-LVIII' and LVIII'-LVIII".

FIGS. 47 and 48 are layout views of the TFT array panel shown in FIGS. 43 to 46 in the first step of a manufacturing method thereof according to an embodiment of the present invention. FIG. 49 is a sectional view of the TFT array panel shown in FIGS. 47 and 48 taken along the lines XLIX-XLIX' and XLIX'-XLIX". FIGS. 50 and 51 are layout views of the TFT array panel in the step following the step shown in FIGS. 47 and 48. FIG. 52 is a sectional view of the TFT array panel shown in FIGS. 50 and 51 taken along the lines LII-LII' and LII'-LII". FIGS. 53 and 54 are layout views of the TFT array panel in the step following the step shown in FIGS. 50 and 51. FIG. 55 is a sectional view of the TFT array panel shown in FIGS. 53 and 54 taken along the lines LV-LV' and LV'-LV". FIGS. 56 and 57 are layout views of the TFT array panel in the step following the step shown in FIGS. 53 and 54. FIG. 58 is a sectional view of the TFT array panel shown in FIGS. 56 and 57 taken along the lines LVIII-LVIII' and LVIII'-LVIII". FIG. 59 is a sectional view of the TFT array panel in the step following the step shown in FIG. 58 taken along the lines LVIII-LVIII' and LVIII'-LVIII". FIG. 60 is a sectional view of the TFT array panel in the step following the step shown in FIG. 59 taken along the lines LVIII-LVIII' and LVIII'-LVIII".

Referring to FIGS. 47 to 49, a blocking film 111 is formed on an insulating substrate 110, and a plurality of semiconductor islands 151a and 151b for a plurality of pixel regions and the driver region are formed thereon.

Referring to FIGS. 50 to 52, a gate insulating layer 140 preferably comprising silicon oxide or silicon nitride is deposited. A gate conductor comprising a plurality of gate lines 121 including a plurality of gate electrodes 124a and a plurality of control electrodes 124b, and a plurality of storage electrode lines 131 including a plurality of expansions 137, are formed on the gate insulating layer 140.

Next, N-type impurities are implanted into the semiconductor islands 151a and 151b by PECVD or plasma emulsion to form extrinsic regions 153a, 153b, 155a, and 155b, a channel region 154a, and lightly doped regions 152.

Referring to FIGS. 53 to 55, an interlayer insulating layer 160 is deposited and patterned to form a plurality of contact holes 163, 165, 166, and 167 exposing the source regions 153a and 153b, and the drain regions 155a and 155b.

Next, a plurality of data conductors including a plurality of data lines 171 including a plurality of source electrodes 173a, a plurality of drain electrodes 175a, a plurality of input electrodes 173b, and a plurality of drain electrodes 175b are formed in the interlayer insulating layer 160.

Referring to FIGS. 56 to 59, a lower passivation layer 180p comprising an inorganic material is deposited and an upper passivation 180q comprising a photosensitive organic material is coated on the lower passivation layer 180p to form a passivation layer 180. Then, the upper passivation layer 180q is exposed using a photo-mask and developed to expose a portion of the lower passivation layer 180p. The exposed portion of the lower passivation layer 180p and the gate insulating layer 140 below are dry-etched to form a plurality of contact holes 185 exposing the expansions 177 of the drain electrodes 175a.

Next, a plurality of transparent electrodes 192 comprising a transparent conductive material are formed on the passivation layer 180.

An amorphous silicon layer 195 and a reflective layer 197 are deposited sequentially on the transparent electrodes 192 and the passivation layer 180. The sheet resistance of the amorphous silicon layer 195 may be greater than $10^9 \Omega$/square. The amorphous silicon layer 195 may be heavily doped with N-type impurities such as phosphorus (P). The reflective layer 197 preferably comprises a metal including Al or an Al alloy, or including Ag or an Ag alloy.

After, a thermal treatment process is executed in the range of 200 to 300° C. This process causes the metal particles of the reflective layer 197 to diffuse into the inner portion of the amorphous silicon layer 195, such that adhesion between the reflective layer 197 and the amorphous silicon layer 195 may be improved and the contact resistance therebetween may be reduced. At this time, the resistance of the amorphous silicon layer 195 may be reduced by a factor of about 10 4 through the thermal treatment process, and the distribution of the sheet resistance contacting the amorphous silicon layer 195 and the reflective layer 197 may be uniform. Accordingly, the quality of the display device may be improved.

Next, referring to FIG. 60, the reflective layer 197 is patterned to form an upper film 194q of the reflective electrode 194. The amorphous silicon layer 195 is then dry-etched using the upper film 194q as an etch mask to form a lower film 194p of the reflective electrode 194. At this time, the lower film 194p enables the reflective electrode 197 to be provided with a tapered structure.

As described above, various tapered structures of the signal line may be formed by adding the amorphous silicon layer having good adhesion characteristics between the metal layer and the insulating layer. The adhesion between the metal layer and the amorphous silicon layer may be improved by performing a thermal treatment such that the contact resistance between the metal layer and the amorphous silicon layer may be reduced. Accordingly, the characteristics and reliability of the TFT may be improved.

Also, the heavily doped regions, intrinsic regions, and lightly doped regions of the semiconductor layer may be simultaneously formed using the preliminary lower film of the gate conductors and the storage electrode lines when ion-implanting the impurity. As a result, the manufacturing method for the TFT panel may be simplified.

In some embodiments, the amorphous silicon layer is added between the reflective electrode and the transparent electrode, and a thermal treatment process is performed. As a result, the adhesion between the reflective layer and the amorphous silicon layer may be improved such that the contact resistance may be reduced therebetween.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A thin film transistor array panel for a liquid crystal display of a trans-reflective type, comprising:
   a substrate;
   a transparent electrode formed on the substrate, comprising ITO or IZO; and
   a reflective electrode formed on the transparent electrode, wherein the reflective electrode comprises a lower film comprising amorphous silicon as a primary constituent, and an upper film comprising a metal material, wherein an upper portion of the lower film contains metal impurities from the upper metal layer.

2. The panel of claim 1, wherein the metal upper film comprises aluminum, silver, chromium, an alloy of aluminum, an alloy of silver, or an alloy of chromium.

3. The panel of claim 2, wherein the metal upper film has a single-layered structure.

4. The panel of claim 2, wherein the amorphous silicon lower film comprises a conductive impurity.

5. The panel of claim 2, further comprising:
   a thin film transistor formed on the substrate; and
   a passivation layer formed under the transparent electrode.

6. The panel of claim 5, wherein the passivation layer comprises an organic material and has an uneven surface.

7. The panel of claim 6, wherein the reflective electrode has an uneven surface.

8. A method of manufacturing a thin film transistor array panel for a liquid crystal display of a trans-reflective type, comprising:
   forming a transparent electrode on a substrate, comprises ITO or IZO;
   depositing an amorphous semiconductor layer on the transparent electrode;
   depositing a metal layer on the amorphous semiconductor layer;
   etching the metal layer to form an upper reflective electrode;
   removing the amorphous semiconductor layer exposed by the etching of the metal layer to form a lower reflective electrode; and
   inducing metal impurity diffusion into the amorphous semiconductor layer by a thermal treatment.

9. The method of claim 8, wherein the upper reflective electrode comprises aluminum, silver, chromium, an alloy of aluminum, an alloy of silver, or an alloy of chromium.

10. The method of claim 8, wherein the amorphous semiconductor layer comprises amorphous silicon.

11. The method of claim 10, wherein the amorphous silicon comprises a conductive impurity.

12. The method of claim 8, wherein the metal layer has a single-layered structure.

13. The method of claim 8, further comprising:
   performing a thermal treatment process after the deposition of the metal layer.

14. The method of claim 13, wherein the thermal treatment process is performed in the range of 200 to 300° C.

15. The method of claim 8, further comprising:
   forming a thin film transistor under the transparent electrode; and
   forming a passivation layer between the transparent electrode and the thin film transistor.

16. The method of claim 15, further comprising:
   forming an uneven surface of the passivation layer to make the surface of the reflective electrode uneven,
   wherein the passivation layer comprises an organic material.

* * * * *